(12) United States Patent  
Lin et al.

(10) Patent No.: US 8,809,951 B2  
(45) Date of Patent: Aug. 19, 2014

(54) CHIP PACKAGES HAVING DUAL DMOS DEVICES WITH POWER MANAGEMENT INTEGRATED CIRCUITS

(71) Applicant: Megica Corporation, Hsin-Chu (TW)

(72) Inventors: Mou-Shiung Lin, Hsin-Chu (TW); Jin-Yuan Lee, Hsin-Chu (TW)

(73) Assignee: Megit Acquisition Corp., San Diego, CA (US)

( * ) Notice: Subject to any disclaimer, the term of this patent is extended or adjusted under 35 U.S.C. 154(b) by 0 days.

(21) Appl. No.: 14/034,440

(22) Filed: Sep. 23, 2013

(65) Prior Publication Data

US 2014/0021522 A1     Jan. 23, 2014

Related U.S. Application Data

(62) Division of application No. 12/645,361, filed on Dec. 22, 2009, now abandoned.

(60) Provisional application No. 61/140,895, filed on Dec. 26, 2008.

(51) Int. Cl.

| | | |
|---|---|---|
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 29/00* | (2006.01) | |
| *H01L 23/34* | (2006.01) | |
| *H01L 23/64* | (2006.01) | |
| *H01L 25/16* | (2006.01) | |
| *H01L 25/065* | (2006.01) | |
| *H01L 23/532* | (2006.01) | |
| *H01L 23/00* | (2006.01) | |

(52) U.S. Cl.
CPC ... *H01L 23/5329* (2013.01); *H01L 2224/16245* (2013.01); *H01L 23/645* (2013.01); *H01L 2224/45144* (2013.01); *H01L 2924/01077* (2013.01); *H01L 2924/19042* (2013.01); *H01L 2924/01079* (2013.01); *H01L 2924/30107* (2013.01); *H01L 2924/04941* (2013.01); *H01L 2924/13091* (2013.01); *H01L 2924/14* (2013.01); *H01L 2924/10253* (2013.01); *H01L 2224/16* (2013.01); *H01L 25/16* (2013.01); *H01L 2924/01078* (2013.01); *H01L 2924/01019* (2013.01); *H01L 2224/16145* (2013.01); *H01L 2924/19104* (2013.01); *H01L 2224/45147* (2013.01); *H01L 2924/01047* (2013.01); *H01L 2924/01015* (2013.01); *H01L 2924/01029* (2013.01); *H01L 2224/48465* (2013.01); *H01L 2224/32145* (2013.01); *H01L 2224/48227* (2013.01); *H01L 2924/15331* (2013.01); *H01L 2224/73265* (2013.01); *H01L 23/642* (2013.01); *H01L 2224/48145* (2013.01); *H01L 2924/15311* (2013.01); *H01L 2224/45124* (2013.01); *H01L 2224/48247* (2013.01); *H01L 2924/09701* (2013.01); *H01L 24/45* (2013.01); *H01L 2224/32225* (2013.01); *H01L 25/0652* (2013.01); *H01L 2924/15192* (2013.01); *H01L 2924/12044* (2013.01); *H01L 2924/3011* (2013.01); *H01L 2224/48091* (2013.01); *H01L 2924/01013* (2013.01); *H01L 24/48* (2013.01); *H01L 2224/16225* (2013.01); *H01L 2924/01046* (2013.01); *H01L 2924/19041* (2013.01)
USPC .......... 257/335; 257/531; 257/532; 257/724; 257/E25.029

(58) Field of Classification Search
CPC ....................................... H01L 29/49
USPC .................. 257/335, 531, 532, 724, E25.029
See application file for complete search history.

(56) References Cited

U.S. PATENT DOCUMENTS

| | | | | |
|---|---|---|---|---|
| RE33,209 | E | * | 5/1990 | Plummer ..................... 257/124 |
| 5,055,907 | A | | 10/1991 | Jacobs |
| 5,095,357 | A | | 3/1992 | Andoh et al. |
| 5,106,461 | A | | 4/1992 | Volfson et al. |

| | | | |
|---|---|---|---|
| 5,108,950 A | 4/1992 | Wakabayashi et al. | |
| 5,212,403 A | 5/1993 | Nakanishi et al. | |
| 5,227,012 A | 7/1993 | Brandli et al. | |
| 5,346,858 A | 9/1994 | Thomas et al. | |
| 5,359,222 A * | 10/1994 | Okutomo et al. | 257/659 |
| 5,370,766 A | 12/1994 | Desaigoudar et al. | |
| 5,372,967 A | 12/1994 | Sundaram et al. | |
| 5,384,274 A | 1/1995 | Kanehachi | |
| 5,406,104 A * | 4/1995 | Hirota et al. | 257/351 |
| 5,416,356 A | 5/1995 | Staudinger et al. | |
| 5,465,879 A | 11/1995 | La et al. | |
| 5,471,027 A * | 11/1995 | Call et al. | 219/85.13 |
| 5,478,773 A | 12/1995 | Dow et al. | |
| 5,501,006 A | 3/1996 | Gehman, Jr. et al. | |
| 5,576,680 A | 11/1996 | Ling | |
| 5,635,767 A | 6/1997 | Wenzel et al. | |
| 5,656,849 A | 8/1997 | Burghartz et al. | |
| 5,686,764 A | 11/1997 | Fulcher | |
| 5,789,303 A | 8/1998 | Leung et al. | |
| 5,819,402 A * | 10/1998 | Edwards et al. | 29/840 |
| 5,841,197 A * | 11/1998 | Adamic, Jr. | 257/777 |
| 5,874,770 A | 2/1999 | Saia et al. | |
| 5,883,422 A | 3/1999 | Anand et al. | |
| 5,884,990 A | 3/1999 | Burghartz et al. | |
| 5,929,508 A | 7/1999 | Delgado et al. | |
| 5,955,782 A * | 9/1999 | Kosteva et al. | 257/720 |
| 5,982,038 A * | 11/1999 | Toy et al. | 257/772 |
| 6,002,161 A | 12/1999 | Yamazaki | |
| 6,008,102 A | 12/1999 | Alford et al. | |
| 6,025,261 A | 2/2000 | Farrar et al. | |
| 6,030,877 A | 2/2000 | Lee et al. | |
| 6,031,445 A | 2/2000 | Marty et al. | |
| 6,040,226 A | 3/2000 | Wojnarowski et al. | |
| 6,051,489 A | 4/2000 | Young et al. | |
| 6,058,015 A * | 5/2000 | Sammakia et al. | 361/705 |
| 6,133,079 A | 10/2000 | Zhu et al. | |
| 6,146,958 A | 11/2000 | Zhao et al. | |
| 6,184,143 B1 | 2/2001 | Ohashi et al. | |
| 6,184,574 B1 | 2/2001 | Bissey | |
| 6,191,468 B1 | 2/2001 | Forbes et al. | |
| 6,221,727 B1 | 4/2001 | Chan et al. | |
| 6,236,101 B1 | 5/2001 | Erdeljac et al. | |
| 6,255,714 B1 * | 7/2001 | Kossives et al. | 257/528 |
| 6,267,290 B1 | 7/2001 | Murdeshwar | |
| 6,272,736 B1 | 8/2001 | Lee | |
| 6,287,931 B1 | 9/2001 | Chen | |
| 6,288,447 B1 | 9/2001 | Amishiro et al. | |
| 6,291,980 B1 | 9/2001 | Aliahmad et al. | |
| 6,303,423 B1 | 10/2001 | Lin | |
| 6,383,916 B1 | 5/2002 | Lin | |
| 6,420,773 B1 | 7/2002 | Liou | |
| 6,429,764 B1 | 8/2002 | Karam et al. | |
| 6,440,750 B1 | 8/2002 | Feygenson et al. | |
| 6,441,715 B1 | 8/2002 | Johnson | |
| 6,451,681 B1 | 9/2002 | Greer | |
| 6,455,885 B1 | 9/2002 | Lin | |
| 6,456,183 B1 | 9/2002 | Basteres et al. | |
| 6,459,135 B1 | 10/2002 | Basteres et al. | |
| 6,461,895 B1 | 10/2002 | Liang et al. | |
| 6,462,522 B2 | 10/2002 | Burstein et al. | |
| 6,478,773 B1 | 11/2002 | Gandhi et al. | |
| 6,495,442 B1 | 12/2002 | Lin et al. | |
| 6,501,169 B1 | 12/2002 | Aoki et al. | |
| 6,504,227 B1 | 1/2003 | Matsuo et al. | |
| 6,504,236 B2 | 1/2003 | Bissey | |
| 6,515,369 B1 | 2/2003 | Lin | |
| 6,518,165 B1 | 2/2003 | Yoon et al. | |
| 6,544,880 B1 | 4/2003 | Akram | |
| 6,545,354 B1 | 4/2003 | Aoki et al. | |
| 6,559,409 B1 | 5/2003 | Cadet | |
| 6,566,731 B2 | 5/2003 | Ahn et al. | |
| 6,576,506 B2 * | 6/2003 | Shibib | 438/197 |
| 6,636,139 B2 | 10/2003 | Tsai et al. | |
| 6,638,844 B1 | 10/2003 | Verma et al. | |
| 6,703,697 B2 | 3/2004 | Leahy et al. | |
| 6,716,693 B1 | 4/2004 | Chan et al. | |
| 6,734,563 B2 | 5/2004 | Lin et al. | |
| 6,746,898 B2 | 6/2004 | Lin et al. | |
| 6,756,664 B2 | 6/2004 | Yang | |
| 6,759,275 B1 | 7/2004 | Lee et al. | |
| 6,800,534 B2 | 10/2004 | Hsieh | |
| 6,870,252 B2 | 3/2005 | Novak et al. | |
| 6,900,520 B2 * | 5/2005 | Lee | 257/603 |
| 6,903,459 B2 | 6/2005 | Nakatani | |
| 6,921,980 B2 | 7/2005 | Nakanishi et al. | |
| 7,012,339 B2 | 3/2006 | Terui | |
| 7,470,955 B2 * | 12/2008 | Glenn et al. | 257/335 |
| 7,525,151 B2 * | 4/2009 | Haase | 257/335 |
| 7,687,912 B2 * | 3/2010 | Heiling et al. | 257/758 |
| 7,851,883 B2 * | 12/2010 | Inoue et al. | 257/493 |
| 7,999,364 B2 * | 8/2011 | Jiang | 257/676 |
| 2001/0019168 A1 | 9/2001 | Willer et al. | |
| 2001/0028098 A1 | 10/2001 | Liou | |
| 2002/0008301 A1 | 1/2002 | Liou et al. | |
| 2002/0017730 A1 | 2/2002 | Tahara et al. | |
| 2002/0050626 A1 | 5/2002 | Onuma et al. | |
| 2003/0102551 A1 | 6/2003 | Kikuchi | |
| 2003/0119299 A1 | 6/2003 | Jiang et al. | |
| 2003/0170943 A1 * | 9/2003 | Shibib | 438/197 |
| 2004/0159894 A1 | 8/2004 | Blisson et al. | |
| 2005/0017355 A1 | 1/2005 | Chou et al. | |
| 2005/0258496 A1 | 11/2005 | Tsuchiko | |
| 2006/0170527 A1 | 8/2006 | Braunisch | |
| 2007/0069347 A1 | 3/2007 | Lin et al. | |
| 2007/0279882 A1 | 12/2007 | Weir et al. | |
| 2008/0042280 A1 | 2/2008 | Lin et al. | |
| 2008/0054457 A1 | 3/2008 | Lin et al. | |
| 2008/0081458 A1 | 4/2008 | Lin et al. | |
| 2008/0128874 A1 * | 6/2008 | Haga | 257/665 |
| 2008/0150623 A1 * | 6/2008 | Lin et al. | 327/541 |
| 2008/0251940 A1 | 10/2008 | Lee et al. | |
| 2008/0266922 A1 | 10/2008 | Mumtaz et al. | |
| 2009/0152695 A1 | 6/2009 | Pavio | |
| 2009/0166835 A1 | 7/2009 | Yang et al. | |
| 2009/0267213 A1 | 10/2009 | Lin et al. | |
| 2010/0165585 A1 | 7/2010 | Lin et al. | |

FOREIGN PATENT DOCUMENTS

| | | |
|---|---|---|
| CN | 1416305 A | 5/2003 |
| CN | 1641887 A | 7/2005 |
| EP | 0893821 A1 | 1/1999 |
| EP | 0986106 A1 | 3/2000 |
| EP | 0999580 A2 | 5/2000 |
| EP | 1039544 A1 | 9/2000 |
| JP | 03019358 | 1/1991 |
| JP | 2000022085 A | 1/2000 |
| JP | 2002233140 A | 8/2002 |
| JP | 2004194377 A | 7/2004 |

OTHER PUBLICATIONS

Bohr M., "The New Era of Scaling in an SoC World," International Solid-State Circuits Conference, 2009, pp. 23-28.

Bohr M., "The New Era of Scaling in an SoC World," International Solid-State Circuits Conference (2009) Presentation Slides 1-66.

Burghartz, Joachim N. et al.,"Spiral Inductors and Transmission Lines in Silicon Technology using Copper-Damoscene Inter connects and Low-Loss Substrates", IEEE 1997, Theory and Techniques, vol. 45, No. 10, Oct. 1997, XP-000704848, pp. 1961-1968.

Edelstein D., et al., "Full Copper Wiring in a Sub-0.25 pm CMOS ULS Technology," Technical Digest IEEE International Electron Devices Meeting, 1997, pp. 773-776.

Edelstein D.C., "Advantages of Copper Interconnects," Proceedings of the 12th International IEEE VLSI Multilevel Interconnection Conference, 1995, pp. 301-307.

Gao X., et al., "An Improved Electrostatic Discharge Protection Structure for Reducing Triggering Voltage and Parasitic Capacitance," Solid-State Electronics, 2003, pp. 1105-1110.

Geffken R.M., "An Overview of Polyimide Use in Integrated Circuits and Packaging," Proceedings of the Third International Symposium on Ultra Large Scale Integration Science and Technology, 1991, pp. 667-677.

Groves R., et al., "High Q Inductors in a SiGe BiCMOS Process Utilizing Thick Metal Process Add-on Module," Proceedings of the Bipolar/BiCMOS Circuits and Technology Meeting, 1999, pp. 149-152.

Hu C.K., et al., "Copper-Polyimide Wiring Technology for VLSI Circuits," Materials Research Society Symposium Proceedings VLSI V, 1990, pp. 369-373.

Ingerly D., et al., "Low-K Interconnect Stack with Thick Metal 9 Redistribution Layer and Cu Die Bump for 45nm High Volume Manufacturing," International Interconnect Technology Conference, 2008, pp. 216-218.

International Search Report and Written Opinion—PCT/US2009/069303, International Search Authority—European Patent Office—Mar. 9, 2010.

Jenei S., et al., "High Q Inductor Add-on Module in Thick Cu/SiLK Single Damascene," Proceedings from the IEEE International Interconnect Technology Conference, 2001, pp. 107-109.

Kumar R., et al., "A Family of 45nm IA Processors," IEEE International Solid- State Circuits Conference, 2009, pp. 58-59, vol. 3 (2), Session 3, Microprocessor Technologies.

Kurd N., et al., "Next Generation Intel® Micro-architecture (Nehalem) Clocking Architecture," Symposium on VLSI Circuits Digest of Technical Papers, 2008, pp. 62-63.

Lee Y.H., et al., "Effect of ESD Layout on the Assembly Yield and Reliability," International Electron Devices Meeting, 2006, pp. 1-4.

Lin M.S., et al., "A New IC Interconnection Scheme and Design Architecture for High Performance ICs at Very Low Fabrication Cost—Post Passivation Interconnection," Proceedings of the IEEE Custom Integrated Circuits Conference, 2003, pp. 533-536.

Lin M.S., et al., "A New System-on-a-Chip (SOC) Technology High Q Post Passivation Inductors," Proceedings from the 53rd Electronic Components and Technology Conference (May 30, 2003), 2003, pp. 1503-1509.

Lin, M.S. "Post Passivation Technology—MEGIC Way to System Solutions", Presentation given at TSMC Technology Symposium, Japan (Oct. 1, 2003) pp. 1-32.

Luther B., et al., "Planar Copper-Polyimide Back End of the Line Interconnections for ULSI Devices," Proceedings of the 10th International IEEE VLSI Multilevel Interconnection Conference, 1993, pp. 15-21.

Maloney T., et al., "Novel Clamp Circuits for IC Power Supply Protection," IEEE Transactions on Components, Packaging, and Manufacturing Technology, Part C, 1996, pp. 150-161, vol. 19 (3).

Maloney T.J., et al., "Stacked PMOS Clamps for High Voltage Power Supply Protection," Electrical Overstress Electrostatic Discharge Symposium Proceedings, 1999, pp. 70-77.

Master R., et al., "Ceramic Mini-Ball Grid Array Package for High Speed Device," Proceedings from the 45th Electronic Components and Technology Conference, 1995, pp. 46-50.

MEGIC Corp., "Megic way to system solutions through bumping and redistribution", Brochure, MEGIC Corp, 2004, pp. 1-3.

Mistry K., et al., "A 45nm Logic Technology with High-k Metal Gate Transistors, Strained Silicon, 9 Cu Interconnect Layers, 193nm Dry Patterning, and 100% Pb-free Packaging," IEEE International Electron Devices Meeting, 2007, pp. 247-250.

Patent Abstracts of Japan vol. 2000, No. 04, Aug. 31, 2000 & JP 2000 022085 A (Toshiba Corp), Jan. 21, 2000.

Roesch W., et al., "Cycling Copper Flip Chip Interconnects," Microelectronics Reliability, 2004, pp. 1047-1054, vol. 44.

Sakran N., et al., "The Implementation of the 65nm Dual-Core 64b Merom Processor, Session 5, Microprocessors," IEEE International Solid-State Circuits Conference, 2007, pp. 106-107 and 590, vol. 5 (6).

Supplementary European Search Report—EP09835798—Search Authority—Munich—Oct. 11, 2012.

Theng C., et al., "An Automated Tool Deployment for ESD (Electro-Static- Discharge) Correct-by-Construction Strategy in 90 nm Process," IEEE International Conference on Semiconductor Electronics, 2004, pp. 61-67.

Venkatesan S., et al., "A High Performance 1.8V, 0.20 pm CMOS Technology with Copper Metallization," Technical Digest IEEE International Electron Devices Meeting, 1997, pp. 769-772.

Yeoh A., et al., "Copper Die Bumps (First Level Interconnect) and Low-K Dielectrics in 65nm High Volume Manufacturing," Electronic Components and Technology Conference, 2006, pp. 1611-1615.

Yeoh T.S., "ESD Effects on Power Supply Clamps," Proceedings of the 6th International Symposium on Physical & Failure Analysis of Integrated Circuits, 1997, pp. 121-124.

Yim, Seong-Mo, et al., "The effects of a ground shield on spiral inductors fabricated in a silicon bipolar technology," Bipolar/BICMOS Circuits and Technology Meeting, 2000, 157-160.

\* cited by examiner

*Primary Examiner* — Ida M Soward

(74) *Attorney, Agent, or Firm* — Seyfarth Shaw LLP

(57) ABSTRACT

Chip packages having power management integrated circuits are described. Power management integrated circuits can be combined with on-chip passive devices, and can provide voltage regulation, voltage conversion, dynamic voltage scaling, and battery management or charging. The on-chip passive devices can include inductors, capacitors, or resistors. Power management using a built-in voltage regulator or converter can provide for immediate adjustment of the voltage range to that which is needed. This improvement allows for easier control of electrical devices of different working voltages and decreases response time of electrical devices. Related fabrication techniques are described.

24 Claims, 73 Drawing Sheets

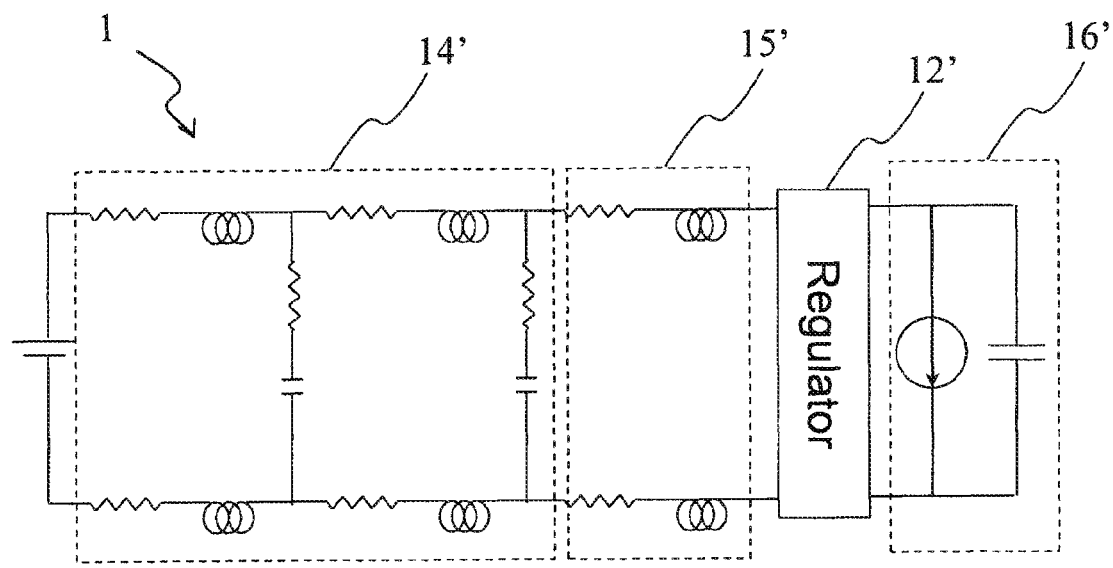
FIG. 1
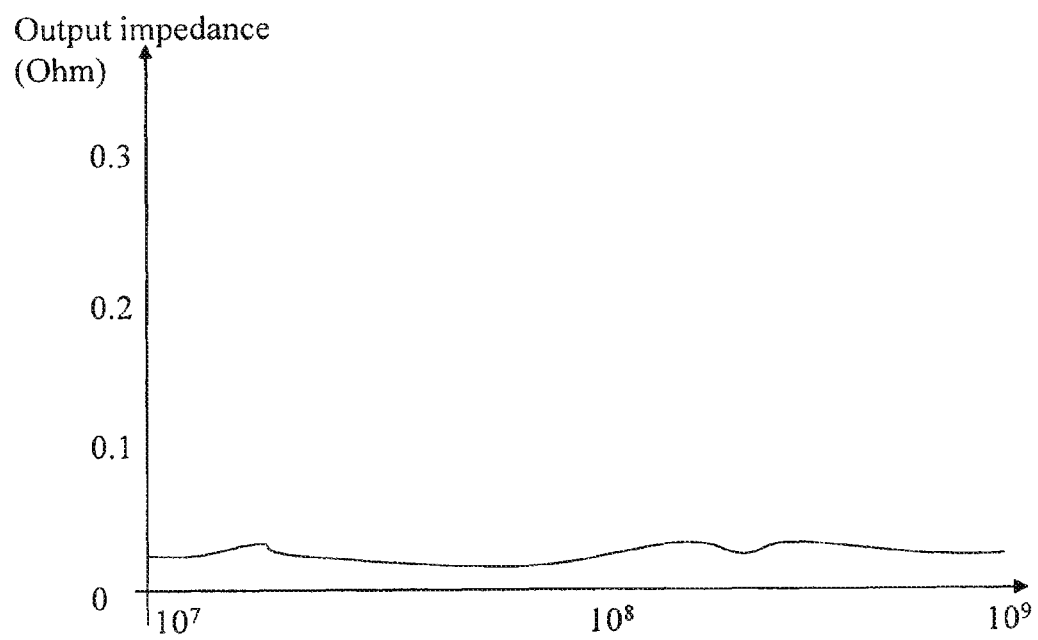
FIG. 6
FIG. 2

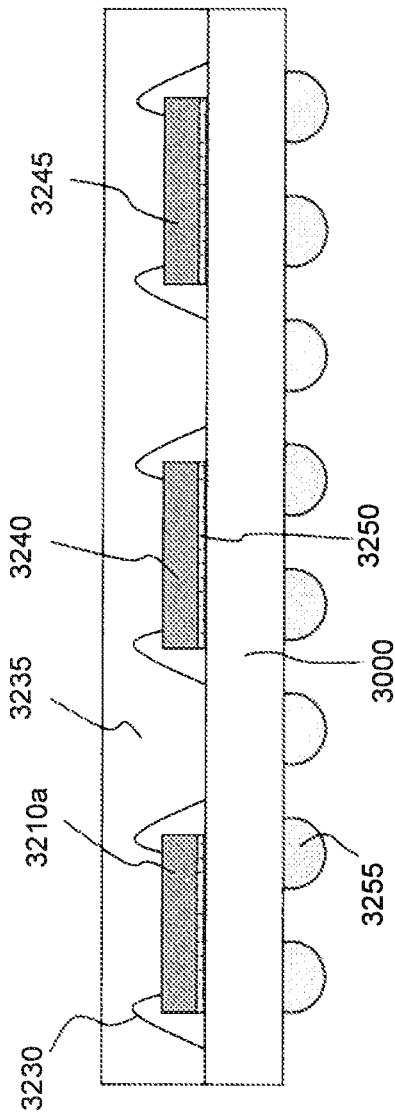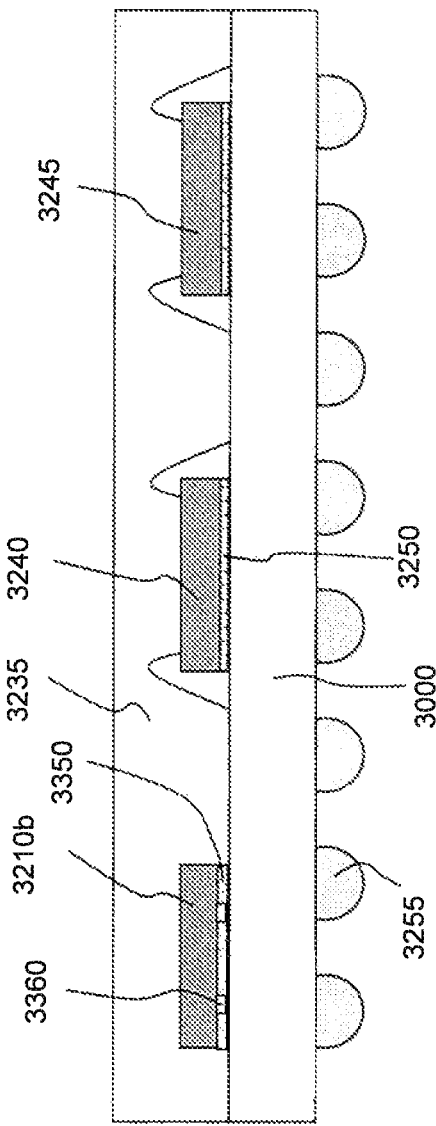

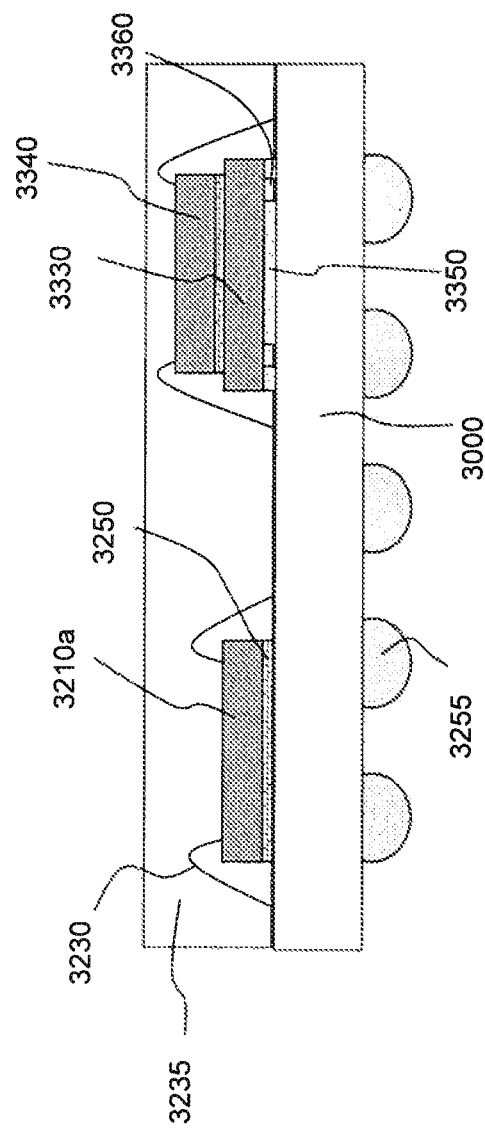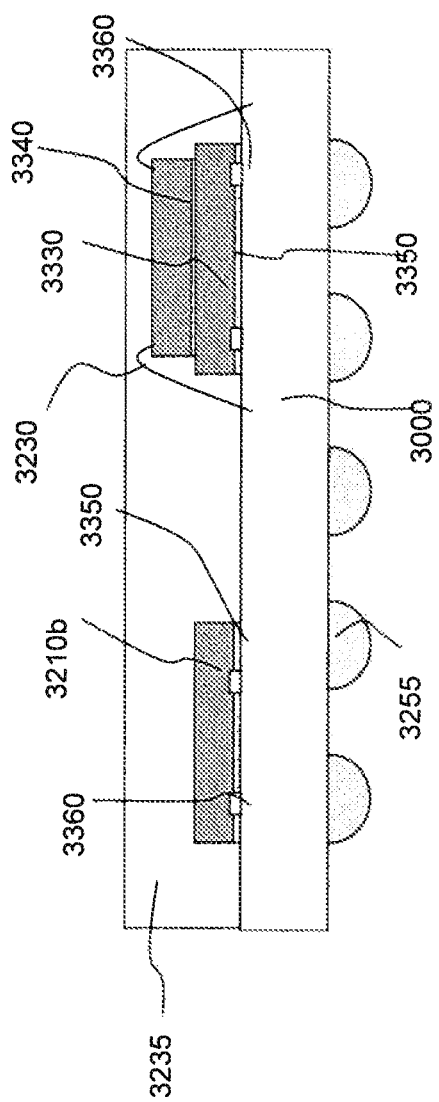
FIG. 28A
FIG. 28B

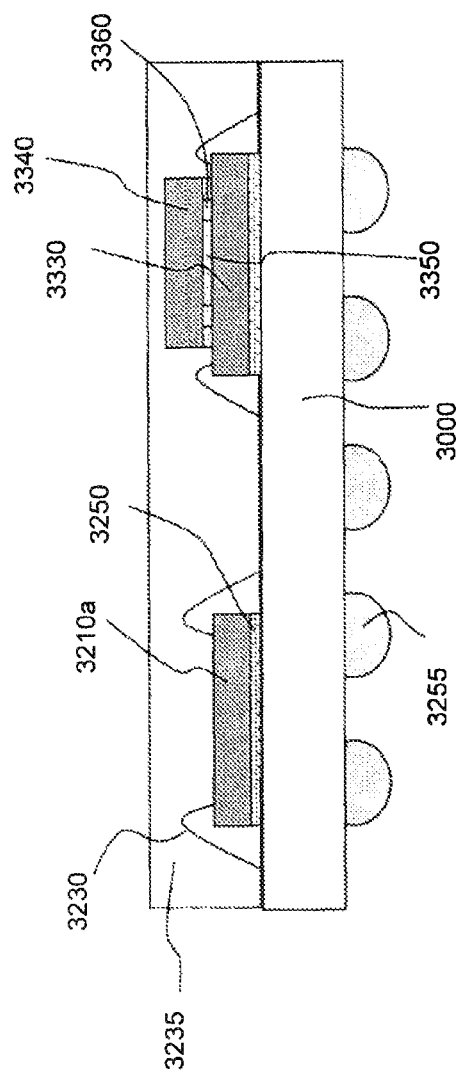
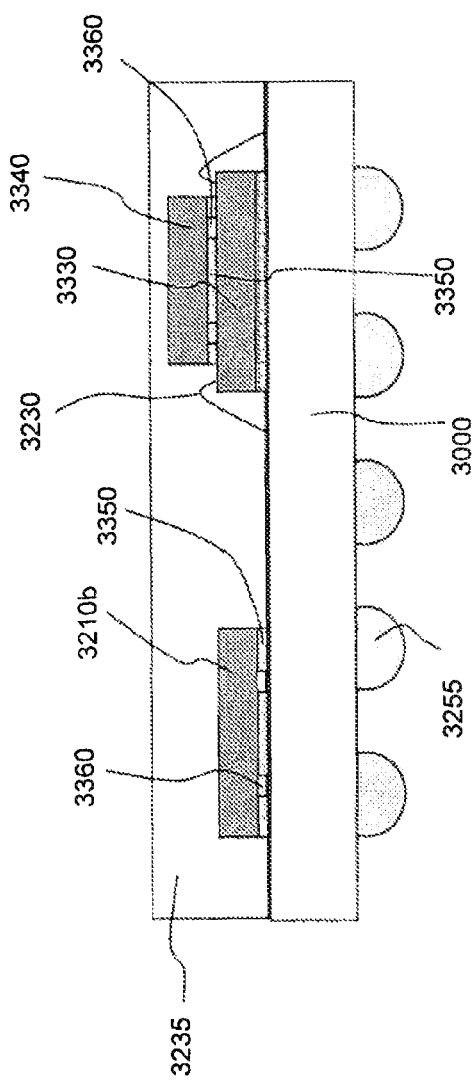
FIG. 29A
FIG. 29B

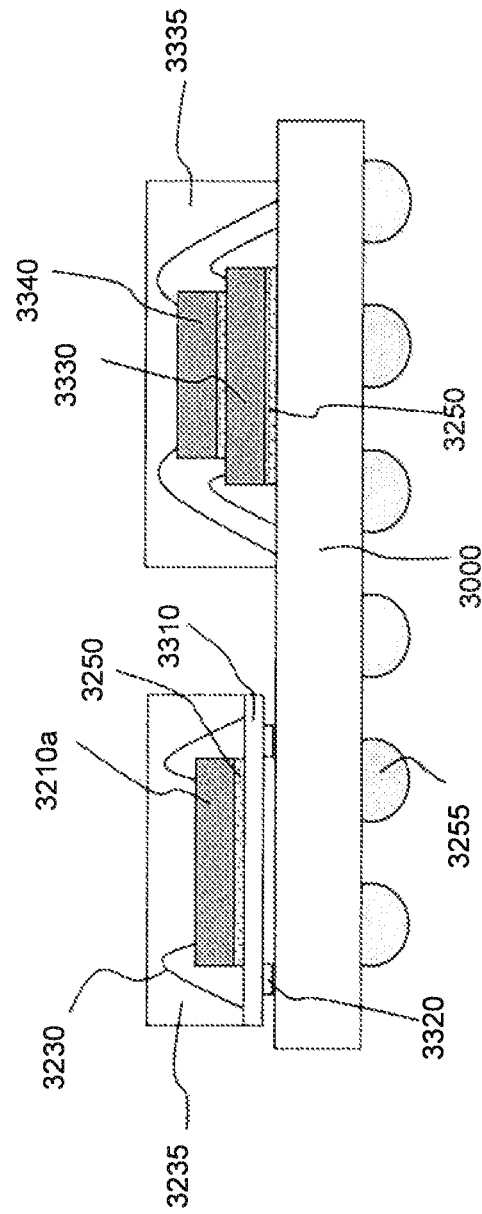
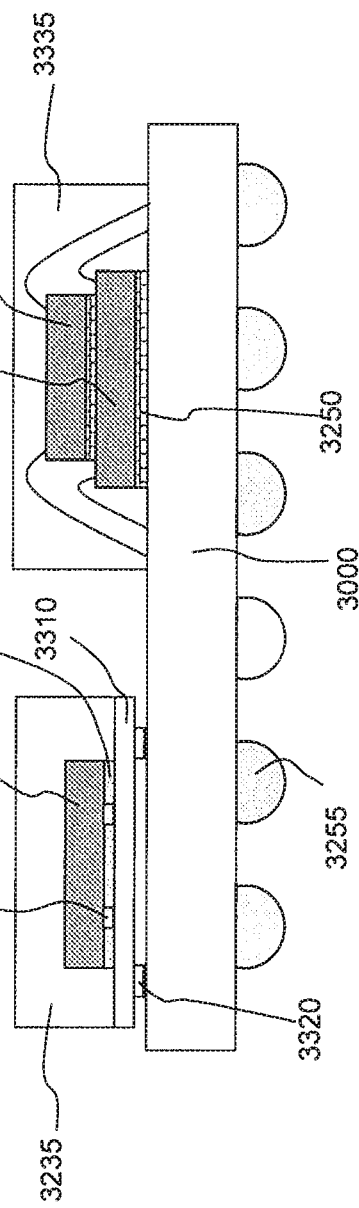
FIG. 31A
FIG. 31B

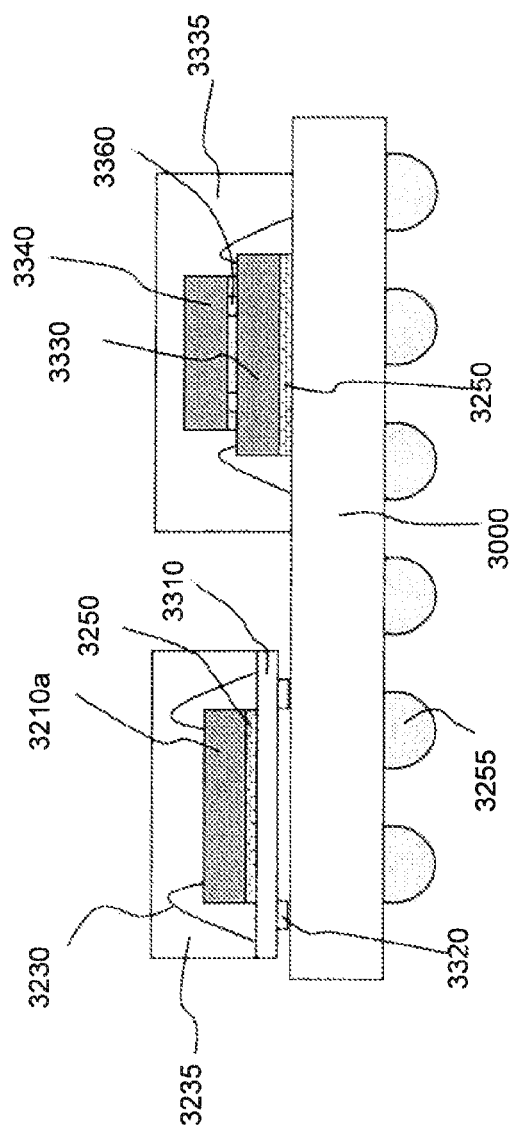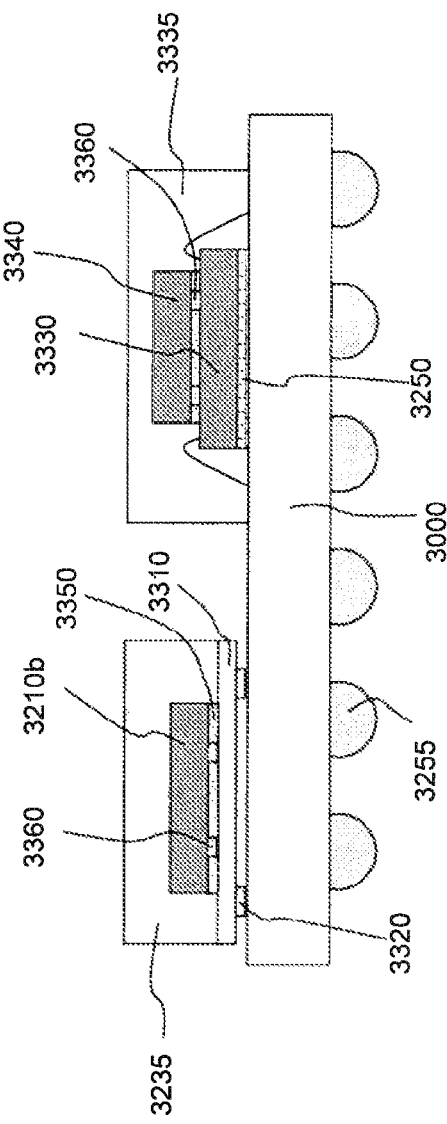

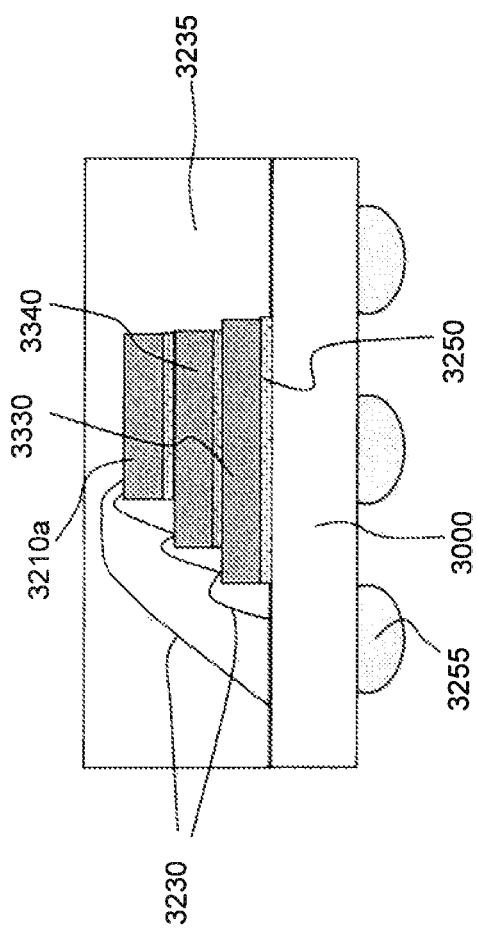
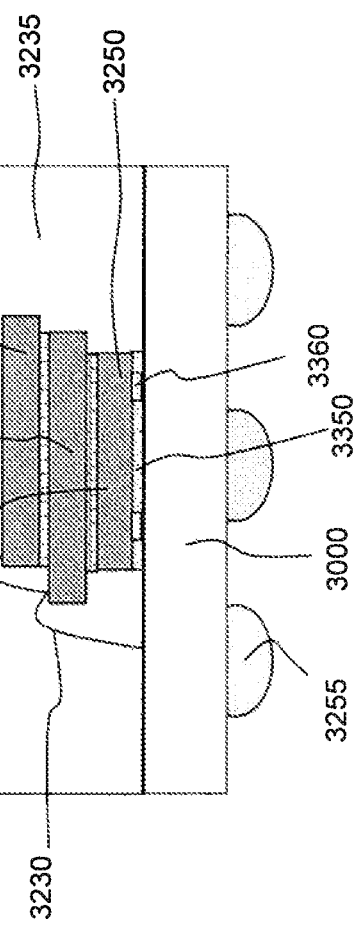
FIG. 33A
FIG. 33B

CHIP PACKAGES HAVING DUAL DMOS DEVICES WITH POWER MANAGEMENT INTEGRATED CIRCUITS

CROSS-REFERENCE TO RELATED APPLICATION

This application is a divisional of U.S. patent application Ser. No. 12/645,361, filed on Dec. 22, 2009, which claims the benefit of U.S. Provisional Application No. 61/140,895, filed on Dec. 26, 2008, the disclosures of which are expressly incorporated by reference herein in their entireties.

BACKGROUND

Conventional printed circuit boards (PCBs) typically have various components having different power inputs requiring different voltages. For a PCB with multiple electrical devices, each with potentially different voltage demands, power supplies having different output voltages are commonly used. These output voltages are typically selected to correspond to general voltage ranges that are used by the electrical devices of the PCB. Such an approach, however, consumes a rather large amount of energy, increases the difficulty of designing circuits, and also has a rather high cost. Currently, in order to accommodate many different voltage ranges, voltage regulators of rather large size are employed, and on-chip regulators are not a reality.

To decrease the amount of energy required, a common method has been to use multiple voltage regulators or converters to modify the voltage from a single power supply unit, to accommodate the needs of the electrical devices. These voltage regulators or converters allow the voltage that enters each electrical device to correspond to the device's working voltage.

The greater the number of different types of electrical devices on a PCB, the greater the number of corresponding voltage regulating devices, so that the supply voltages entering the electrical devices will fall in the correct voltage range. Such circuit designs, however, can utilize an overly high quantity of high-cost voltage regulator devices. Moreover, the electrical wiring between different voltage regulators must be separated, causing the need for more metal lines and therefore increasing total manufacturing costs. Needless to say, such circuit design may not be suitable or very economical for use in micro-scale electronic products. In addition, although the use of multiple voltage regulators in place of multiple power supply units can effectively reduce the amount of resources wasted, the large number of voltage regulators used to account for different electrical devices causes circuits on the PCB to become rather complicated. Because signals pass through a complicated arrangement of wiring, the signal response time is naturally longer and cannot be immediate, simultaneously lowering efficiency of power management. Also, the circuit design takes up a large portion of the PCB, which is an inefficient use of circuit routing.

SUMMARY OF THE DISCLOSURE

The present disclosure describes semiconductor chips and application circuits that address disadvantages described previously. An aspect of the present disclosure provides semiconductor chip structures and related application circuits, in which a switching voltage regulator, or voltage converter, is integrated within the semiconductor chip using chip fabrication methods, so that the switching voltage regulator or voltage converter and semiconductor chip are combined as one structure.

Another aspect of the present disclosure provides a semiconductor chip structure and its application circuit with the ability to adapt immediately to supply-voltage variation, efficiently decreasing the transient response time.

Another aspect of the present disclosure provides a semiconductor chip structure and its application circuit, for which the use of such semiconductor chip with the integrated voltage regulator or converter will reduce the overall difficulty of circuit designs on the PCB or Motherboard, both satisfying the demand to lower manufacturing costs and miniaturize electronic products.

Exemplary embodiments of the present disclosure can provide a semiconductor chip structure that includes a silicon substrate with multiple devices, and a set of external components. On this silicon substrate a thin circuit structure can be provided with a passivation layer. This passivation layer can have multiple passivation layer openings for electrical connection from external components or circuits to the thin circuit structure. The devices can include active devices. Examples of active devices can include, but are not limited to, diodes, p-type metal oxide semiconductor (MOS) devices (e.g., MOSFETs), N-type MOS devices, and/or complementary metal oxide semiconductor (CMOS) devices. Exemplary embodiments of the present disclosure can include voltage feedback devices and/or switch controllers made of the previously-mentioned active devices in the semiconductor chip. Embodiments can likewise include external, passive components such as resistors, capacitors, and inductors. Exemplary embodiments of the present disclosure can provide a circuit structure that includes, from top to bottom, at least a first dielectric layer, a first metal layer, a second dielectric layer, and a second metal layer. The first dielectric layer can lie above the substrate, and within the first dielectric layer there can be a contact window. The first metal layer can be above the first dielectric layer, and every point on the first metal layer can be electrically connected to corresponding devices using corresponding contact windows. The second dielectric layer can be above the first metal layer and may contain multiple vias. The second metal layer can be above the second dielectric layer, and every point on the second metal layer can be electrically connected to corresponding first metal layer through corresponding vias. A polymer layer can be on or over the passivation layer. This polymer layer can have an opening above the opening of the passivation layer, and an under bump metal structure or post passivation metal layer can be constructed on top of the passivation layer opening. Also, according to different embodiments of semiconductor chips, there can be a solder layer, or a solder wetting layer, or a wire bondable layer, a barrier layer, a metal layer and an adhesion/barrier layer comprised in the under bump metal structure. The thickness of the solder layer can vary depending on the different thicknesses of and materials used in the packaging structure of semiconductor chips. The post passivation metal layer may have the same composition as the under bump metal structure or comprises an adhesion/barrier layer and a metal layer, e.g., one that is a copper or gold. Lastly, on the post passivation metal layer there can be a second polymer layer, and this second polymer layer can contain an opening that allows the post passivation metal layer to be revealed.

Embodiments of the present disclosure can also provide various application circuits for semiconductor chips, which include an internal electrical circuit and an external electrical circuit. The internal and external circuits can be electrically connected using a metal circuit. The devices implemented in the internal circuit can be, but are not necessarily limited to, P-Type MOS devices, N-type MOS devices, CMOS devices, voltage feedback devices, and/or switch controllers. Components of an external electrical circuit can include, but are not limited to, resistors, capacitors and inductors. The internal electrical circuit can be in or disposed over a silicon substrate, while the metal circuit and external circuit are over the substrate with the metal circuit in between the internal circuit and external circuit. Semiconductor chips and chip packages according to the present disclosure can utilize various packaging techniques including, but not limited to, the following techniques: thin small outline package (TSOP), small outline J-lead (SOJ), quad flat package (QFP), thin quad flat package (TQFP), and ball grid array (BGA) as packaging methods. In addition, using wire-bonding or flip chip techniques, the semiconductor chip in the present disclosure can be electrically connected to the outside.

Aspects and embodiments of the present disclosure can accordingly provide a semiconductor chip with switching voltage regulation and the ability to adapt to varying voltages demanded by various chip designs and/or components, which decreases transient response time, circuit routing area used on the PCB, and the complexity of circuit connection. These improvements can lead to a decrease in the overall cost of manufacturing semiconductor devices.

Other features and advantages of the present disclosure will be understood upon reading and understanding the detailed description of exemplary embodiments, described herein, in conjunction with reference to the drawings.

BRIEF DESCRIPTION OF THE DRAWINGS

Other features and advantages of the present disclosure will be understood upon reading and understanding the detailed description of exemplary embodiments, described herein, in conjunction with reference to the drawings. In the drawings:

FIG. 1 depicts a circuit diagram of exemplary embodiments of the present disclosure;

FIG. 2 is a graph showing the relationship between usage frequency and output impedance;

FIGS. 27A-27B depict system-in packages or modules including a power management IC chip with on-chip passive device, in accordance with an exemplary embodiment of the present disclosure;

FIGS. 28A-28B depict system-in packages or modules including a power management IC chip with on-chip passive devices, in accordance with an exemplary embodiment of the present disclosure;

FIGS. 29A-29B depict system-in packages or modules including a power management IC chip with on-chip passive devices, in accordance with an exemplary embodiment of the present disclosure;

FIGS. 31A-31B depict system-in packages or modules including a power management IC chip with on-chip passive device, in accordance with an exemplary embodiment of the present disclosure;

FIGS. 32A-32B depict system-in packages or modules including a power management IC chip with on-chip passive device, in accordance with an exemplary embodiment of the present disclosure;

FIGS. 33A-33B depict system-in packages or modules including a power management IC chip with on-chip passive device, in accordance with an exemplary embodiment of the present disclosure;

Figure 3:
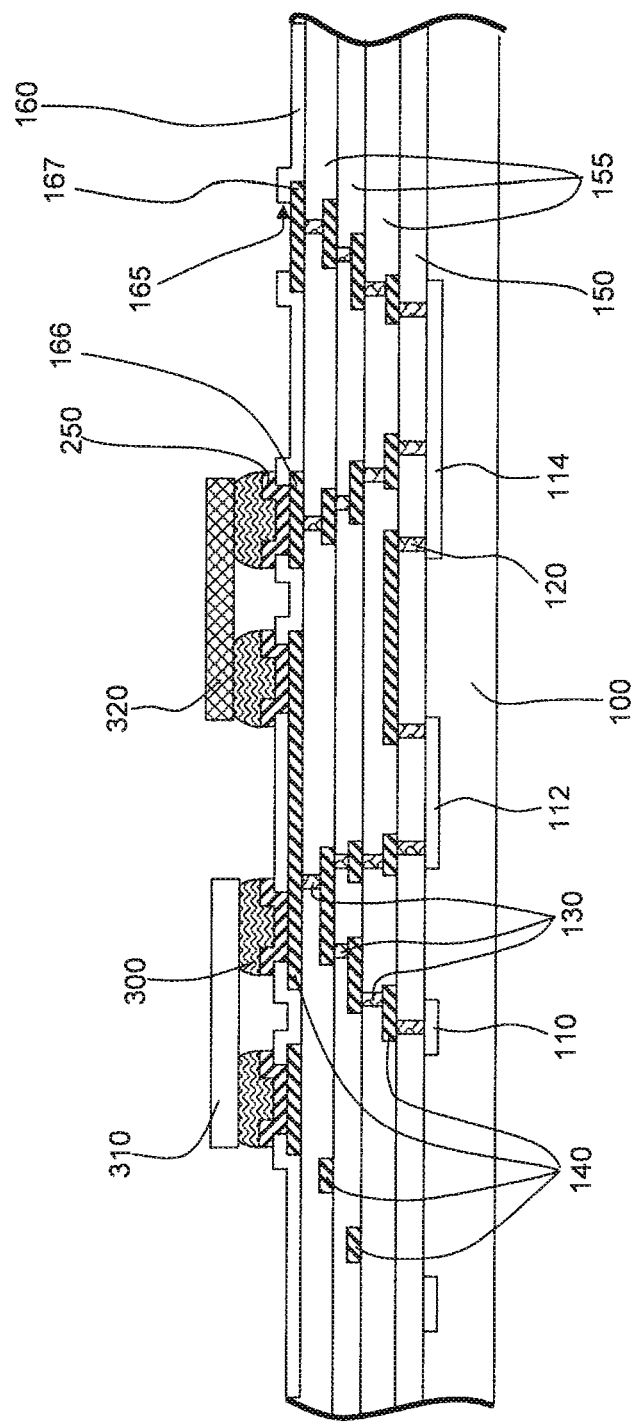
FIG. 3 depicts a diagram view of a cross section of a semiconductor chip in accordance with a first embodiment of the present disclosure.

While certain embodiments are depicted in the drawings, the embodiments depicted are illustrative and variations of those shown, as well as other embodiments described herein, may be envisioned and practiced within the scope of the present disclosure.

DETAILED DESCRIPTION

Aspects of the present disclosure are directed to semiconductor chip structures and related application circuits having multiple passive devices integrated on a semiconductor chip. By using active devices from semiconductor chips of different functions to match the passive components integrated on the semiconductor chip, immediate voltage adaptation can be achieved within a specific voltage range.

Embodiments of the present disclosure can provide a semiconductor chip structure with the equivalent circuit structure 1 shown in FIG. 1. A characteristic of the circuit structure 1 used in exemplary embodiments of the present disclosure is that the circuit structure contains the voltage regulator, or also called converter, 12' constructed after parasitic elements 14' of PC board and parasitic elements 15' of chip package. Therefore, because voltage regulator 12' does not need to bear the burden of parasitic elements 14' and 15', the voltage regulator or converter integrated with a single chip allows circuit operation under higher frequency. The voltage regulator or converter 12' can be controlled by Pulse-Frequency-Modulation or Pulse-Width-Modulation to control duty cycle. The modulation frequency of voltage regulator or converter 12' can be between 1K Hz and 300M Hz, and preferably between 1M Hz and 100M Hz, for duty cycle control. Also, this circuit structure design can lower manufacturing costs and simplify the routing design on the PCB because the distance between voltage regulator 12' and corresponding electrical devices 16' is shortened. The simplified routing design increases the speed and efficiency at which signals are delivered and solves the problem of large voltage fluctuations under high frequency usage. An example relationship between load current frequency and impedance resistance values are shown in FIG. 2.

Following, the preferred embodiments of the each structure in the semiconductor chip structure will first be proposed. Then, in reference to specific embodiments, application circuits will be proposed.

Embodiment 1

FIG. 3 depicts a substrate 100 made of a type of semiconductor base. This substrate can be silicon based, gallium arsenide (GaAs) based, silicon indium based (SiIn), silicon antimony based (SiSb), indium antimony based (InSb), or silicon germanium (SiGe) based, and many of the devices, such as devices 110, 112, and 114, are located in or over substrate 100. These devices 110, 112, and 114 can mainly be active devices, though passive devices can also be included. Active devices include voltage feedback devices, switch controller, or MOS devices, such as p-channel MOS devices, n-channel MOS devices, n-channel DMOS devices, p-channel DMOS devices, LDMOS, BiCMOS devices, Bipolar Junction Transistor (BJT), or CMOS.

As shown in FIG. 3, a thin circuit structure can be disposed or located on substrate 100. This circuit structure can include a first dielectric layer 150, multiple metal layers 140, and at least one second dielectric layer 155. The thicknesses of the first dielectric layer 150 and second dielectric layer 155 can be between 0.3 micrometers and 2.5 micrometers, for exemplary embodiments, and the materials that are used to make the first and second dielectric layers can include boron containing silicate glass, silicon-nitride, silicon-oxide, silicon-oxynitride, and carbon containing low-k dielectric materials. The thicknesses of metal layers 140 can be between 0.1 micrometers and 2 micrometers, for exemplary embodiments, and the materials used to make the metal layers can include copper, aluminum-copper alloy, tantalum, tantalum nitride, tungsten, and tungsten alloy. Devices 110, 112, 114 can be electrically connected to metal layers 140 through a metal contact 120 and metal via 130, which pass through first dielectric layer 150 and second dielectric layer 155. Metal contact 120 and via 130 can be a W-plug or Cu-plug. In addition, the metal layers 140 can be formed by various methods including damascene process, electroplating, CVD, and sputtering. For example, the damascene process, electroplating, sputtering, and CVD can be used to form copper metal layers 140, or sputtering can be used to form aluminum metal layers 140. The first dielectric layer 150 and second dielectric layer 155 can be formed by Chemical Vapor Deposition (CVD), or formed by carbon nanotube material.

Passivation layer 160 can be over the circuit structure comprising the first dielectric layer 150, metal layers 140, and second dielectric layer 155. This passivation layer 160 can protect devices 110, 112, 114 and the metal layers 140 described above from humidity and metal ion contamination. In other words, passivation layer 160 can prevent movable ions, such as sodium ions, moisture, transition metal ions, such as gold, silver, and copper, and other impurities from passing through and damaging devices 110, 112, 144, which could be MOS devices, n-channel DMOS devices, p-channel DMOS devices, LDMOS, BiCMOS devices, Bipolar transistors, or voltage feedback devices, and switch controller, or all of metal layers 140 that are below passivation layer 160. In addition, passivation layer 160 usually consists of silicon-oxide (such as $SiO_2$), phosphosilicate glass (PSG), silicon-nitride (such as $Si_3N_4$) or silicon oxynitride. Passivation layer 160 typically has a thickness between 0.3 micrometers and 2 micrometers, and when it includes a silicon-nitride layer, this silicon-nitride layer usually has a thickness exceeding 0.3 micrometers and less than 2 micrometers.

Ten exemplary methods of manufacturing or fabricating passivation layer 160 are described below. Other suitable methods of manufacturing or fabricating passivation layer 160 may of course be utilized in accordance with the present disclosure.

In a first method, the passivation layer 160 can be formed by depositing a silicon oxide layer with a thickness of between 0.2 and 1.2 μm using a CVD method and on the silicon oxide layer depositing a silicon nitride layer with thickness between 0.3 and 1.2 μm by using a CVD method.

In a second method, the passivation layer 160 can be formed by depositing a silicon oxide layer with a thickness of between 0.2 and 1.2 μm using a CVD method, next depositing a silicon oxynitride layer with a thickness of between 0.05 and 0.3 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 160 can be formed by depositing a silicon oxynitride layer with a thickness of between 0.05 and 0.3 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 160 can be formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 160 can be formed by depositing a silicon oxide layer, e.g., with a thickness of between 0.5 and 2 μm, using a High Density Plasma CVD (HDP-CVD) method. A silicon nitride layer with a desired thickness, e.g., of 0.2 and 1.2 μm, can be deposited on the silicon oxide layer using a CVD method.

In a sixth method, the passivation layer 160 can be formed by depositing an Undoped Silicate Glass (USG) layer with a desired thickness, e.g., of between 0.2 and 3 μm. Next, an insulating layer, e.g., of tetraethyl orthosilicate (TEOS), phosphosilicate glass (PSG), or borophosphosilicate glass (BPSG), with a desired thickness, e.g., of between 0.5 and 3 μm, can be deposited on the USG layer. Then, a silicon nitride layer with a desired thickness, e.g., of between 0.2 and 1.2 μm, can be deposited on the insulating layer, for example, by using a CVD method.

In a seventh method, the passivation layer 160 can be formed by optionally depositing a first silicon oxynitride layer with a thickness of between 0.05 and 0.3 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.3 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.3 μm on the silicon nitride layer using a CVD method, and then depositing a silicon oxide layer with a thickness of between 0.2 and 1.2 μm on the third silicon oxynitride layer or on the silicon nitride layer using a CVD method.

In an eighth method, the passivation layer 160 can be formed by depositing a first silicon oxide layer with a thickness of between 0.2 and 1.2 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 160 can be formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 160 can be formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

With continued reference to FIG. 3, passivation layer 160 can include more than one passivation layer opening 165, to expose part of the metal layers 140 below. The passivation layer openings 165 can be in any desired and practical shape, e.g., the shape of a circle, square, rectangle, or polygon with more than five edges; different shapes can have different opening dimensions and characteristics. For example, a circle opening has dimensions defined by its diameter, a square opening has dimensions defined by its side length, and a polygon with more than five edges has dimensions defined by the longest diagonal.

The portion of the metal layers 140 exposed by the passivation layer openings 165 in the passivation layer 160 defines pads 166, 167. On pads 166, 167, there can be an optional metal cap (not shown in figure) to protect pads 166, 167 from being damaged by oxidation. This metal cap can be an aluminum-copper alloy, a gold layer, a titanium tungsten alloy layer, a tantalum layer, a tantalum nitride layer, or a nickel layer. For example, when pads 166, 167 are copper pads, there needs to be a metal cap, such as an aluminum-copper alloy, to protect the copper pad exposed by the passivation layer openings 165 from oxidation, which could damage the copper pad. Also, when the metal cap is an aluminum-copper alloy, a barrier layer is formed between the copper pad and aluminum-copper alloy. This barrier layer includes titanium, titanium tungsten alloy, titanium nitride, tantalum, tantalum nitride, chromium, or nickel. The following method is under a condition where there is no metal cap, but those familiar with such technology should be able to deduce a similar method with the addition of a metal cap.

With continued reference to FIG. 3, an under bump metal (UBM) structure 250 is disposed over passivation layer opening 165. The thickness of under bump metal structure 250 can be selected as desired, and in exemplary embodiments is between about one micrometer and 15 micrometers. This under bump metal structure 250 can be connected to external devices 310 and 320 through a solder layer 300. The solder layer 300 may include gold-tin alloy, tin-silver alloy, tin-silver-copper alloy, or other lead-free alloy. Using tin-silver alloy as an example, the tin to silver ratio can be adjusted according to needs, with the most common tin/silver ratio being 96.0~97/3.0~4. The thickness of the solder layer 300 can be between 30 micrometers and 350 micrometers for exemplary embodiments, though other thicknesses can of course be realized. Under bump metal structure 250 can be a TiW/Cu/Ni metal layer structure, Ti/Cu/Ni metal structure, Ti/Cu metal structure, or Ti/Cu/Ni/Au metal structure.

Figure 3A:
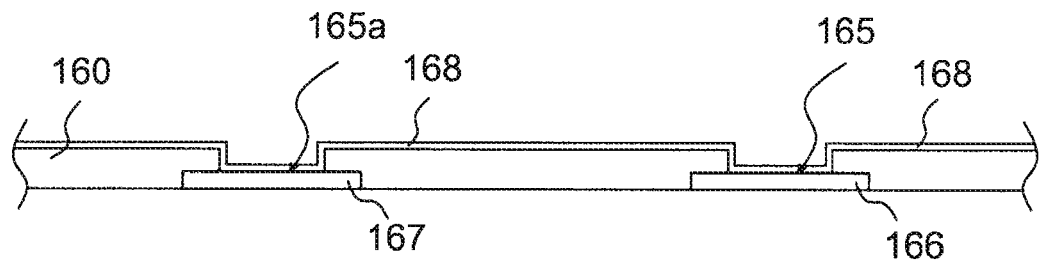
FIGS. 3A-3E depict fabrication processes for the semiconductor chip in accordance with a first embodiment of the present disclosure.
Figure 3B:
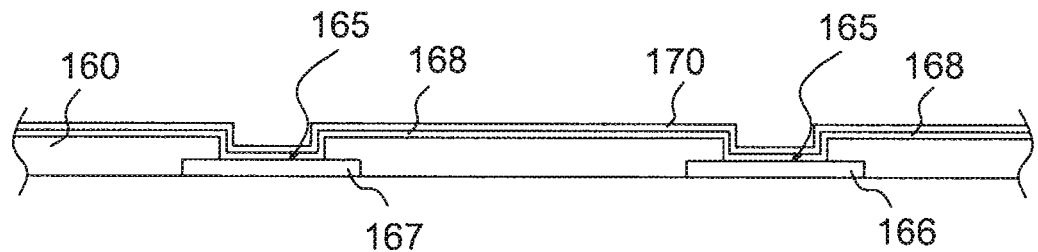
Figure 3C:
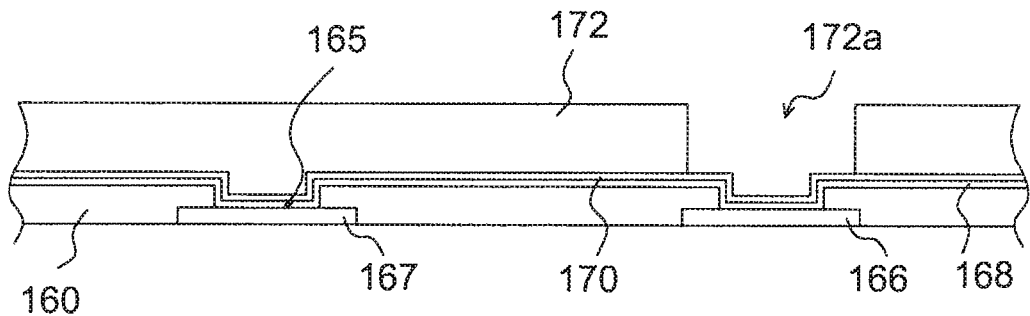
Figure 3D:
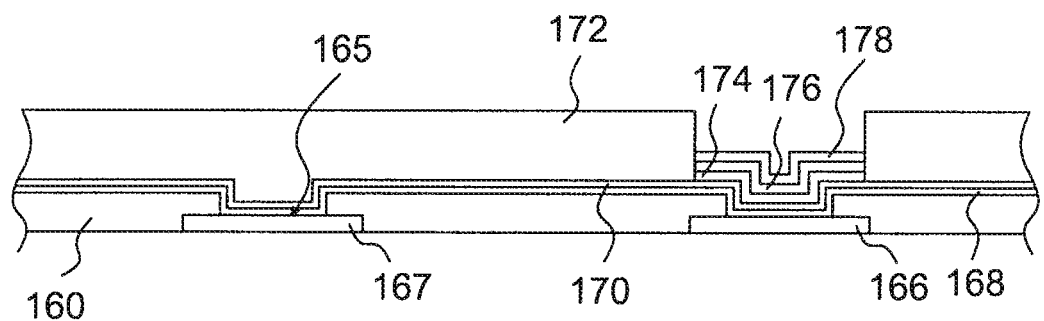
Figure 3E:
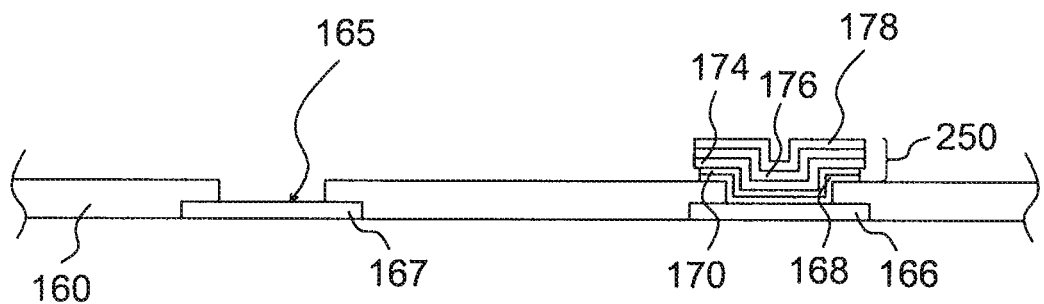

Referring to FIGS. 3A-3E, a suitable method for forming the TiW/Cu/Ni/Au under bump metal structure 250 is described. First, as depicted in FIG. 3A, a sputtering process or evaporating process can be used to form a TiW adhesion/barrier metal layer 168 with thickness between 0.05 and 0.5 micrometers on pad 166, pad 167 and passivation layer 160, then using the sputtering process to form a copper seed layer 170 (FIG. 3B) with thickness between 0.05 and 1 micrometer on TiW metal layer 168. Next, a patterned photoresist layer 172 (FIG. 3C) can be formed on seed layer 170. This patterned photoresist layer 172 can have more than one opening 172a revealing seed layer 170. Next, using the electroplating or electroless plating process, one or more metallic layers can be deposited/formed (FIG. 3D). For example, the following can be formed: (i) a copper metal layer 174 with a desired thickness, e.g., between 3 and 30 micrometers; (ii) a nickel layer 176 with desired thickness, e.g., between 0.5 and 5 micrometers; and, (iii) a gold layer 178 with a desired thickness, e.g., between 0.05 and 1.5 micrometers, preferable between 0.05 and 0.2 micrometers, can be formed respectively in opening 172a of patterned photoresist layer 172. Finally, photoresist layer 172 and the portions of seed layer 170 and TiW metal layer 168 that are not under gold layer 178 are removed (FIG. 3E), completing the TiW/Cu/Ni/Au under bump metal structure 250. Here, the Cu seed layer 170 removing process can be done by using wet etching solution containing $H_2SO_4$ or $NH_4OH$, and TiW adhesion/barrier metal layer 168 removing process can be done by using wet etching solution containing 20~40% $H_2O_2$. It may be preferred that the PH value of the etching solution for TiW removal is higher than 6 to prevent Cu corrosion during TiW removal. Of course, other suitable removal processes can be used within the scope of the present disclosure.

Other ways to form seed layer 170 are an evaporating method, an electroplating method, or an electroless plating method. A sputtering method may be preferred. Because seed layer 170 is important for the construction of electrical circuits thereon, the material used for seed layer 170 can vary according to material used for electrical circuits in following processes.

For example, if the metal layer 174 made of copper material is formed on seed layer 170 by electroplating, then copper is also the optimal material to use for seed layer 170. Similarly, if the metal layer 174 is made of gold material and formed on seed layer 170 by electroplating then gold is the optimal material to use for seed layer 170. Likewise, if the metal layer 174 is made of palladium material and formed on seed layer 170 by electroplating, then palladium is also the optimal material to use for seed layer 170. If the metal layer 174 is made of platinum material and formed on seed layer 170 by electroplating, then platinum is also the optimal material to use for seed layer 170. If the metal layer 174 made of rhodium material and formed on seed layer 170 by electroplating, then rhodium is also the optimal material to use for seed layer 170. Similarly, if the metal layer 174 is made of ruthenium material and formed on seed layer 170 by electroplating, then ruthenium is also the optimal material to use for seed layer 170. If the metal layer 174 is made of rhenium material and formed on seed layer 170 by electroplating, then rhenium is also the optimal material to use for seed layer 170. If the metal layer 174 is made of silver material and formed on seed layer 170 by electroplating, then silver is also the optimal material to use for seed layer 170.

The structure of under bump metal structure 250 can vary depending on the method used to form solder layer 300 (FIG. 3). For example, if solder layer 300 is formed on under bump metal structure 250 by an electroplating method, it may be preferred for the under bump metal structure 250 to be a TiW/Cu/Ni alloy structure or Ti/Cu/Ni alloy structure. The solder structure 300 can be electroplated on the nickel layer, the TiW, or Ti metal layer, formed by a sputtering method on pads 166, 167 and passivation layer 160, and Cu/Ni can be deposited by electroplating. In between the TiW or Ti metal layer and copper layer, there can be a copper seed layer deposited by sputtering.

In another example, if the solder layer 300 is provided by external devices 310 and 320 or solder printing, then the under bump metal structure 250 may preferably be a TiW/Cu/Ni/Au or Ti/Cu/Ni/Au structure.

Through solder layer 300, the under bump metal structure 250 on passivation layer opening 165 can be electrically connected to external devices 310 and 320 (labeled as 310 in figure). External devices 310 and 320 are also electrically connected to the metal layer 140 below passivation layer 160; therefore external devices 310 and 320 are also electrically connected to devices 110, 112, and 114.

External devices 310 and 320 can be passive devices, e.g., inductors, capacitors, resistors, or integrated passive devices. In exemplary embodiments of the present disclosure, external devices 310 and 320 include a capacitor and an inductor, respectively. For example, external device 310 may be a capacitor, while external device 320 may be an inductor, or external device 310 may be an integrated passive device, while external device 320 may be an inductor. The dimensions of external devices 310 and 320 may be chosen from industrial standard dimension 1210, dimension 0603, dimension 0402, or dimension 0201, wherein the dimension 0201 stands for 0.02 inches by 0.01 inches, and dimension 1210, dimension 0603, and dimension 0402 deduced by the same standard. In general, external devices 310 and 320 can have a length between 0.2 mm and 5 mm and a width between 0.1 mm and 4 mm, for exemplary embodiments. External devices 310 and 320 can be directly constructed on under bump metal structure 250 through the connection of solder layer 300. Also, external devices 310 and 320 can be mounted either before or after a dice sawing procedure is performed on substrate 100.

Finally, the semiconductor chip, after dice sawing procedures as disclosed in Embodiment 1, can be electrically connected to external circuits or power supplies, e.g., through copper wires or gold wires made by wire-bonding or through solder by flip chip techniques. For example, a copper wire or a gold wire can be connected to pad 167 through wire-bonding techniques, where the pad 167 is a copper pad, aluminum pad, aluminum cap or nickel cap.

Embodiment 2

Figure 4:
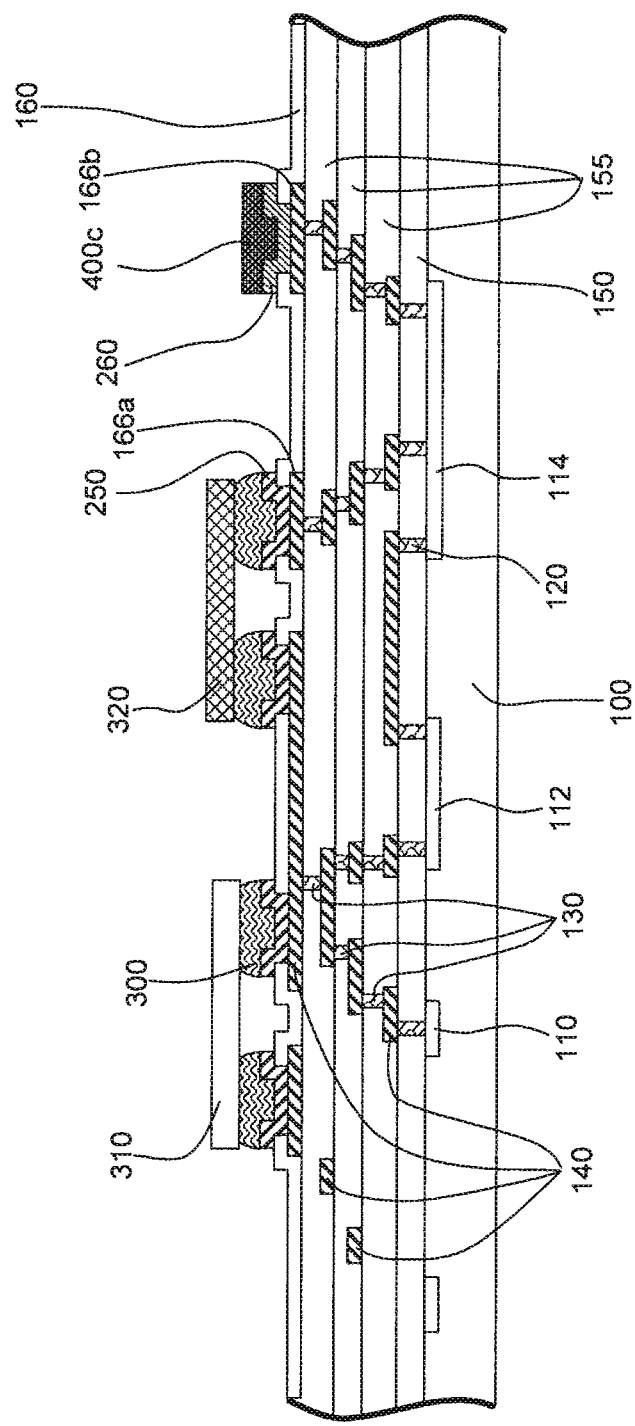
FIG. 4 depicts a diagram view of a cross section of a semiconductor chip in accordance with a second embodiment of the present disclosure.

Referring to FIG. 4, a chip structure according to a second embodiment ("Embodiment 2") of the present disclosure is similar to that of the above-described first embodiment ("Embodiment 1"), and therefore an explanation of some of the manufacturing processes and properties will not be repeated. A difference between Embodiment 2 and Embodiment 1 lies in an under bump metal structure 260 and a bonding metal layer 400c that are constructed on or over a pad 166b. The bonding metal layer 400c can be used to connect electrically to external circuits through a copper wire or gold wire formed by wire-bonding (not shown in figure).

Figure 4A:
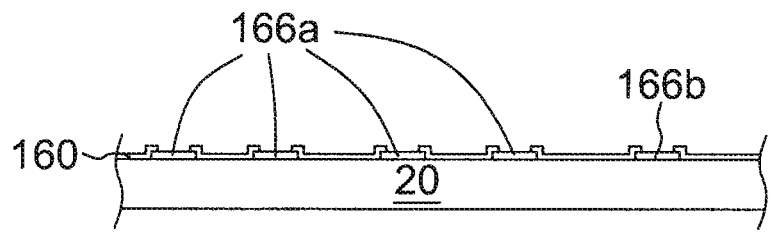
FIGS. 4A-4U and 4AA-4AM depict fabrication processes for the semiconductor chip in accordance with a second embodiment of the present disclosure.

The structure of Embodiment 2 can be manufactured by suitable methods, including the following methods:
Manufacturing Method of Embodiment 2:

Referring to FIG. 4A, integrated circuit 20 represents all structures below passivation layer 160. Also included in integrated circuit 20 are substrate 100, devices 110, 112, 114, first dielectric layer 150, metal layers 140, second dielectric layer 155, metal contact 120, and via 130 (shown in FIG. 4). In circuit 20 multiple passivation layer openings 165 reveal multiple pads 166a and 166b.

Figure 4B:
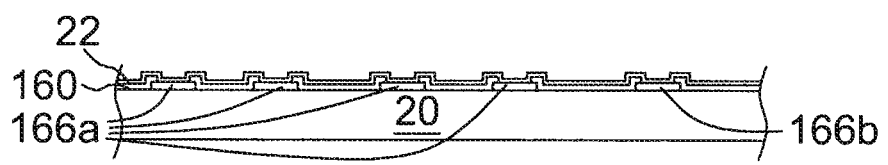

Referring to FIG. 4B, an adhesion/barrier layer 22 is formed on passivation layer 160 and pad 166a and 166b by using, e.g., sputtering. The thickness of adhesion/barrier layer 22 is selected as desired. In exemplary embodiments, the thickness can be between about 0.1 micrometers and about 1 micrometer, with an optimal thickness between 0.3 micrometers and 0.8 micrometers. The adhesion/barrier can be selected from or composed of the following materials, Ti, TiW, TiN, Ta, TaN, Cr, and Mo. Ti and TiW are two preferred materials for adhesion/barrier.

Figure 4C:
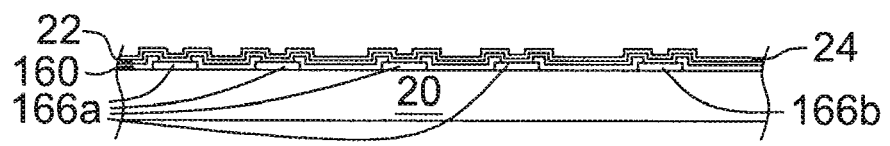

Referring to FIG. 4C, a seed layer 24 with a desired thickness, e.g., between about 0.05 micrometers and 1 micrometer (and an optimal thickness between 0.1 micrometers and 0.7 micrometers), is then formed on adhesion/barrier layer 22. Similar to seed layer 170 described above, the material used for seed layer 24 can vary according to the material of metal layers formed later. The material of seed layer can be, for example, Cu, Au or Ag. Au is a preferred seed layer material in this embodiment.

Figure 4D:
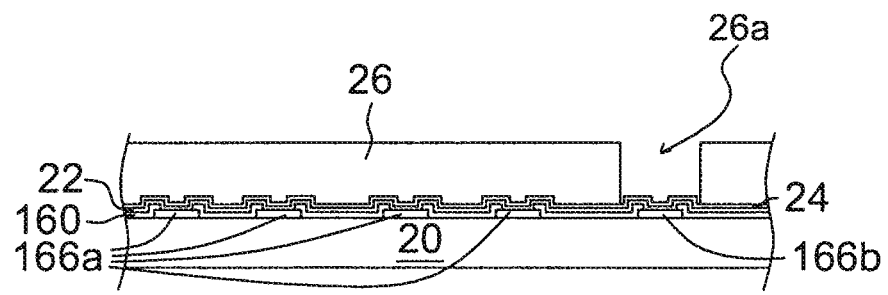

Referring to FIG. 4D, photoresist layer 26 is formed on seed layer 24, and through spin coating, exposure and development, photoresist layer 26 is patterned, forming multiple photoresist layer openings 26a in photoresist layer 26, which reveal portions of seed layer 24 that are over pad 166b.

Figure 4E:
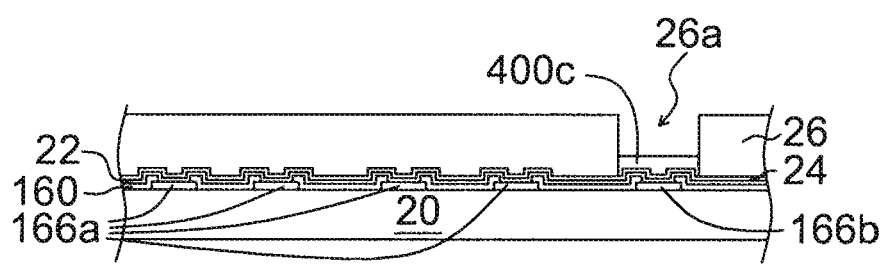

Referring to FIG. 4E, bonding metal layer 400c is formed by an electroplating, electro-less plating, sputtering or CVD method on seed layer 24, which is in photoresist layer opening 26a. The bonding metal layer 400c consists of materials such as aluminum, gold, copper, silver, palladium, rhodium, ruthenium, rhenium, or nickel, and may have a single metal layer structure or multiple metal layer structure. The thickness of bonding metal layer 400c is between 1 micrometers and 100 micrometers, with optimal thickness between 1.5 micrometers and 15 micrometers. The bonding metal layer 400c may be composed with combinations of the multiple metal layer structure which comprise Cu/Ni/Au, Cu/Au, Cu/Ni/Pd, and Cu/Ni/Pt. In this embodiment, bonding metal layer 400c is preferred to be a single layer made of gold.

Figure 4F:
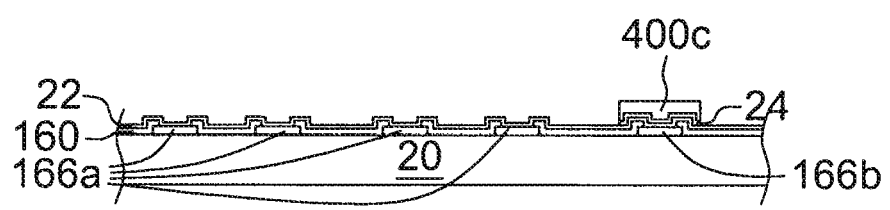

Referring to FIG. 4F, a removal process can occur for patterned photoresist 26 and portions of seed layer 24 that are not below metal layer 400c. As an example, if seed layer 24 is made of gold, seed layer 24 may be removed by using solution containing $I_2$ and KI.

Figure 4G:
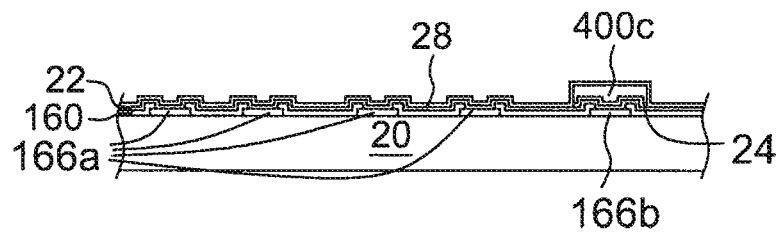

Referring to FIG. 4G, a seed layer 28 with a suitable thickness, e.g., between 0.05 micrometers and 1 micrometer (and an optimal thickness between 0.1 micrometers and 0.7 micrometers), can be formed on adhesive/barrier layer 22 and metal layer 400c. In this embodiment, the material of the seed layer 28 is preferably copper (Cu). Similar to seed layer 170 described above, the material used for seed layer 28 will vary according to the material of metal layers formed later.

Figure 4H:
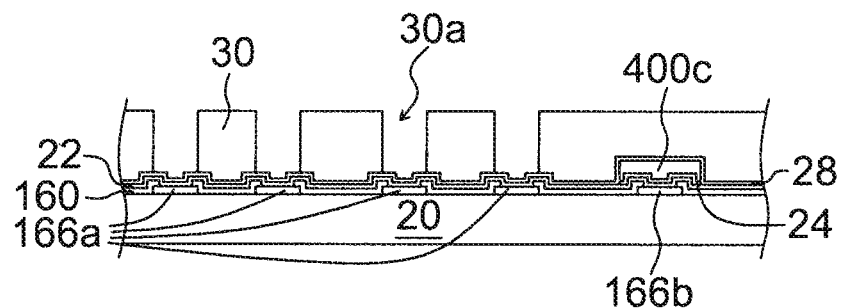

Referring to FIG. 4H, a photoresist layer 30 can be formed on seed layer 28, and through spin coating, exposure and development, photoresist layer 30 is patterned, forming multiple photoresist layer openings 30a in photoresist layer 30, which reveal portions of seed layer 28 that are over pads 166a.

Figure 4I:
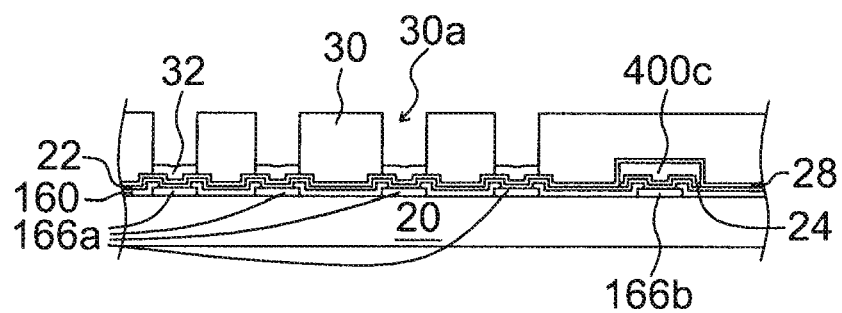

Referring to FIG. 4I, a metal layer 32 is formed by an electroplating method on seed layer 28, which is in photoresist layer openings 30a. The metal layer 32 can be made of copper, and can have a desired thickness, e.g., between about 1 micrometer and about 100 micrometers, with preferred thicknesses being between about 1.5 micrometers and about 15 micrometers.

Figure 4J:
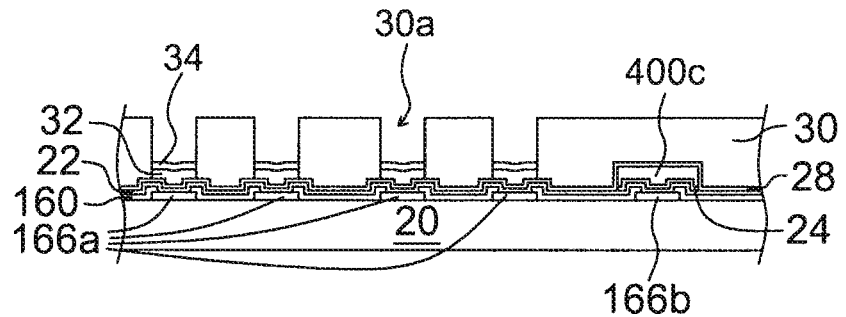

Referring to FIG. 4J, a metal layer 34 can be formed by an electroplating method on metal layer 32, which is in photoresist layer openings 30a. The metal layer 34 can be made of nickel, and can have a desired thickness, e.g., between about 0.1 micrometers and about 20 micrometers, with preferred thicknesses being between 1 micrometer and 5 micrometers.

Figure 4K:
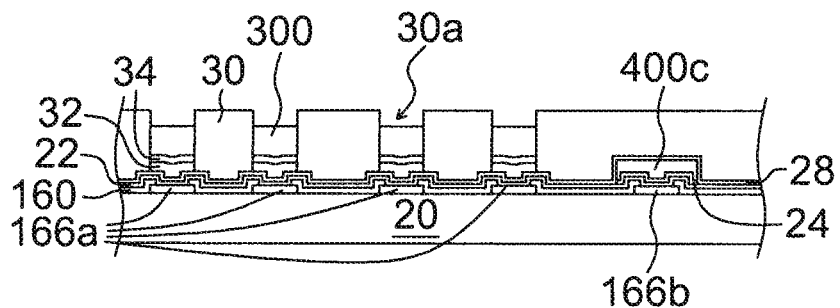

Referring to FIG. 4K, a metal layer 300 can be formed by an electroplating method on metal layer 34, which is in photoresist layer openings 30a. The metal layer 300 can consist of material such as tin, Sn/Ag alloy, Sn/In alloy, Sn/Ag/Cu alloy, and any other lead free soldering material, and has a desired thickness, e.g., between about 5 micrometers and about 300 micrometers, with preferred thicknesses being between 20 micrometers and 150 micrometers.

Figure 4L:
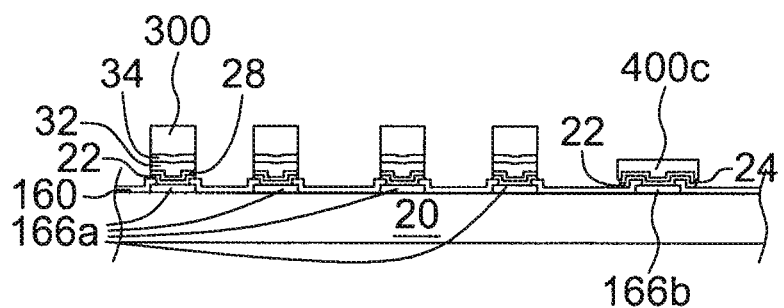

FIG. 4L depicts a removal process of patterned photoresist layer 30 and the portions of seed layer 28 and adhesive/barrier layer 22 that are not below metal layer 300. To remove seed layer 28 made of copper, $NH_3^+$ or $SO_4^{2+}$ can be used to etch the copper. And to remove adhesive/barrier layer 22, dry etching or wet etching can be used. Dry etching involves using reactive ion etching or Argon sputter etching. On the other hand, when using wet etching, if adhesive/barrier layer 22 is made of Ti/W alloy, hydrogen peroxide can be used to remove the layer, and if adhesive/barrier layer 22 is made of Ti, HF containing solution can be used to remove the layer. Meanwhile, the multiple metal layers, such as metal layer 34, metal layer 32, seed layer 28, and adhesive/barrier layer 22, below metal layer 300 are the under bump metal structure 250 shown in FIG. 4 and the seed layer 28 and adhesion/barrier layer 24 below metal layer 400c are the under bump metal structure 260 show in FIG. 4 respectively. In the manufacturing of this embodiment, under bump metal structure 250 can be a TiW/Cu/Ni structure, and under bump metal structure 260 can be a TiW/Au seed layer.

Figure 4M:
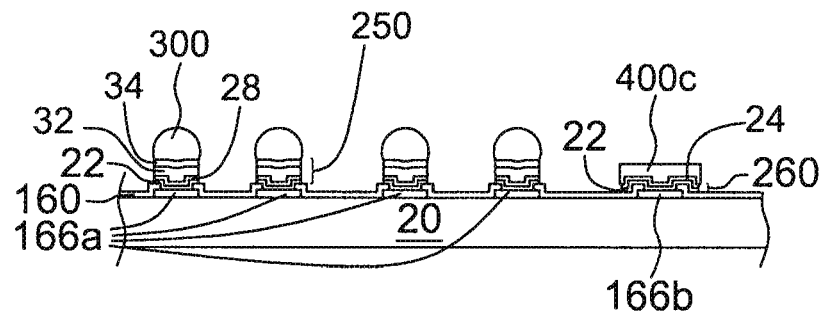

Referring to FIG. 4M, solder layer 300 collates into a hemisphere shape through the process of reflow in an environment containing oxygen less than 20 ppm.

Figure 4N:
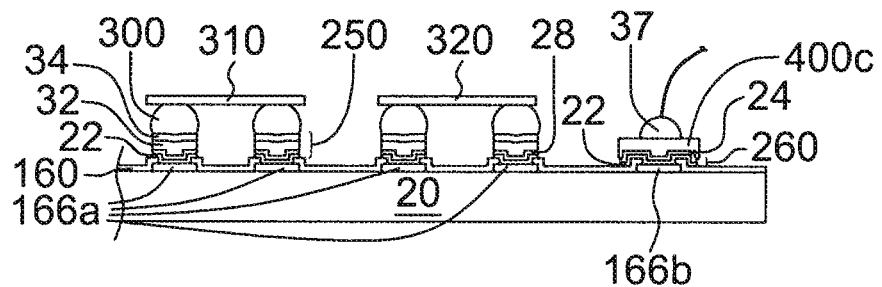

Referring to FIG. 4N, external device 310 and external device 320 are mounted separately on solder layer 300. In this embodiment, external devices 310 and 320 can be passive devices, which can include inductors, capacitors, resistors, and/or integrated passive devices. In exemplary embodiments of the present disclosure, external devices 310 and 320 are two different passive devices. For example, external device 310 may be a capacitor, while external device 320 may be an inductor, or external device 310 may be an integrated passive device, while external device 320 may be an inductor. External devices 310 and 320 each can have multiple contact points (not shown in figure). On the surface of these multiple contact points, there are metals suited for mounting on metal layer 300. For example, the surface of contact points may have a soldering material layer such as tin containing layer or a solder wetting layer such as gold layer.

The dimensions of external devices 310 and 320 may be chosen from industrial standard dimension 1210, dimension 0603, dimension 0402, or dimension 0201. For example, the dimension 0201 can stands for 0.02 inches by 0.01 inches, and dimension 1210, dimension 0603, and dimension 0402 can be deduced with the same standard. In general, external devices 310 and 320 can have a length between 0.2 mm and 5 mm, a width between 0.1 mm and 4 mm, and a height between 0.01 mm and 2 mm, for exemplary embodiments.

The following steps can include a dicing procedure, where substrate 100 is first sawed into multiple chips. Next, a wire 37 can be formed by wire-bonding on metal layer 400c, which is on pad 166b, and the wire 37 is used to connect to external circuits or power supplies. The wire 37 can be formed of copper or gold. For example, a copper or gold wire can be connected to bonding metal layer 400c through wire-bonding techniques, where the bonding metal layer 400c is a copper pad, aluminum pad, aluminum cap or nickel cap.

Also, external devices 310 and 320 can be mounted after dicing procedures are performed on substrate 100.

Manufacturing Method 2 of Embodiment 2:

Manufacturing method 2 differs from manufacturing method 1 in that solder layer 300 is provided by external devices 310 and 320 or external addition during mounting process of device 310 and 320. In other words, before mounting with external devices 310 and 320, the structure does not have a solder layer 300 on the under bump metal structure 250. The following is a detailed description of the manufacturing process.

Figure 4O:
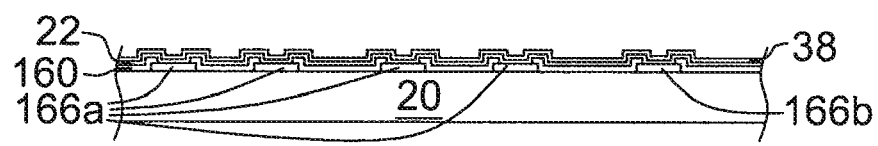

Continuing from FIG. 4B and referring to also FIG. 4O, a seed layer 38 is formed on adhesive/barrier layer 22 with a desired thickness, e.g., between about 0.05 micrometers and about 1 micrometers (and a preferred optimal thickness between 0.1 micrometers and 0.7 micrometers). In this embodiment, seed layer 38 is made of Cu. Similar to seed layer 170 described above, the material used for seed layer 38 will vary according to the material of metal layers formed later.

Figure 4P:
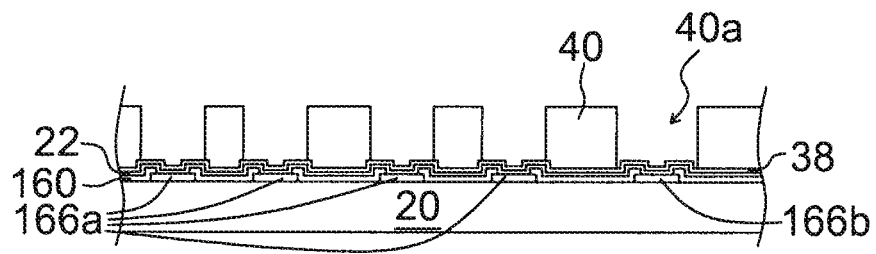

Referring to FIG. 4P, photoresist layer 40 is formed on seed layer 38, and through spin coating, exposure and development, photoresist layer 40 is patterned, forming multiple photoresist layer openings 40a in photoresist layer 40, which separately reveal portions of seed layer 24 that are over pad 166b and pad 166a.

Figure 4Q:
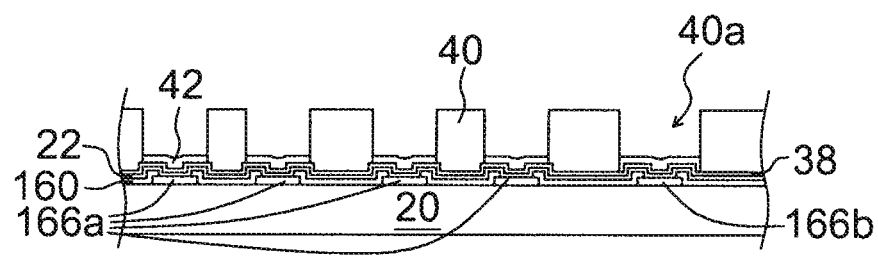

Referring to FIG. 4Q, metal layer 42 is formed by an electroplating method on seed layer 38, which is in photoresist layer openings 40a. The metal layer 42 consists of materials such as gold, copper, silver, palladium, rhodium, ruthenium, rhenium, or nickel, and may have a single metal layer structure or multiple metal layer structure. The thickness of metal layer 42 can be between about 1 micrometers and about 100 micrometers, with an optimal preferred thickness between 1.5 micrometers and 15 micrometers. In this embodiment, metal layer 42 can be made of copper.

Figure 4R:
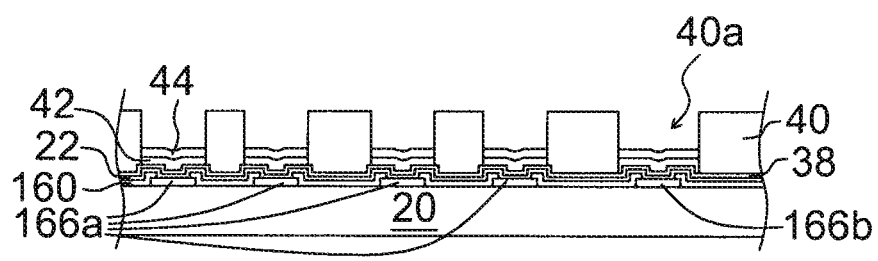

Referring to FIG. 4R, a metal layer 44 is formed by an electroplating method on metal layer 42, which is in photoresist layer openings 40a. The metal layer 44 can be made of nickel, and have a desired thickness, e.g., between about 0.5 micrometers and about 100 micrometers, with an optimal preferred thickness between 1 micrometer and 5 micrometers.

Figure 4S:
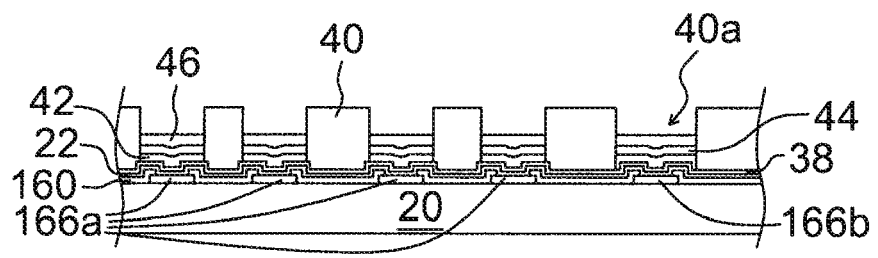

Referring to FIG. 4S, a metal layer 46 is formed by an electroplating, electroless-plating sputtering or CVD method on metal layer 44, which is in photoresist layer openings 40a. The metal layer 46 can consist of materials such as aluminum, gold, silver, palladium, rhodium, ruthenium, or rhenium, and have a desired thickness, e.g., between about 0.03 micrometers and about 2 micrometers, with an optimal preferred thickness between 0.05 micrometer and 0.5 micrometers. In this embodiment, the material of metal layer 46 can be gold (Au).

Figure 4T:
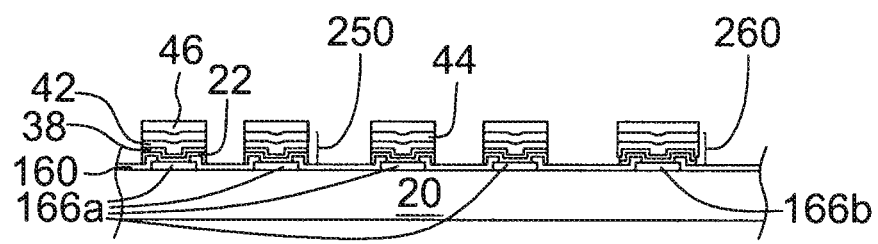

Referring to FIG. 4T, a removal process can be used to remove the patterned photoresist layer 40 and the portions of seed layer 44 and adhesive/barrier layer 22 that are not below metal layer 46. To remove seed layer 24 made of copper, a $NH_3^+$ or $SO_4^{2+}$ containing solution can be used to etch the copper. To remove adhesive/barrier layer 22, dry etching or wet etching can be used. Dry etching involves using reactive ion etching or Argon sputter etching. On the other hand, when using wet etching, if adhesive/barrier layer 22 is made of Ti/W alloy, hydrogen peroxide can be used to remove the layer, and if adhesion/barrier layer 22 is made of Ti, HF containing solution can be used to remove the layer.

Figure 4U:
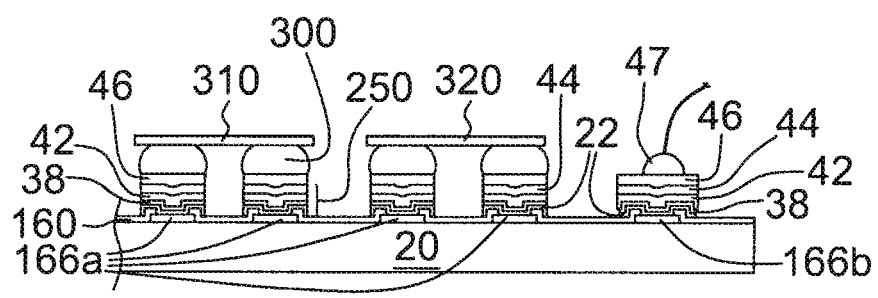
Figure 4A:
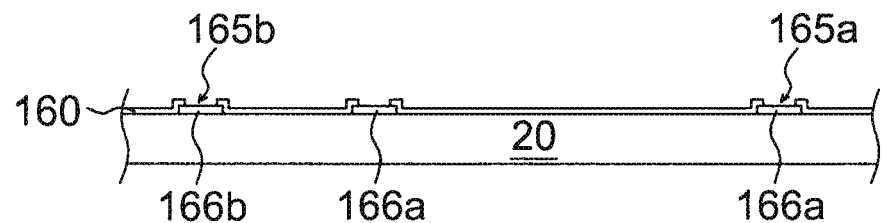
Figure 4A:
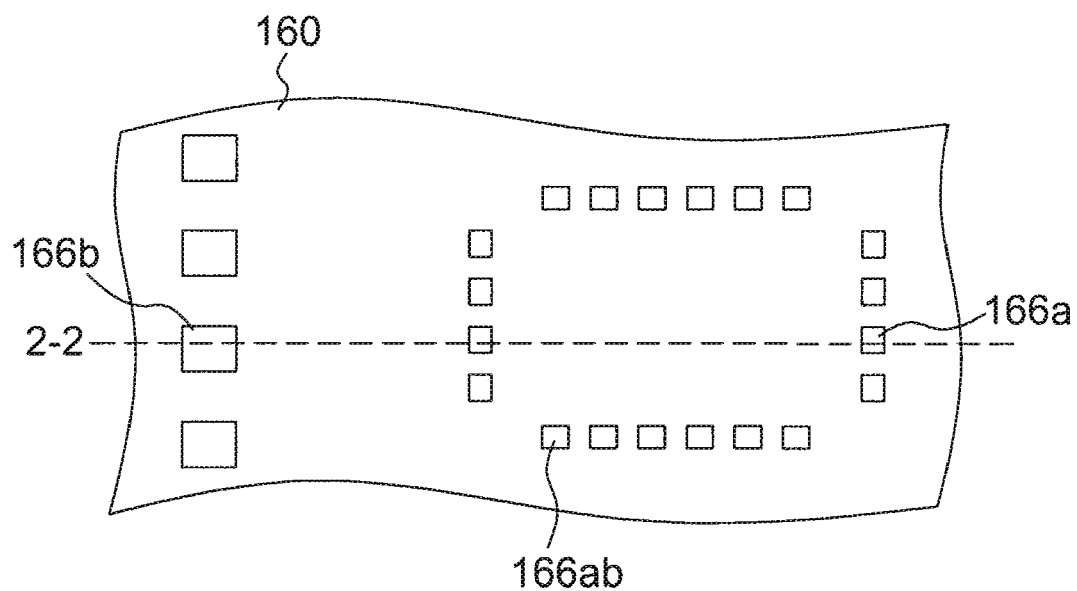
Figure 4A:
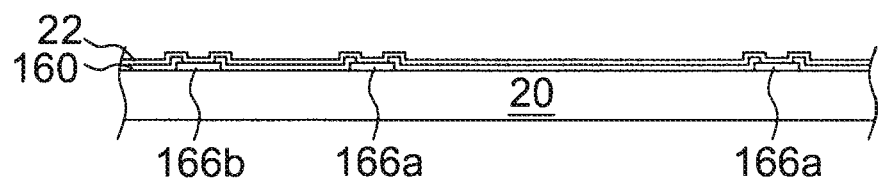
Figure 4A:
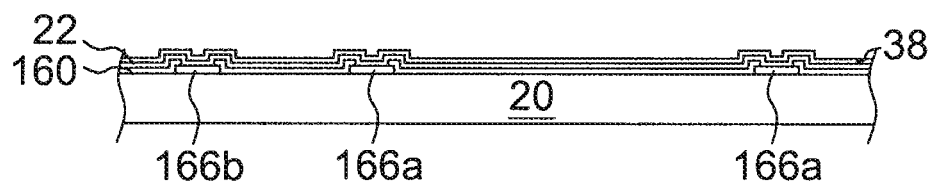
Figure 4A:
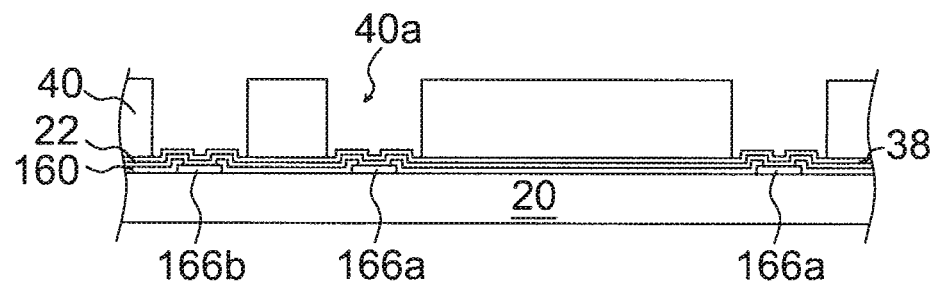
Figure 4A:
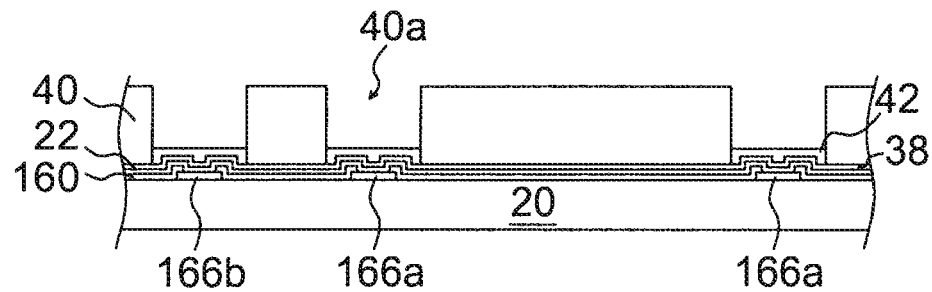
Figure 4A:
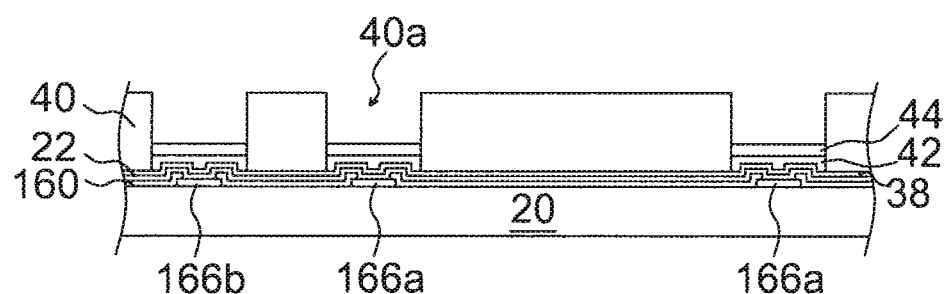
Figure 4A:
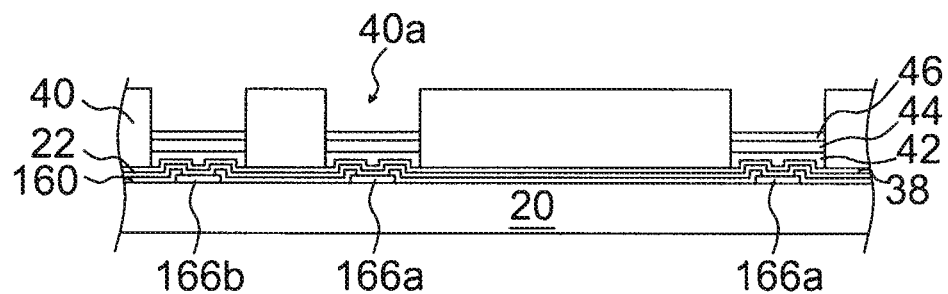
Figure 4A:
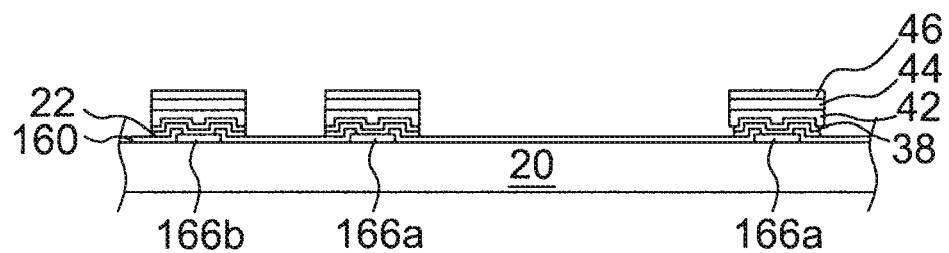
Figure 4A:
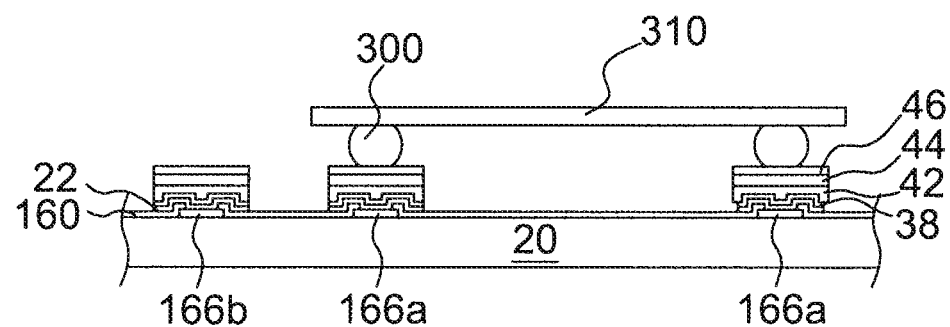
Figure 4A:
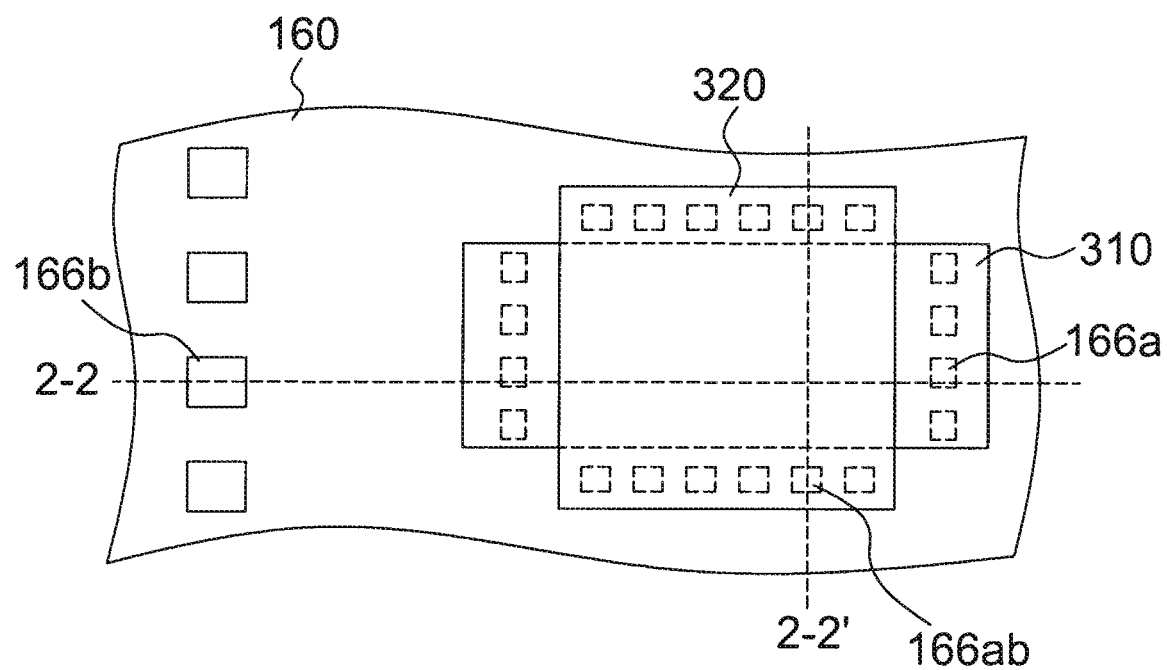
Figure 4A:
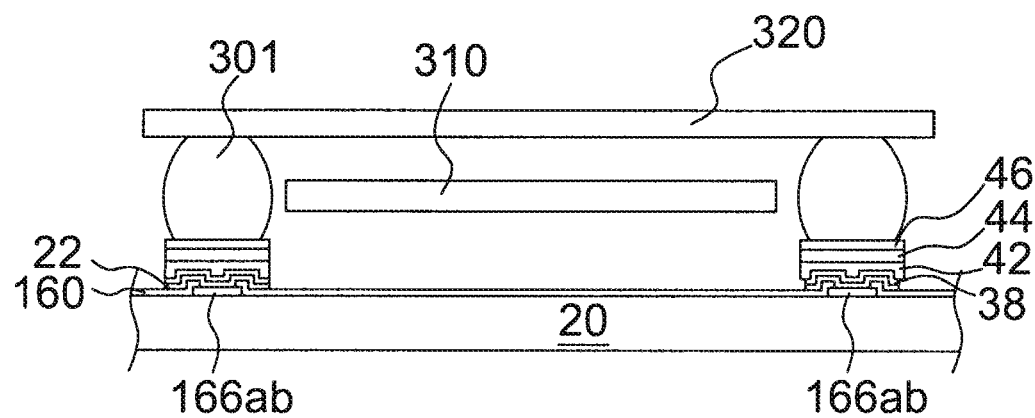
Figure 4A:
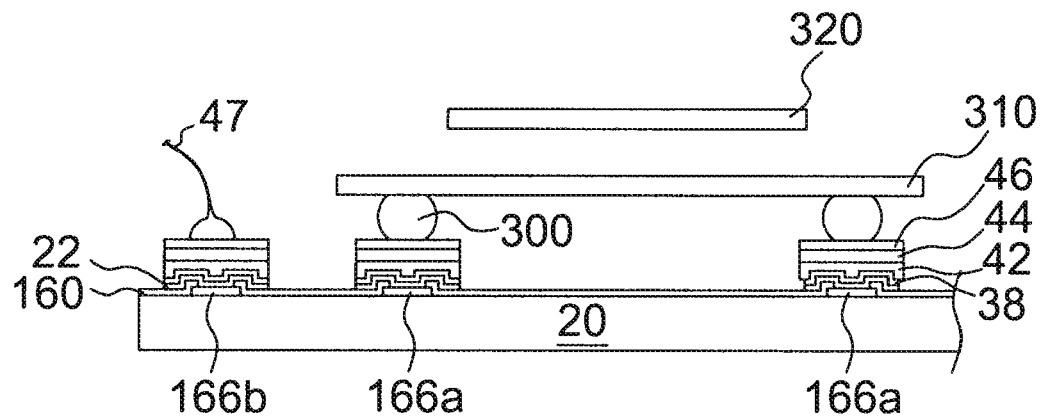

Referring to FIG. 4U, external device 310 and external device 320 can be separately connected onto metal layer 46. The external devices 310 and 320 can contain a solder layer 300. Or, a solder layer 300 can be formed on metal layer 46 by screen printing method. Through this solder layer 300, external devices 310 and 320 are mounted to metal layer 46.

In this embodiment, external devices 310 and 320 may be passive devices, e.g., inductors, capacitors, resistor, and/or integrated passive devices. In exemplary embodiments of the present disclosure, external devices 310 and 320 are two different passive devices. For example, external device 310 may be a capacitor, while external device 320 may be an inductor, or external device 310 may be an integrated passive device, while external device 320 may be an inductor. External devices 310 and 320 each have multiple contact points (not shown in figure). On the surface of these multiple contact points, there are metals suited for mounting on metal layer 300. For example, the surface of contact points may have a soldering material layer or a solder wetting layer such as gold layer.

The dimensions of external devices 310 and 320 may be chosen from industrial standard dimension 1210, dimension 0603, dimension 0402, or dimension 0201, where the dimension 0201 stands for 0.02 inches by 0.01 inches, and dimension 1210, dimension 0603, and dimension 0402 deduced with the same standard. In general, external devices 310 and 320 have a length between 0.2 mm and 5 mm, a width between 0.1 mm and 4 mm, and a height between 0.01 mm and 2 mm.

A dicing procedure can follow, in which substrate 100 is sawed into multiple chips. Then, a wire 47 can be conducted by wire-bonding on metal layer 46, which is on pad 166b, and the wire 47 can be used to connect to outside circuits or power supplies. The wire 47 can be formed of copper or gold. For example, a copper or gold wire can be connected to bonding metal layer 400c through wire-bonding techniques, where the bonding metal layer 400c is a copper pad, aluminum pad, aluminum cap or nickel cap. External devices 310 and 320 can be mounted after dicing procedures are performed on substrate 100.

Manufacturing Method 3 of Embodiment 2:

FIGS. 4AA-4AM depict a third manufacturing method of Embodiment 2. FIG. 4AA is a cross-sectional view cut along the line 2-2 in FIG. 4AB. Integrated circuit 20 represents all structures below passivation layer 160. Also included in integrated circuit 20 is substrate 100, devices 110, 112, 114, first dielectric layer 150, metal layers 140, second dielectric layer 155, metal contact 120, and via 130 (shown in FIG. 4), wherein multiple passivation layer openings 165a and openings 165b in passivation layer 160 reveal multiple pads 166a, pads 166b and 166ab. Multiple metal pads 166a and 166b are preferably designed in rectangular form.

Referring to FIG. 4AC, an adhesion/barrier layer 22 can be formed on passivation layer 160, pad 166a and 166b and 166b by using sputtering method. The thickness of adhesion/barrier layer 22 can be selected as desired, e.g., between 0.1 micrometers and 1 micrometer, with an optimal preferred thickness being between 0.3 micrometers and 0.8 micrometers. The adhesion/barrier can be selected from or composed of the following materials, Ti, TiW, TiN, Ta, TaN, Cr, and Mo. Ti and/or TiW are preferred materials for the adhesion/barrier.

Referring to FIG. 4AD, a seed layer 38 with a desired thickness, e.g., between about 0.05 micrometers and about 1 micrometers (with an optimal preferred thickness being between 0.1 micrometers and 0.7 micrometers), can then be formed on adhesion/barrier layer 22. Similar to seed layer 170 described above, the material used for seed layer 38 can vary according to the material of metal layers formed later. The material of seed layer 38 can be Cu, Au or Ag. Cu is a preferred seed layer material in this embodiment.

Referring to FIG. 4AE, photoresist layer 40 can be formed on seed layer 38, and through spin coating, exposure and development, photoresist layer 40 is patterned, forming multiple photoresist layer openings 40a in photoresist layer 40, which separately reveal portions of seed layer 38 that are over pads 166a and pad 166b.

Referring to FIG. 4AF, metal layer 42 can be formed by an electroplating method on seed layer 38, which is in photoresist layer openings 40a. The metal layer 42 can consist of materials such as gold, copper, silver, palladium, rhodium, ruthenium, or rhenium. The thickness of metal layer 42 can be a suitable thickness, e.g., between about 1 micrometers and about 100 micrometers, with optimal preferred thickness being between 1.5 micrometers and 15 micrometers. In this embodiment, metal layer 42 is preferably a single layer of copper.

Referring to FIG. 4AG, metal layer 44 can be formed by an electroplating method on metal layer 42, which is in photoresist layer openings 40a. The metal layer 44 can consist of nickel. The thickness of metal layer 44 can be selected as desired, e.g., between about 0.1 micrometers and about 10 micrometers, with optimal preferred thickness being between 0.5 micrometers and 5 micrometers.

Referring to FIG. 4AH, metal layer 46 can be formed by an electroplating, electroless plating, sputtering or CVD method on metal layer 44, which is in photoresist layer opening 40a. The metal layer 46 can consist of materials such as aluminum, gold, copper, silver, palladium, rhodium, ruthenium, or rhenium. The thickness of metal layer 46 can be selected as desired, e.g., between about 0.03 micrometers and about 5 micrometers, with an optimal preferred being thickness between 0.05 micrometers and 1.5 micrometers. In this embodiment, metal layer 46 is preferably a single layer of gold.

Referring to FIG. 4AI, a removal process can be applied to remove the patterned photoresist layer 40 and the portions of seed layer 38 and adhesive/barrier layer 22 that are not below metal layer 46. To remove seed layer 38 made of copper, $NH_3^+$ or $SO_4^{2+}$ containing solution can be used to etch the copper. To remove adhesive/barrier layer 22, dry etching or wet etching can be used. Dry etching involves using reactive ion etching or Argon sputter etching. On the other hand, when using wet etching, if adhesive/barrier layer 22 is made of Ti/W alloy, hydrogen peroxide can be used to remove the layer, and if adhesion/barrier layer 22 is made of Ti, HF containing solution can be used to remove the layer.

Referring to FIG. 4AJ, external devices 310 can be connected on/to the metal layer 46, which is over the pads 166a. The external devices 310 can have a solder layer 300. Alternatively, a solder layer 300 can be formed on metal layer 46 by screen printing. Through this solder layer 300, external devices 310 can be mounted on metal layer 46.

Referring to FIGS. 4AK-4AM, FIG. 4AL is a cross-sectional view cut along the line 2-2' in FIG. 4AK, and FIG. 4AM is a cross-sectional view cut along the line 2-2 in FIG. 4AK. External devices 320 can be connected on the metal layer 46, which is over the pads 166ab. The external devices 320 are also over the external device 310. The external devices 320 can have a solder layer 301. Alternatively, a solder layer 301 can be formed on metal layer 46 by screen printing. Through this solder layer 301, external devices 320 can be mounted on metal layer 46.

Referring to FIG. 4AM, a dicing process can be performed to singulate each chip, where substrate 100 is sawed into multiple chips. Next, a wire 47 can be formed by wire-bonding on metal layer 46, which is on pad 166b, and the wire 47 can be used to connect to outside circuits or power supplies. The wire 47 can be formed of copper or gold. For example, a copper or gold wire can be connected to bonding metal layer 400c (FIG. 4) through wire-bonding techniques, where the bonding metal layer 400c is a copper pad, aluminum pad, aluminum cap or nickel cap. External devices 310 and 320 can be mounted after dicing procedures are performed on substrate 100.

Embodiment 3

Figure 5:
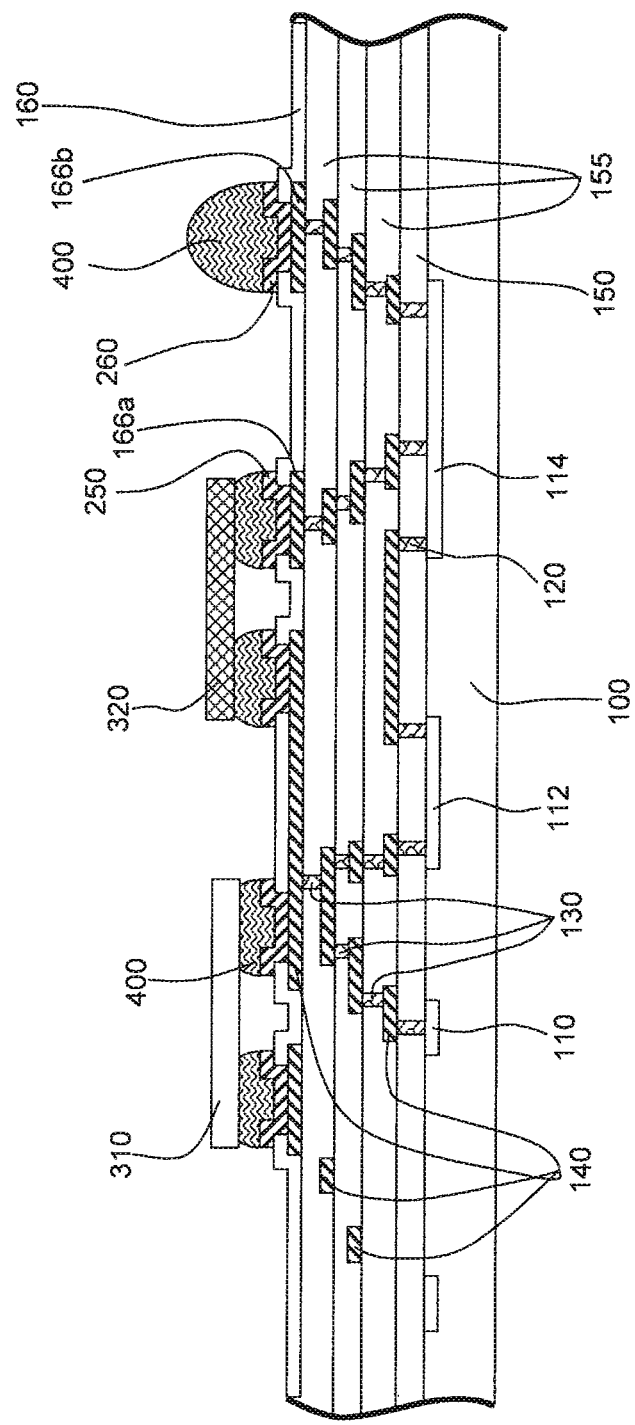
FIG. 5 depicts a diagram view of a cross section of a semiconductor chip in accordance with a third embodiment of the present disclosure.

Referring to FIG. 5, a third embodiment ("Embodiment 3") is shown which is similar to Embodiment 2, with a difference being the material and thickness of connecting metal layer 400. In Embodiment 3, solder layer 400 is constructed on pad 166a and 166b. The following is a description of the formation of the structure of Embodiment 3.

Figure 5A:
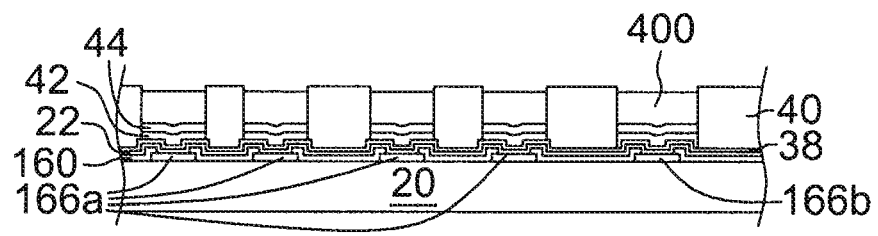
FIGS. 5A-5D depict fabrication processes for a semiconductor chip in accordance with a third embodiment of the present disclosure.

Manufacturing Method of Embodiment 3:

Embodiment 3 can continue from FIG. 4R of manufacturing method 2 of Embodiment 2. Referring to FIG. 5A, a solder layer 400 is formed on metal layer 44 in photoresist layer openings 40a by an electroplating method. The thickness of solder layer 400 can be selected as desired, e.g., between about 30 micrometers and about 350 micrometers. Preferred materials for solder layer 400 include fin/silver, tin/copper/silver, and tin/lead alloy.

Figure 5B:
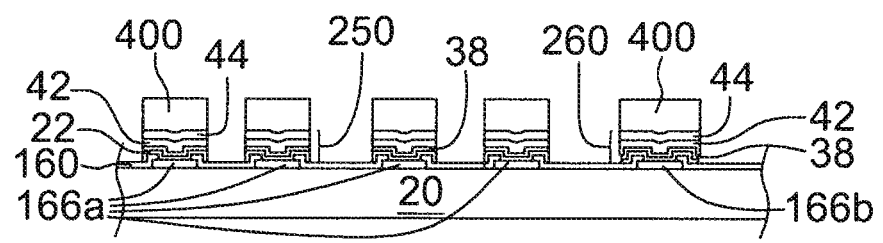

Referring to FIG. 5B, a removal process can be applied to remove the patterned photoresist layer 40 and the portions of seed layer 38 and adhesive/barrier layer 22 that are not below solder layer 400. To remove seed layer 38 made of copper, $NH_3^+$ or $SO_4^{2+}$ containing solution can be used to etch the copper.

Figure 5C:
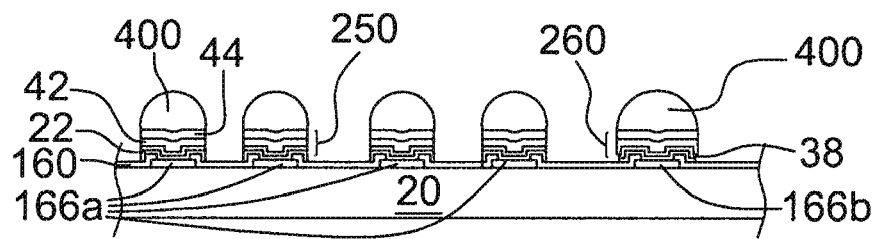

Referring to FIG. 5C, a reflow process, similar to the one previously described for FIG. 4M, can be used so that solder layer 400 will reach melting point and aggregate into a hemispherical shape, as shown.

Figure 5D:
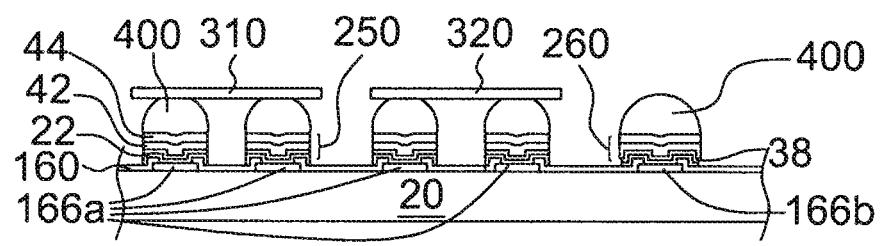

Referring to FIG. 5D, external device 310 and external device 320 are separately mounted to solder layer 400 over pads 166a. In this embodiment, external devices 310 and 320 are passive devices, which include inductors, capacitors, and integrated passive devices. In the present disclosure, external devices 310 and 320 are two different passive devices. For example, external device 310 may be a capacitor, while external device 320 may be an inductor, or external device 310 may be an integrated passive device, while external device 320 may be an inductor.

The dimensions of external devices 310 and 320 may be chosen from industrial standard dimension 1210, dimension 0603, dimension 0402, or dimension 0201, where the dimension 0201 stands for 0.02 inches by 0.01 inches, and dimension 1210, dimension 0603, and dimension 0402 deduced by the same standard. In general, external devices 310 and 320 have a length between 0.2 mm and 5 mm, a width between 0.1 mm and 4 mm, and a height between 0.01 mm and 2 mm.

Embodiment 4

Figure 6:
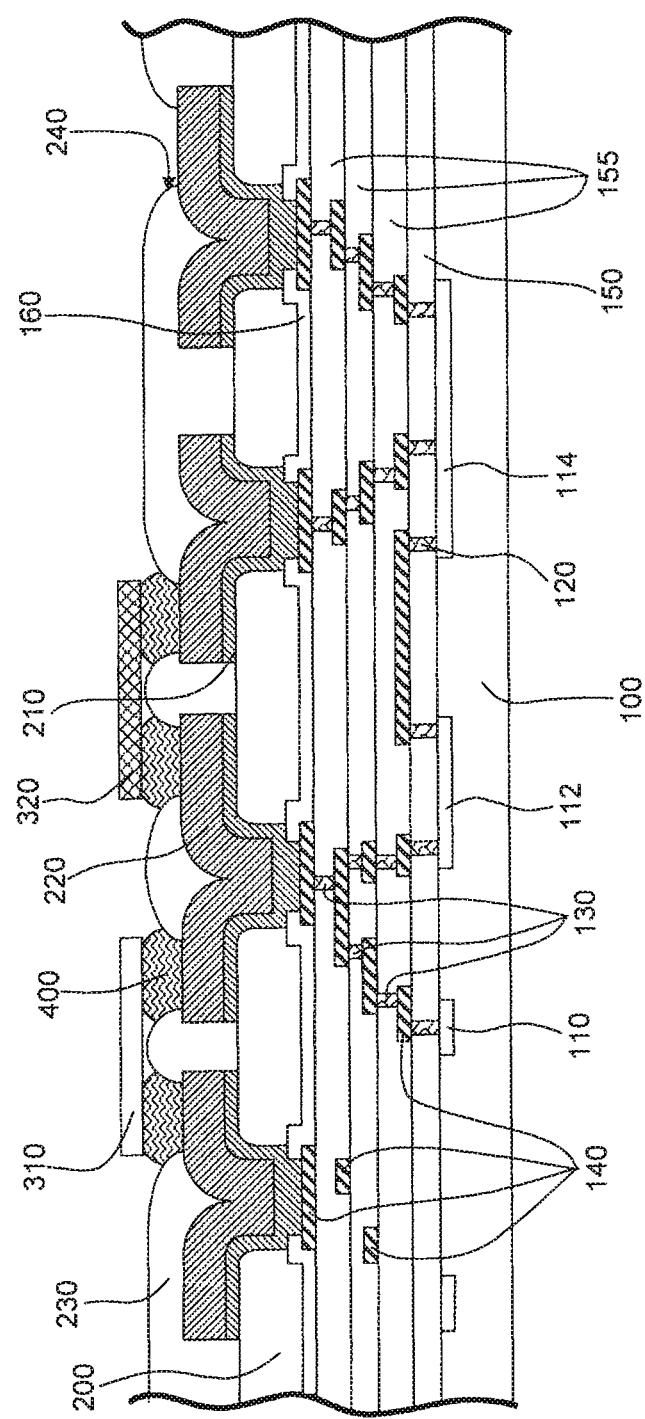
FIG. 6 depicts a diagram view of a cross section of a semiconductor chip in accordance with a fourth embodiment of the present disclosure.

Referring to FIG. 6, in the semiconductor chip structure revealed by this embodiment, a first polymer layer 200 on passivation layer 160 can be optionally formed. The first polymer layer 200 can have a desired thickness, e.g., a thickness between about 3 micrometers and about 25 micrometers. The polymer layer can be made of one or more suitable materials, such as polyimide (PI), benzocyclobutene (BCB), parylene, epoxy resins, elastomers, and/or porous dielectric material. The following is a description of the formation of the structure of Embodiment 4.

Figure 6A:
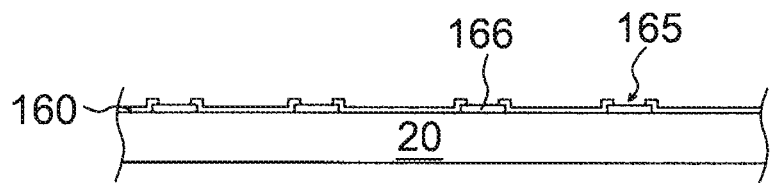
FIGS. 6A-6I depict fabrication processes for a semiconductor chip in accordance with a fourth embodiment of the present disclosure.

Manufacturing Method of Embodiment 4:

Referring to FIG. 6A, integrated circuit 20 is used to represent various structures below passivation layer 160. Integrated circuit 20 includes substrate 100, devices 110, 112, 114, first dielectric layer 150, metal layers 140, second dielectric layer 155, metal contact 120, and metal via 130 (shown in FIG. 6), where passivation layer 160 has multiple openings 165 that reveal multiple pads 166.

Figure 6B:
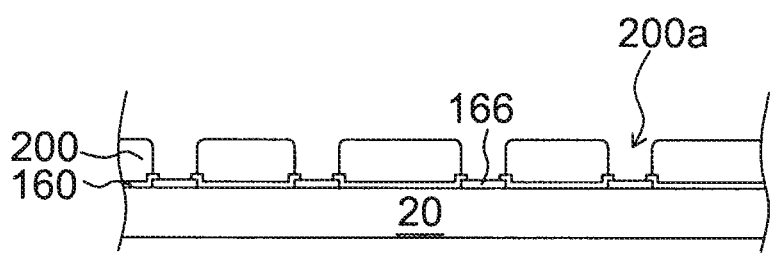

Referring to FIG. 6B, a photosensitive polymer layer 200 with a desired thickness, e.g., between about 3 micrometers and about 25 micrometers, can be formed on the passivation layer 160. Through spin coating, exposure and development, and $O_2$ plasma ash or etching, polymer layer 200 is patterned, forming many openings 200a in the polymer layer 200. These openings 200a reveal the pads 166. The polymer layer 200 is then heated, e.g., to a temperature between about 150 and about 390 degrees C. to cure polymer layer 200 so that the polymer layer 200 will harden. Exemplary materials for polymer layer 200 can be chosen from among the following: polyimide (PI), benzocyclobutene (BCB), polybenzoxazole (PBO), parylene, epoxy-based material, such as epoxy resins or photoepoxy SU-8 provided by Sotec Microsystems of Swiss Renens, or elastomers, such as silicone, or AL-2000 provided by Asahi Glass Co. Alternatively, the polymer layer 200 may be a fluorine-containing polymer with a curing temperature between about 130 and about 200 degrees C. or preferably between 150 and 190 degrees C.

In exemplary embodiments, the polymer layer 200 can be formed by spin-on coating a negative-type photosensitive polyimide layer having a desired thickness, e.g., between about 6 and about 50 micrometers on the passivation layer 160 and on the contact pads 166. The spin-on coated polyimide layer can then be baked, and then exposed. Exposure of the baked polyimide layer can be performed in exemplary embodiments by using a 1× stepper or 1× contact aligner with at least two of the following lines from a mercury vapor lamp: G-line having a wavelength ranging from 434 to 438 nm, H-line having a wavelength ranging from 403 to 407 nm, and I-line having a wavelength ranging from 363 to 367 nm. The baked polyimide layer can then be illuminated with desired wavelength, e.g., with G-line and H-line, G-line and I-line, H-line and I-line, or G-line, H-line and I-line illumination. The exposed polyimide layer can be developed to form multiple openings exposing the contact pads 166. The developed polyimide layer can then be heated or cured, e.g., at a temperature between 130 and 400° C. for a time between 20 and 150 minutes in a nitrogen ambient or in an oxygen-free ambient. The cured polyimide layer can have a thickness about between 3 and about 25 micrometers in exemplary embodiments. The residual polymeric material or other contaminants can then be removed from the contact pads 166, e.g., with an $O_2$ plasma or a plasma containing fluorine of below 200 PPM and oxygen. Consequently, the polymer layer 200 can be formed on the passivation layer 160, and the openings 200a formed in the polymer layer 200 expose the contact pads 166.

For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient. Alternatively, the developed polyimide layer can be cured or heated at a temperature between 130 and 220° C. for a time between 20 and 150 minutes in a nitrogen ambient or in an oxygen-free ambient.

In other embodiments, the polymer layer 200 can be formed by spin-on coating a positive-type photosensitive polybenzoxazole layer having a thickness of between about 3 and about 25 micrometers on the passivation layer 160 and on the contact pads 166. The spin-on coated polybenzoxazole layer can then be baked and exposed. Exposing the baked polybenzoxazole layer can include using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm. Subsequent illumination of the baked polybenzoxazole layer can include G-line and H-line, G-line and I-line, H-line and I-line, or G-line, H-line and I-line illumination. The exposed polybenzoxazole layer can then be developed to form multiple openings exposing the contact pads 166, The developed polybenzoxazole layer can then be heated or cured, e.g., at a temperature between about 150 and about 250° C., and preferably between 180 and 250° C., or between 200 and 400° C., and preferably between 250 and 350° C., for a time between about 5 and about 180 minutes, and preferably between 30 and 120 minutes, in a nitrogen ambient or in an oxygen-free ambient. The cured polybenzoxazole layer preferably has a thickness of between about 3 and about 25 µm. The residual polymeric material or other contaminants can be removed from the contact pads 166, e.g., with an $O_2$ plasma or a plasma containing fluorine of below 200 PPM and oxygen. Consequently, the polymer layer 200 can be formed on the passivation layer 160, and the openings 200a can be formed in the polymer layer 200 exposing the contact pads 166.

Figure 6C:
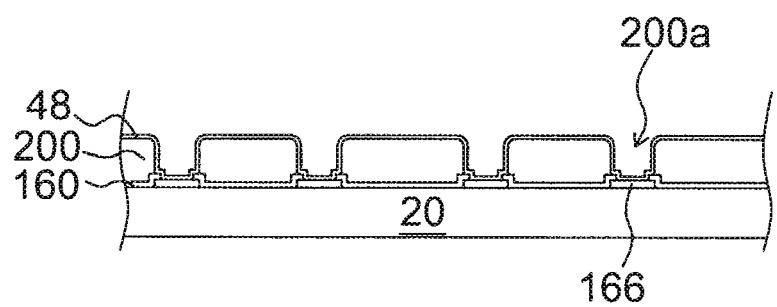

Referring to FIG. 6C, an adhesion/barrier layer 48 can be formed on the polymer layer 200 and on the pads 166 through a sputtering method. The thickness of the adhesion/barrier layer 48 is preferably between about 0.1 micrometer and about 1 micrometer, with an optimal thickness between 0.2 micrometers and 0.5 micrometers. The material of the adhesion/barrier layer 48 can be Ti, TiW, TiN, Ta, TaN or composite of the above metals.

Figure 6D:
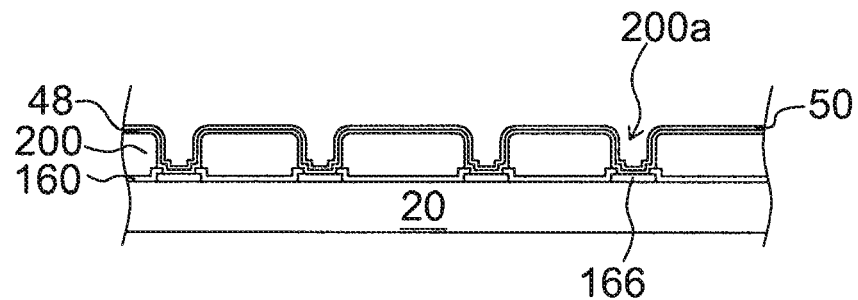

Referring to FIG. 6D, a seed layer 50 is shown, which can have a suitable thickness, e.g., between 0.05 about micrometers and about 1 micrometer (with a preferred thickness being between 0.08 micrometers and 0.5 micrometers). See layer 50 is formed on the adhesion/barrier layer 48. The material of the seed layer 50 in this embodiment is preferably gold (Au), but as in the description of the seed layer 170 above, the material of the seed layer 50 can vary depending on the material of the metal layer formed later on.

Figure 6E:
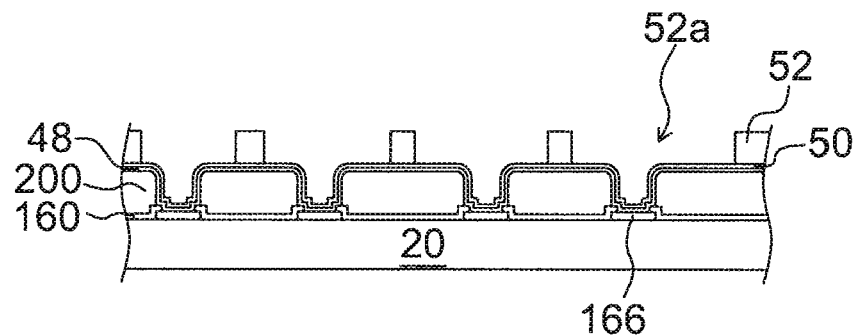

Referring to FIG. 6E, a photoresist layer 52 is formed on the seed layer 50, and through spin coating, exposure and development a patterned photoresist layer 52 is formed, with multiple photoresist openings 52a on the photoresist layer 52 that reveal the seed layer 50 on the pads 166.

Figure 6F:
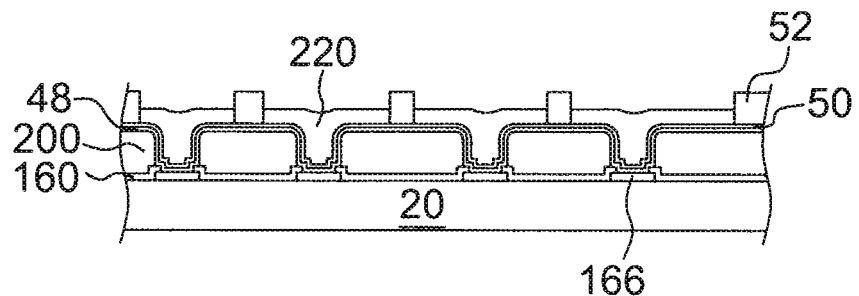

Referring to FIG. 6F, metal layer 220 is formed on seed layer 50 in photoresist layer openings 52a by an electroplating, electroless plating, sputtering or CVD method. The material of metal layer 220 includes aluminum gold, copper, silver, palladium, platinum, rhodium, ruthenium, rhenium, or nickel, and may have a single metal layer structure or multiple metal layer structure. The thickness of metal layer 220 can be between about 2 micrometers and about 25 micrometers, with an optimal preferred thickness between 3 micrometers and 10 micrometers. The structure of metal layer 220, when formed as a multiple metal layer structure, can include combinations such as Cu/Ni/Au, Cu/Au, Cu/Ni/Pd, and Cu/Ni/Pt. In this embodiment metal layer 220 is preferably a single gold layer.

Figure 6G:
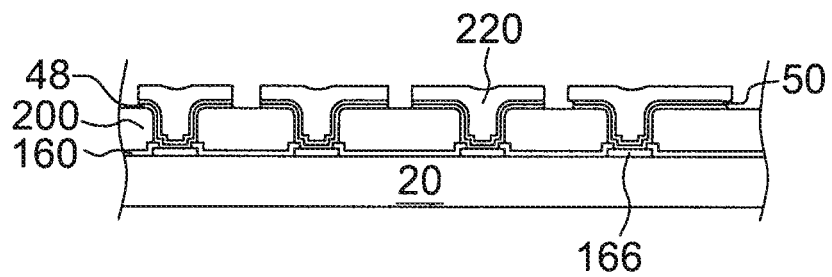

Referring to FIG. 6G, a removal process can be applied to remove patterned photoresist layer 52 and portions of seed layer 50 and adhesive/barrier layer 48 that are not below metal layer 220. If seed layer 50 is made of gold, seed layer 50 can be removed by using $I_2$ plus KI solution. On the other hand, hydrogen peroxide ($H_2O_2$) can be used to remove adhesive/barrier layer 48 if the material of the adhesion/barrier layer 48 is TiW. The portions of seed layer 50 and adhesive/barrier layer 48 under metal layer 220 correspond to label 210 in FIG. 6.

Figure 6H:
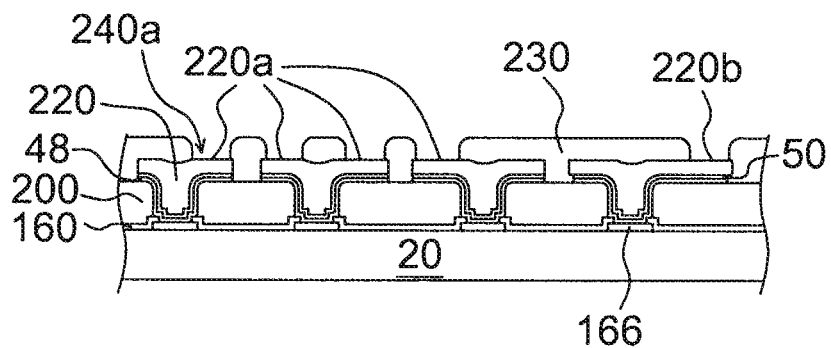

Referring to FIG. 6H, a photosensitive polymer layer 230 with a desired thickness can be formed, e.g., between about 3 micrometers and about 25 micrometers. Through spin coating, exposure, development, and $O_2$ plasma ash or etching, multiple openings 240a can be formed in the polymer layer 230, which expose the metal layer 220. Next, the polymer layer 230 can be heated and cured. A suitable curing process can proceed at a temperature between about 150 degrees Celsius and about 380 degrees Celsius. The material of the polymer layer 230 can be chosen from polyimide (PI), benzocyclobutene (BCB), polybenzoxazole (PBO), parylene, epoxy-based material, such as epoxy resins or photoepoxy SU-8 provided by Sotec Microsystems of Swiss Renens, or elastomers, such as silicone, or AL-2000 provided by Asahi Glass Co. Alternatively, the polymer layer 230 may be a fluorine-containing polymer with a curing temperature between about 130 and about 200 degrees C., and preferably between 150 and 190 degrees C.

The polymer layer 230 can be formed by spin-on coating a negative-type photosensitive polyimide layer having a thickness between 6 and 50 micrometers on the polymer layer 200 and on the metal layer 220. The spin-on coated polyimide layer can then be baked and exposed. Exposing the baked polyimide layer can include using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm. The baked polyimide layer can then be illuminated. Illuminating the baked polyimide layer can include G-line and H-line, G-line and I-line, H-line and I-line, or G-line, H-line and I-line illumination of the baked polyimide layer. The exposed polyimide layer can then be developed to form multiple openings exposing the metal layer 220. The developed polyimide layer can then be heated or cured, e.g., at a temperature between about 130 and about 400° C. for a time between 20 and 150 minutes in a nitrogen ambient or in an oxygen-free ambient. The cured polyimide layer can have a thickness between about 3 and about 25 micrometers in exemplary embodiments. The residual polymeric material or other contaminants can then be removed from the exposed metal layer 220, e.g., with an $O_2$ plasma or a plasma containing fluorine of below 200 PPM and oxygen.

The polymer layer 230 can be formed on the polymer layer 200 and on the metal layer 220, and the openings 240a formed in the polymer layer 230 can expose the metal layer 220. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient. Alternatively, the developed polyimide layer can be cured or heated at a temperature between 130 and 220° C. for a time between 20 and 150 minutes in a nitrogen ambient or in an oxygen-free ambient.

The polymer layer 230 can be formed by spin-on coating a positive-type photosensitive polybenzoxazole layer having a thickness of between 3 and 25 micrometers on the polymer layer 200 and on the metal layer 220. The spin-on coated polybenzoxazole layer can then be baked, and subsequently exposed. Exposing the baked polybenzoxazole layer can include using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm. The baked layer can then be illuminated. Illuminating the baked polybenzoxazole layer can include G-line and H-line, G-line and I-line, H-line and I-line, or G-line, H-line and I-line illumination. The exposed polybenzoxazole layer can then be developed to form multiple openings exposing the metal layer 220. Then curing or heating of the developed polybenzoxazole layer can be performed, e.g., at a temperature between about 150 and about 250° C., and preferably between 180 and 250° C., or between about 200 and about 400° C., and preferably between 250 and 350° C., for a time between about 5 and about 180 minutes, and preferably between 30 and 120 minutes, in a nitrogen ambient or in an oxygen-free ambient. The cured polybenzoxazole layer can have a thickness of between 3 and 25 μm, in exemplary embodiment. The residual polymeric material or other contaminants can be removed from the exposed metal layer 220 by a suitable process. For example, with an $O_2$ plasma or a plasma containing fluorine of below 200 PPM and oxygen. Consequently, the polymer layer 230 can be formed on the polymer layer 200 and on the metal layer 220, and the openings 240a formed in the polymer layer 230 expose the metal layer 220.

Still referring to FIG. 6H, metal layer 220 revealed by openings 240a can form multiple pads 220a and one wire bonding pad 220b. Pads 220a can be used to connect to external devices 310 and external device 320, and wire binding pad 220b can be connected to external circuits or power supplies through wires formed by the wire bounding method. In this embodiment, external devices 310 and 320 may be passive devices, which include inductors, capacitors, and integrated passive devices. In the present disclosure, external devices 310 and 320 are two different passive devices. For example, external device 310 may be a capacitor, while external device 320 may be an inductor, or external device 310 may be an integrated passive device, while external device 320 may be an inductor. The dimensions of external devices 310 and 320 may be chosen from industrial standard dimension 1210, dimension 0603, dimension 0402, or dimension 0201, wherein the dimension 0201 stands for 0.02 inches by 0.01 inches, and dimension 1210, dimension 0603, and dimension 0402 deduced by the same standard. In general, external devices 310 and 320 can have a length between 0.2 mm and 5 mm, a width between 0.1 mm and 4 mm, and a height between 0.01 mm and 2 mm.

Figure 6I:
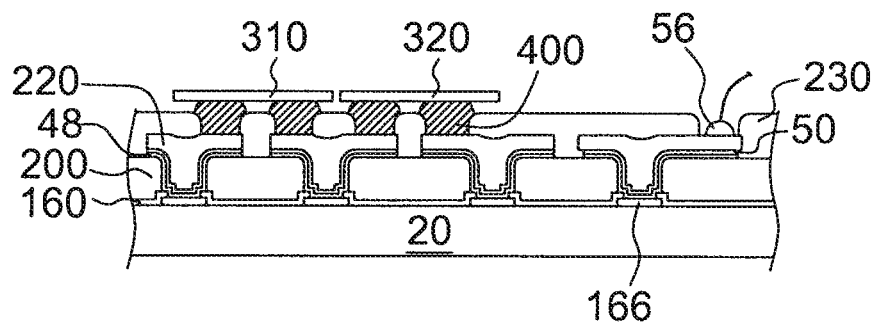

Referring to FIG. 6I, external device 310 and external device 320 can be separately connected to pads 220a. External device 310 and external device 320 can include a solder layer 400, with a thickness between 30 micrometers and 350 micrometers, and may be made of materials such as Sn/Ag, Sn/Cu/Ag, Sn/Au alloy, or other related materials. The solder layer 400 may be provided by screen printing process instead of included in external devices. External device 310 and external device 320 can be connected to pads 220a through solder layer 400 by using surface mount technology.

The next step can include a dicing procedure, where substrate 100 is sawed into multiple chips. Then a wire 56 is formed by wire bonding on wire bonding pad 220b, and the wire 56 is used to connect wire bonding pad 220b to external circuits or power supplies. The wire 56 can be formed of copper or gold. For example, a copper or gold wire can be connected to wire bonding pad 220b through wire-bonding techniques, where the wire bonding pad 220b is a copper pad, aluminum pad, aluminum cap or nickel cap. Also, external devices 310 and 320 can be mounted after dicing procedures are performed on substrate 100 by using surface mount technology.

Embodiment 5

Figure 7A:
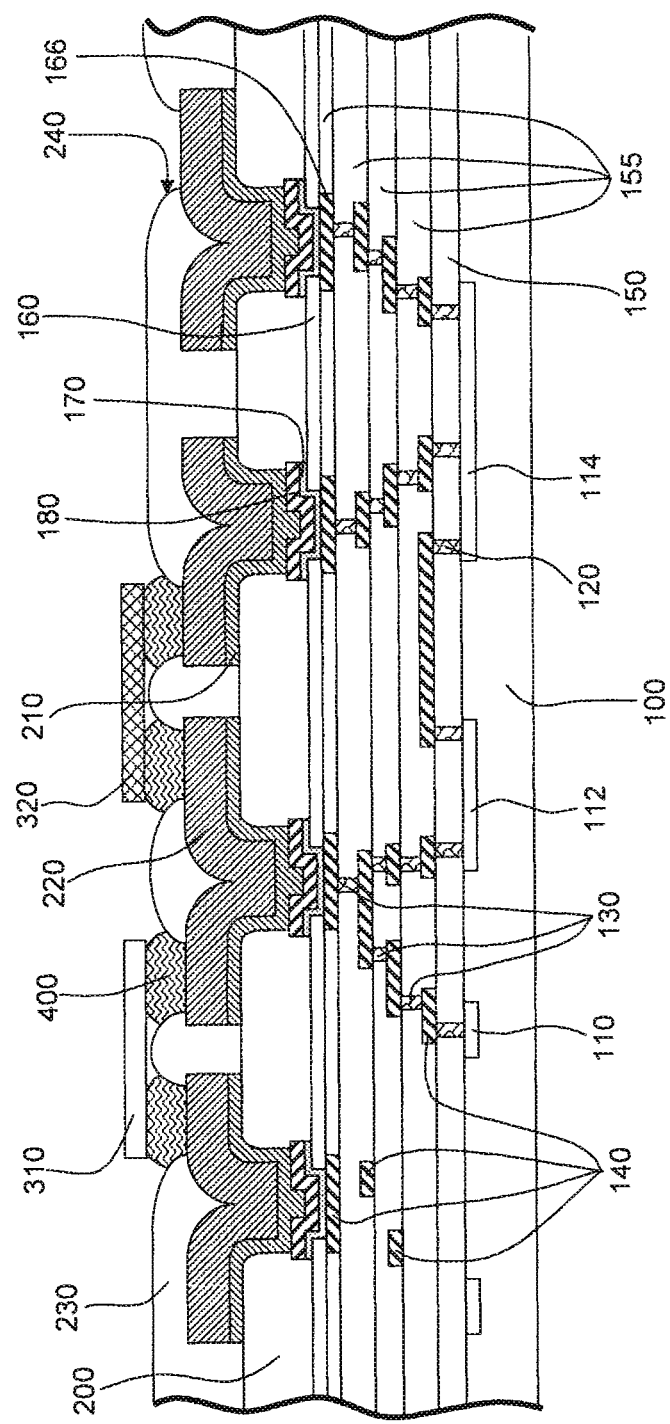
FIG. 7A depicts a diagram view of a cross section of a semiconductor chip in accordance with a fifth embodiment of the present disclosure.

Referring to FIG. 7A, the pad metal 166 of the circuit structure in the above mentioned four embodiments can be made of aluminum. In a fifth embodiment of the present disclosure ("Embodiment 5"), the pad metal 166 can be made of copper. When the pad metal 166 is made of copper, a metal cap layer 170 is preferably included to protect pad 166 revealed by passivation layer 160 openings, so that pad 166 will not be damaged by oxidation and can sustain later on processes such as wire bonding and flip-chip. The metal cap layer 170 can be an aluminum-copper layer, a gold layer, a titanium (Ti) layer, a titanium tungsten alloy layer, a tantalum (Ta) layer, a tantalum nitride (TaN) layer, or a nickel (Ni) layer. When the metal cap is an aluminum-copper layer, a barrier layer (not shown in figure) can be formed between the copper pad 166 and metal cap layer 170. This barrier layer can be titanium, titanium tungsten alloy, titanium nitride, tantalum, tantalum nitride, chromium, or nickel in exemplary embodiments.

The manufacturing of under bump metal structure and mounting external devices in FIG. 7A can be the same as that described for Embodiment 4.

Embodiment 6

Figure 7B:
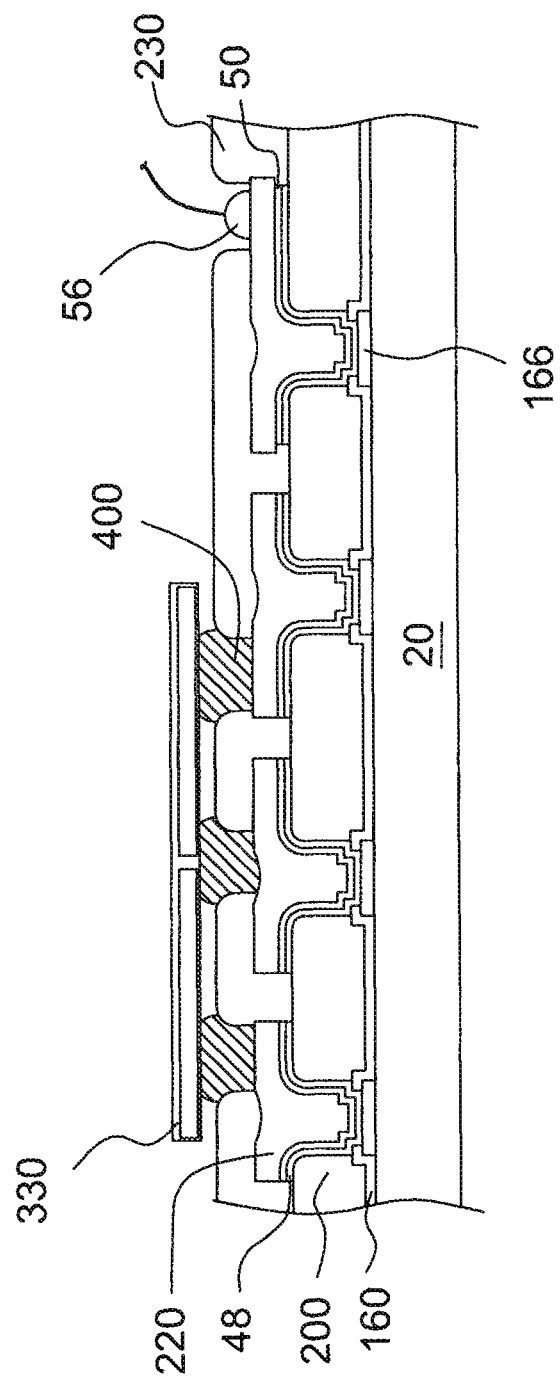
FIG. 7B depicts a diagram view of a cross section of a semiconductor chip in accordance with a sixth embodiment of the present disclosure.

Referring to FIG. 7B, a sixth embodiment ("Embodiment 6") of the present disclosure is shown. A difference between Embodiment 6 and the first to fifth embodiments is that external devices are integrated into a single external device 330. For example, external device 330 can be an integrated passive device of a capacitor and an inductor. Except for external device 330, the manufacturing process and materials are all identical to those of the first to fifth embodiments. Therefore, the manufacturing process and materials of identical devices will not be repeated.

All the semiconductor chip structures described in the above six embodiments can be packaged in the Ball Grid Array (BGA) as shown in FIGS. 8-11. FIGS. 8-11 reveal the packaging structure of a semiconductor chip package structure with only one semiconductor device.

Figure 8:
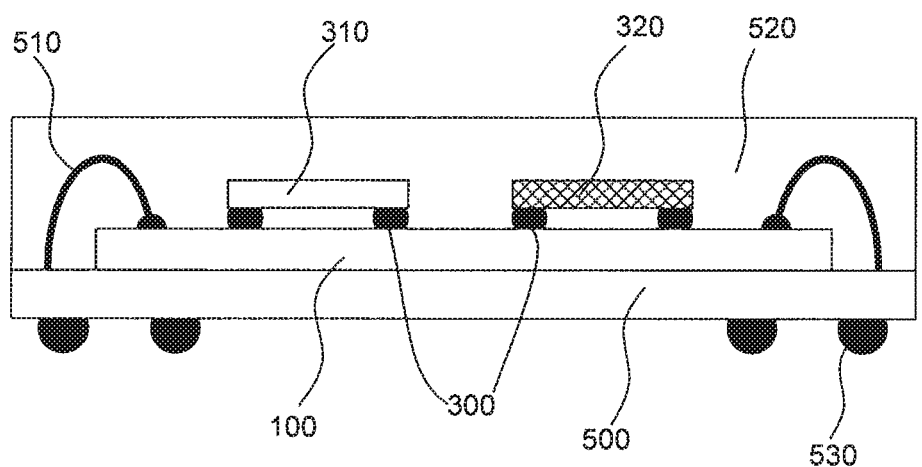
FIGS. 8-11 depict ball grid array (BGA) package structures in accordance with a fourth embodiment of the present disclosure.

FIG. 8 depicts a packaging structure useful for containing or packaging chip structures of the present disclosure, e.g., Embodiment 1 shown in FIG. 3, Embodiment 2 shown in FIG. 4, Embodiment 4 shown in FIG. 6, and/or Embodiment 5 shown in FIG. 7A. The packaging structure of FIG. 8 includes integrated circuit 20 (100) electrically connected to a BGA substrate 500 through wire 510. As also shown in the drawing, the above mentioned chip devices can be sealed with a molding compound 520. BGA substrate 500 shown has multiple solder balls 530 and is electrically connected to outside circuits through these solder balls 530.

Figure 9:
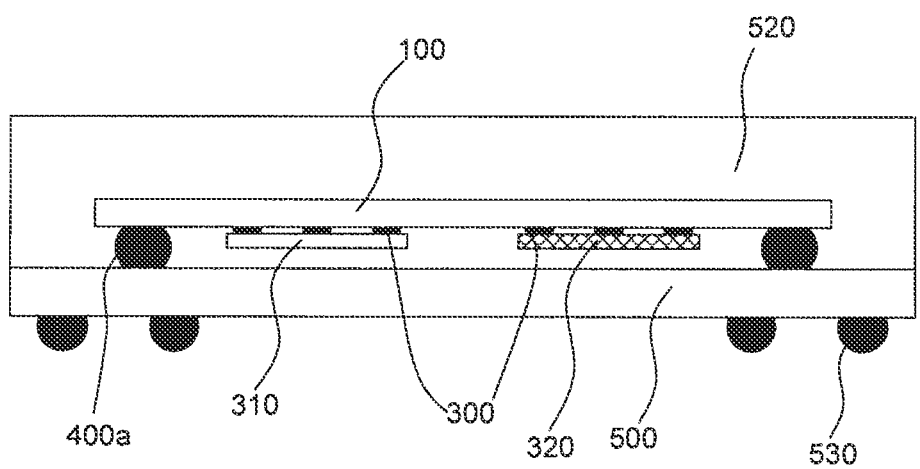

FIG. 9 depicts another embodiment of a packaging structure, which is useful for holding or packaging a chip package according to Embodiment 3 shown in FIG. 5. The integrated circuit 20 (100) is electrically connected to BGA substrate 500 through solder layer 400a. Then, the above mentioned devices are sealed with a molding compound 520, and the BGA substrate 500 is electrically connected to outside circuits through solder balls 530. The molding compound 520 can be a polymer such as epoxy resin or polyimide compound.

Figure 10:
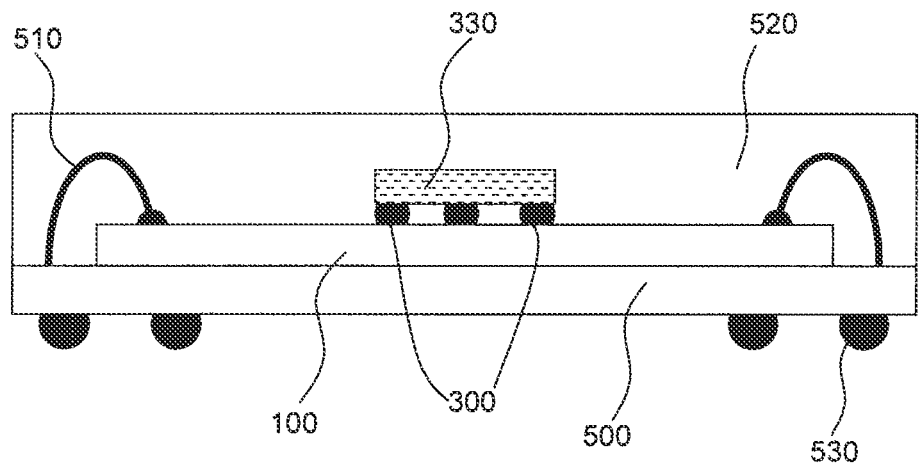
Figure 11:
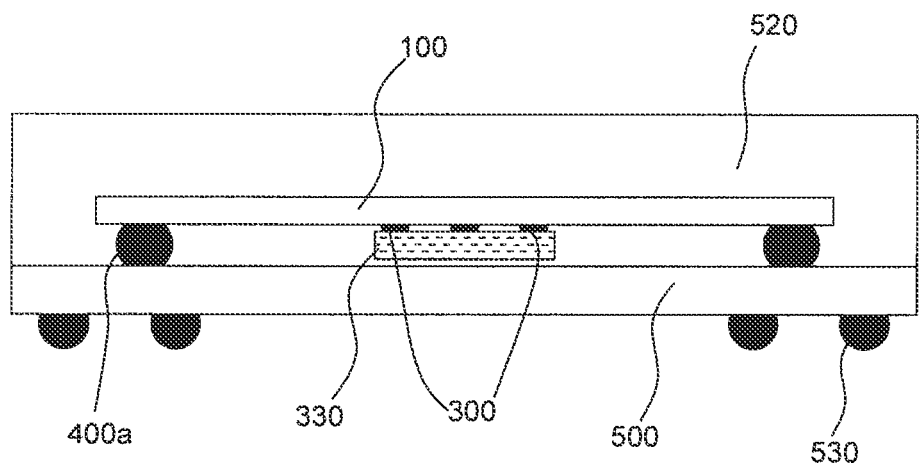

In FIG. 10 and FIG. 11, the external device 310 and 320 in FIGS. 8 and 9 are replaced by an integrated passive device 330 (such as in embodiment 6). In FIG. 10, the integrated circuit 20 (100) is electrically connected to the BGA substrate 500 through wire 510, and in FIG. 11, it is electrically connected to the BGA substrate 500 through solder layer 400a.

Aside from above mentioned BGA packaging structure, the present disclosure can accommodate or conform to common packaging formats such as the thin small outline package (TSOP), small outline J-lead (SOJ), quad flat package (QFP), thin quad flat package (TQFP), or other common lead frame packaging form. As shown in FIG. 12A-12F and FIG. 13A-13F, an integrated circuit 20 (100) can be constructed on lead frame 600, which can be made of copper or copper alloy and have a thickness between about 100 micrometers and about 2000 micrometers.

Figure 12A:
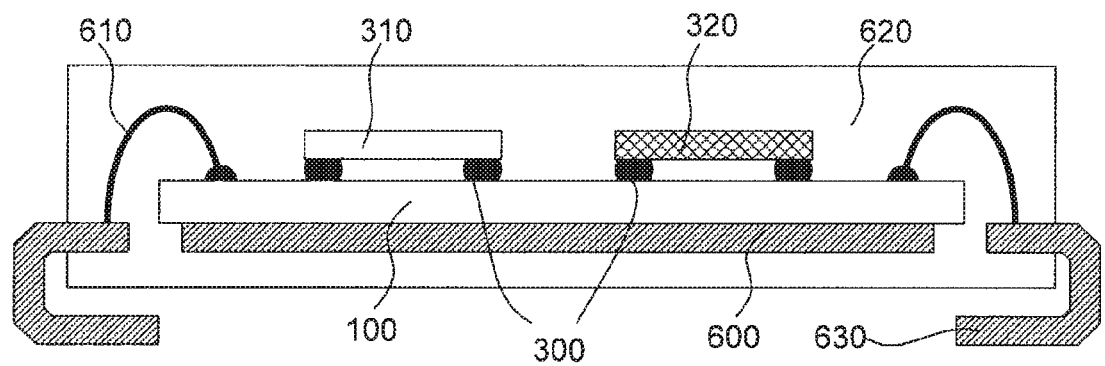
FIGS. 12A-12F depict semiconductor chip package structures in accordance with first, second, fourth, and fifth embodiments of the present disclosure.
Figure 12B:
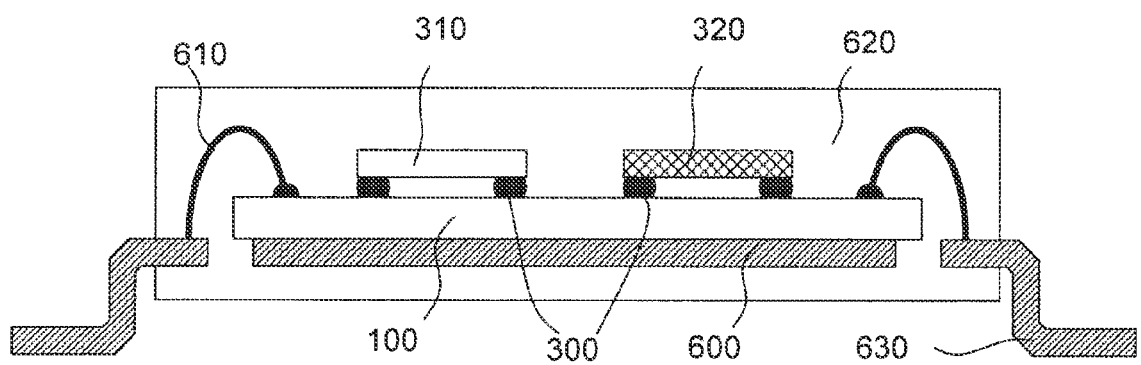
Figure 12C:
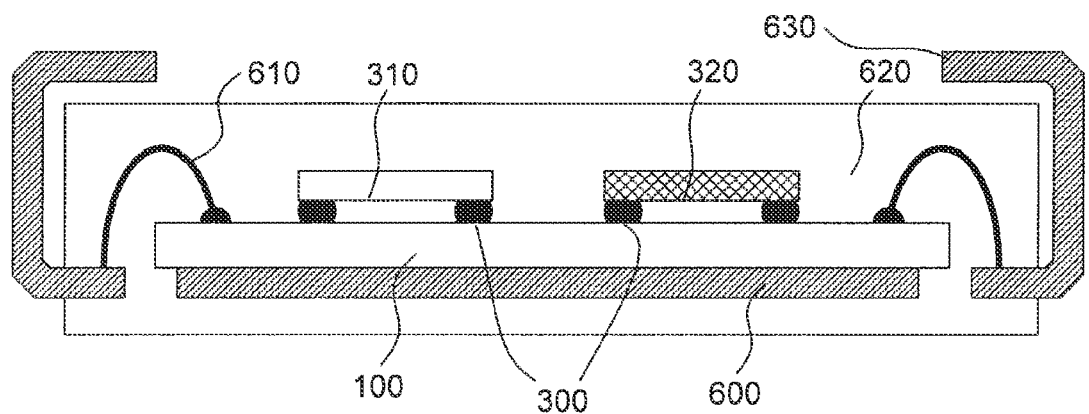

FIG. 12A-12C depict a packaging structure suitable for packaging chip structures according to Embodiment 1 of FIG. 3, Embodiment 2 of FIG. 4, Embodiment 4 of FIG. 5, and Embodiment 5 of FIG. 6A. As shown in FIGS. 12A-12C, integrated circuit 20 (100) is electrically connected to lead frame 600 through wire 610. The above mentioned devices are then sealed with a molding compound 620, but exposing the leads of lead frame 600. These leads are then connected to an outside circuit.

Figure 12D:
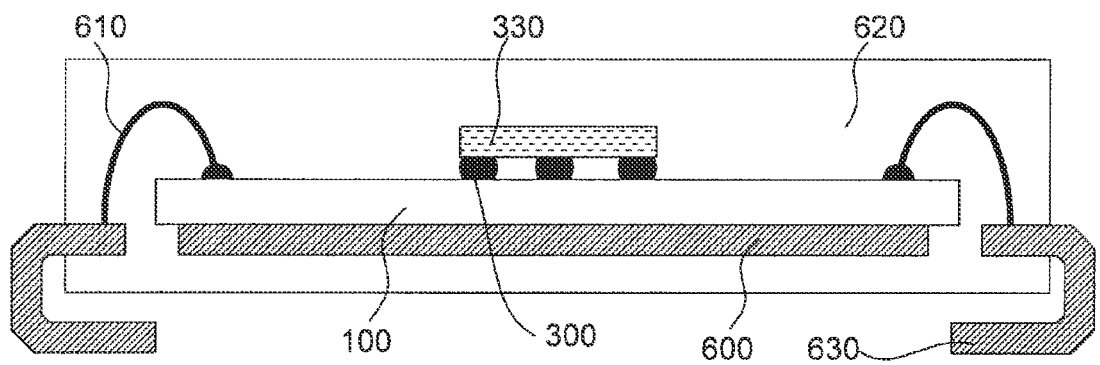
Figure 12E:
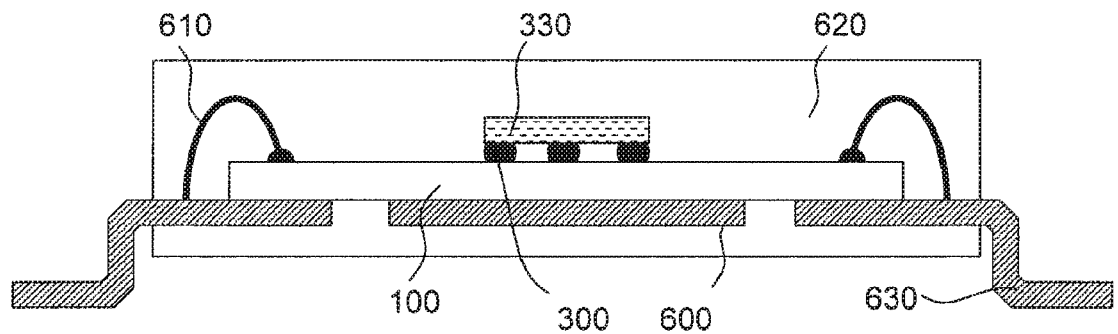
Figure 12F:
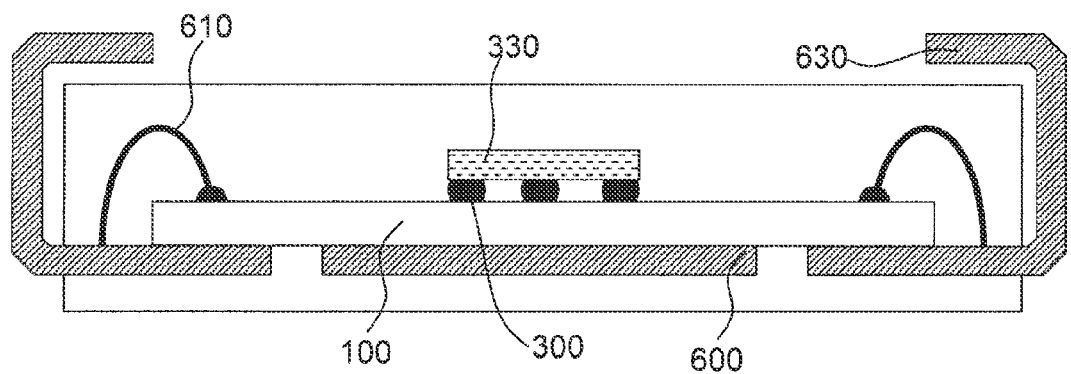

In FIGS. 12D-12F, the external devices 310 and 320 in FIG. 12A-12C are replaced by an integrated device 330 (as in Embodiment 6).

Figure 13A:
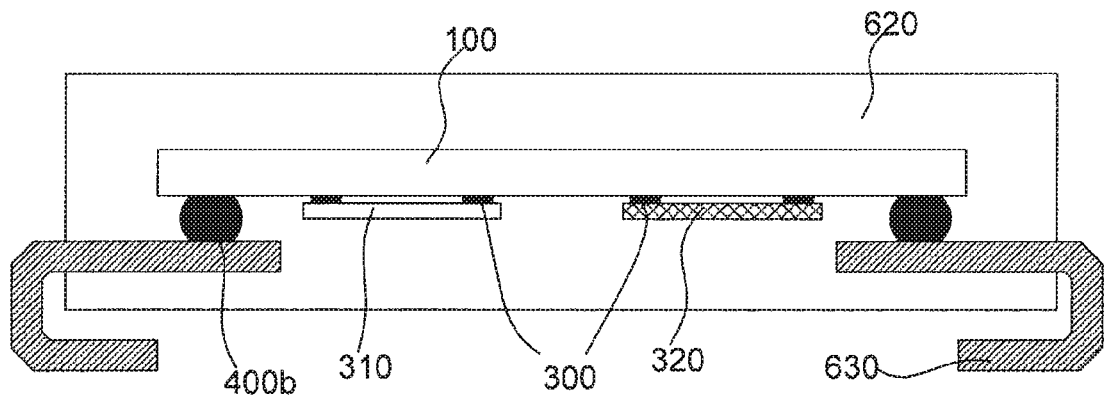
FIGS. 13A-13C depict semiconductor chip package structures in accordance with a third embodiment of the present disclosure.
Figure 13B:
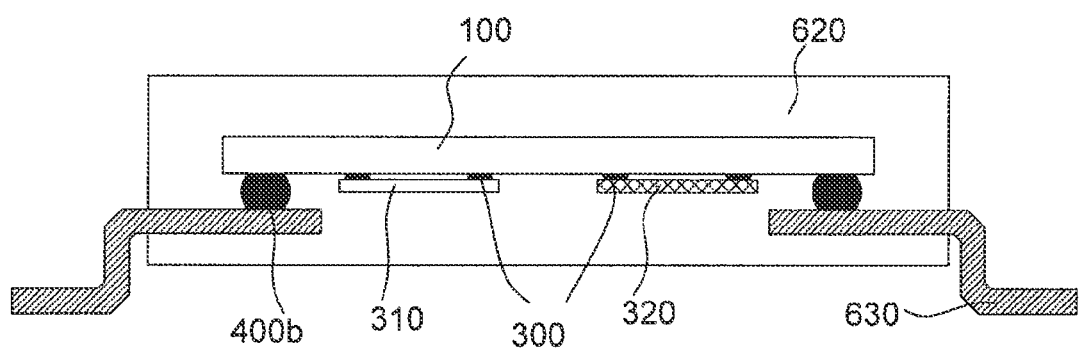
Figure 13C:
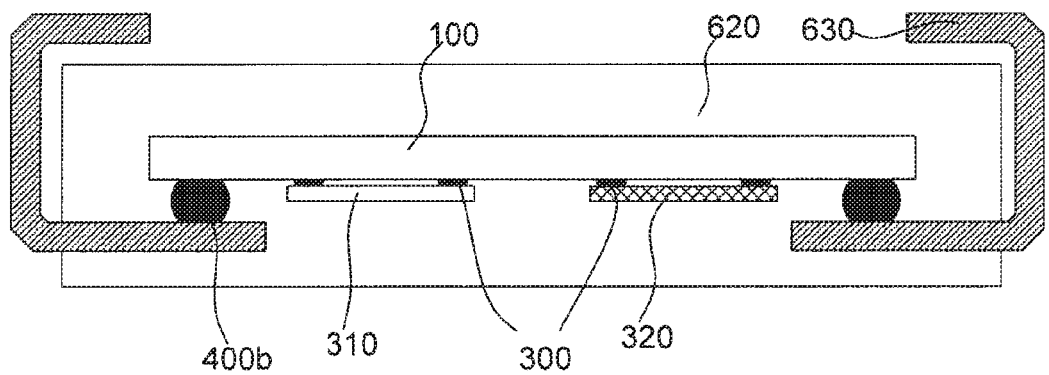

In FIGS. 13A-13C another packaging structure of Embodiment 3 of FIG. 5 is shown. Integrated circuit 20 (100) is electrically connected to lead frame 600 through solder layer 400b, and the above-mentioned devices are then sealed with molding compound 620, but exposing the leads of lead frame 600. These leads are then connected to other outside circuits. The molding compound 620 is a polymer such as epoxy resin or polyimide compound.

Figure 13D:
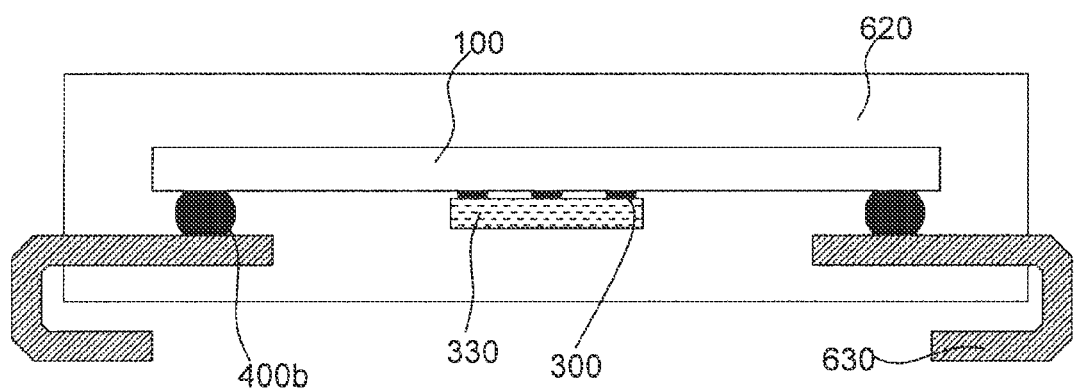
FIGS. 13D-13F depict semiconductor chip package structures in accordance with a sixth embodiment of the present disclosure.
Figure 13E:
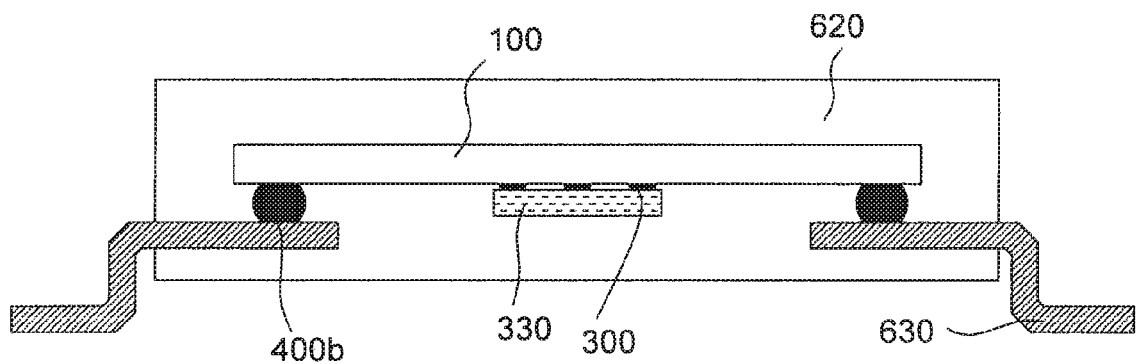
Figure 13F:
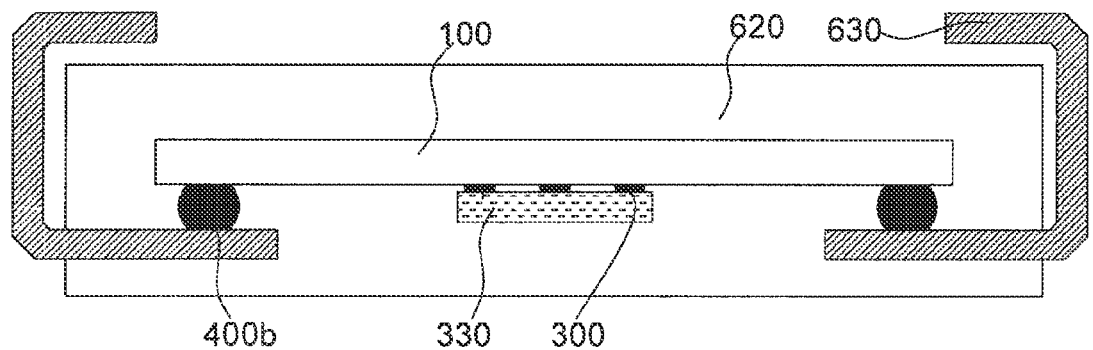

In FIGS. 13D-13F, the external devices 310 and 320 in FIGS. 14A-14C are replaced by an integrated device 330 (as in Embodiment 6).

The description up until this point has been of semiconductor chip structures. Following is the description and explanation of application circuits corresponding to the semiconductor chip structures. The application circuits include an internal circuit, an external circuit, and a metal connection which are all integrated on a single semiconductor chip.

Figure 14:
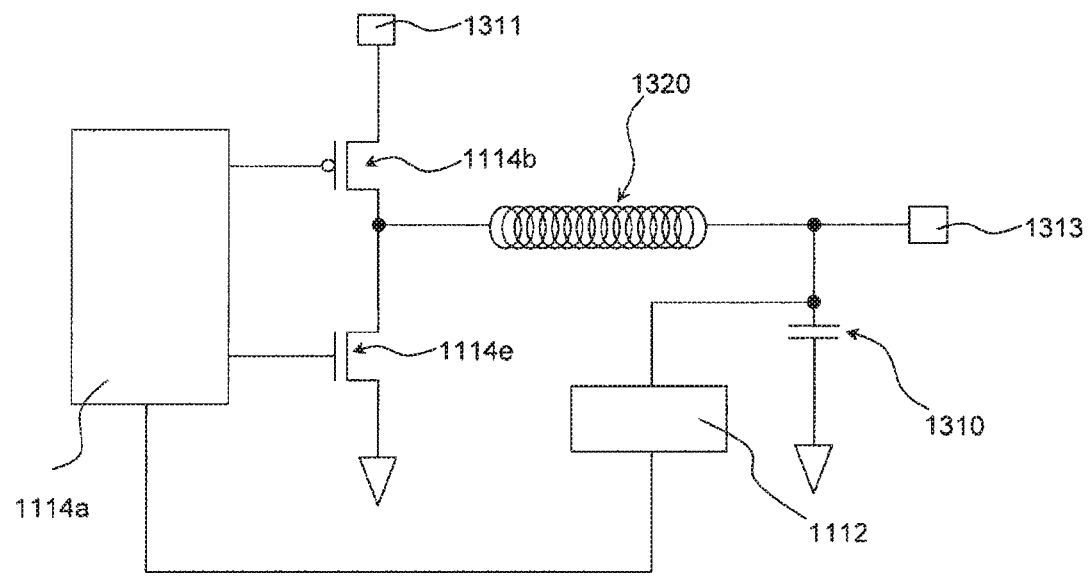
FIG. 14 depicts a diagram of an equivalent circuit of a semiconductor chip in accordance with a first embodiment of the present disclosure.

In FIG. 14, a simplified equivalent circuit is shown. Voltage feedback device 1112, and switch circuit including switch controller 1114a and switch MOS 1114b, 1114e are shown in FIG. 14. Inductor 1320 and capacitor 1310 are also shown in FIG. 14, where inductor 1320 and capacitor 1310 are connected and voltage feedback device 1112 is electrically connected between inductor 1320 and capacitor 1310. This voltage feedback device 1112 can feedback the voltage signal between inductor 1320 and capacitor 1310.

In the circuit revealed by FIG. 14, a power supply input 1311 uses wire-bonded leads or solder layers on contact pads of the semiconductor chip to input power to MOS 1114b, which is below the passivation layer of the semiconductor chip. Feedback device 1112 then takes the voltage signal passing between inductor 1320 and capacitor 1310, and the voltage signal is transmitted back to switch controller 1114a. Switch controller 1114a then uses the signal to decide the on and off timing of the two MOS 1114b and 1114e located on the semiconductor chip, which allows switch controller 1114a to regulate the duty cycle of MOS 1114b and 1114e and therefore to regulate the voltage at output 1313. In the present disclosure, inductor 1320, capacitor 1310, switch controller 1114a, and voltage feedback device 1112 form the voltage regulator or converter. Therefore, according to different working voltage ranges of semiconductor chips, the voltage regulator integrated with the semiconductor chip can use the described mechanism to regulate voltages immediately, using the shortest transfer path to transfer power supply to the semiconductor chip, allowing the voltage level of the semiconductor chip's power supply to be quickly regulated to a specific voltage range. MOS 1114b can be replaced by DMOS, LDMOS or Bipolar transistor. MOS 1114e can be replaced by DMOS, LDMOS or bipolar transistor also. The voltage feedback device 1112 may feature dynamic voltage scaling function. The switch controller 1114a may comprise a Pulse-Frequency-Modulator or a Pulse-Width-Modulator to control duty cycle, wherein the modulation frequency of the switch controller 1114a is between 1K Hz and 300M Hz, and preferably between 1M Hz and 100M Hz, for duty cycle control.

Also, according to the electrical circuit structure shown in FIG. 14 and the semiconductor chip structure disclosed by the present disclosure, since the passive components in the present disclosure are all integrated over semiconductor substrates with active devices, therefore, multiple electronic devices could easily be connected to each other.

Figure 15:
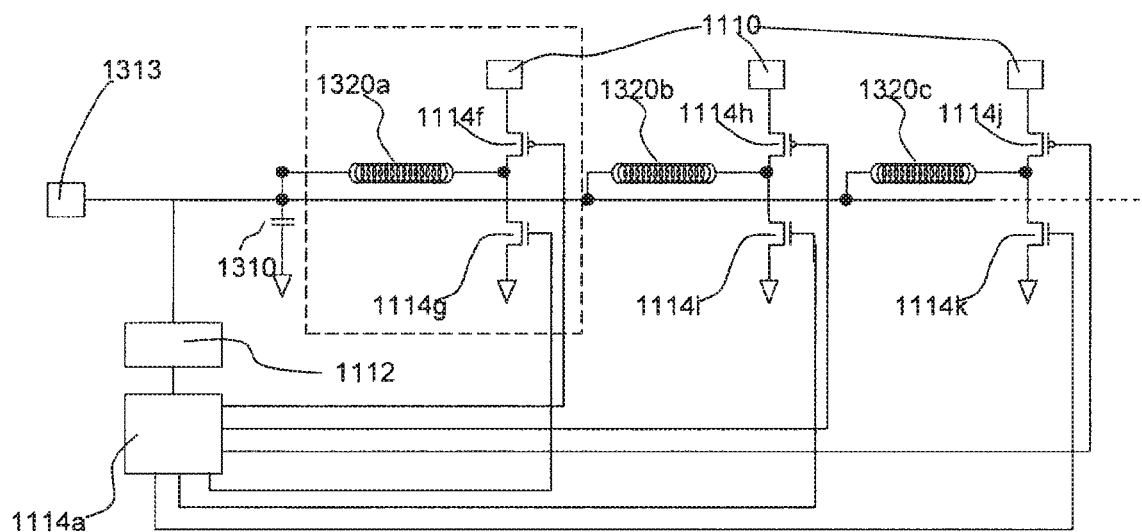
FIG. 15 depicts a diagram of an equivalent circuit of a semiconductor ship in accordance with a second embodiment of the present disclosure.

FIG. 15 shows an equivalent circuit of multiple passive devices and a semiconductor chip connected together, wherein all switch MOS 1114f, 1114h, 1114j, 1114g, 1114i, 1114k and inductor 1320a, 1320b, and 1320c connect to a capacitor 1310, voltage feedback device 1112, and a switch controller 1114a. Therefore, when input pad 1110 inputs a power supply, voltage feedback device 1112 takes a voltage signal between inductors 1320a, 1320b, 1320c and capacitor 1310 and sends a voltage feedback signal to switch controller 1114a. Switch controller 1114a then decides when MOS 1114f, 1114g, 1114h, 1114i, 1114j, 1114k will be switched on or off separately. The switch controller 1114a controls the duty cycles and on-off phases of switch MOS 1114f, 1114g, 1114h, 1114i, 1114j, 1114k to fine-tune the voltage level at output 1313. When switch controller 1114a controls MOS 1114f, 1114g, 1114h, 1114i, 1114j, 1114k, at least two different on-off phases are generated.

Figure 16:
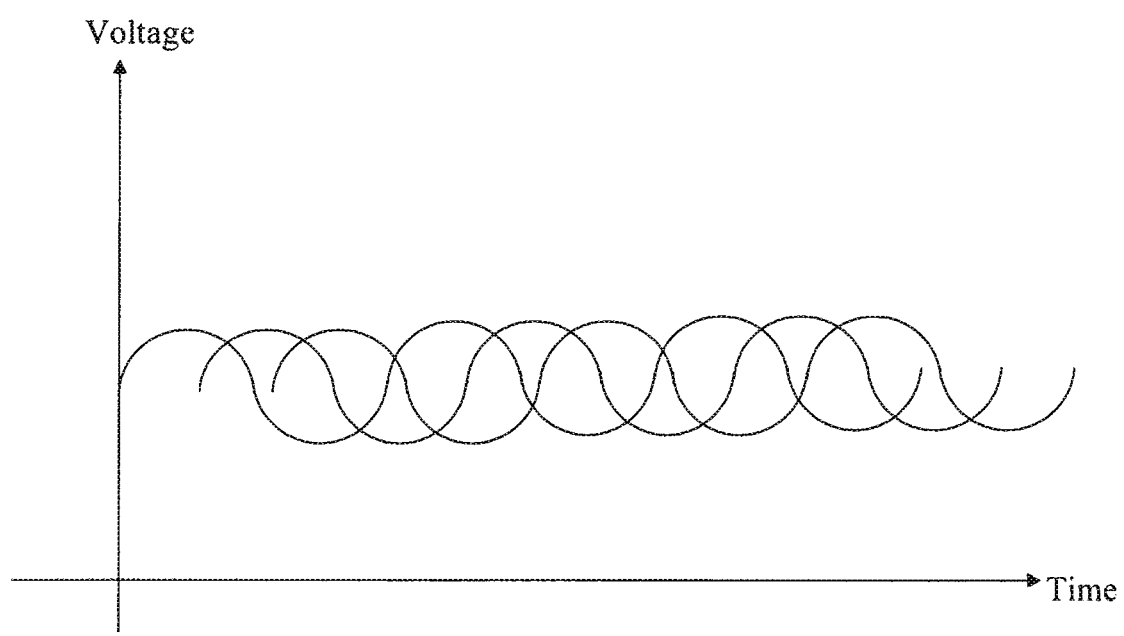
FIG. 16 is a graph showing the relationship between voltage and time of the circuit in FIG. 15.

As shown in FIG. 16, a result of output of FIG. 15's circuit when each switch MOS set with different switching phase, the voltage ripple of output is minimized by different on-off phases of switching MOS. Therefore, embodiments of the present disclosure provide a semiconductor chip with a more stable power voltage. All of MOS 1114f, 1114h, 1114j, 1114g, 1114i, 1114k can be replaced by DMOS, LDMOS or Bipolar transistors.

Embodiment 7

FIGS. 17A-17L demonstrate a manufacturing process of an on-chip regulator or converter with inductor and capacitor, wherein the inductor is made by using post-passivation embossing process and the capacitor is attached by using surface mount technology.

Figure 17A:
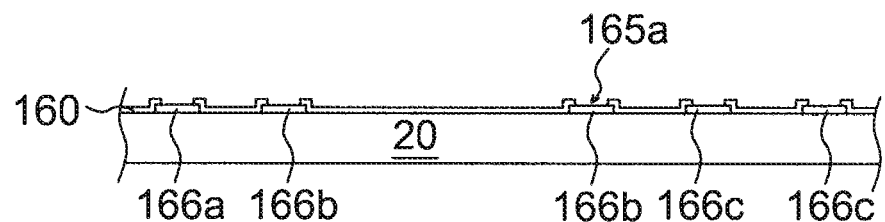
FIGS. 17A-17L depict fabrication processes in accordance with a seventh embodiment of the present disclosure.

Referring to FIG. 17A, integrated circuit 20 represents all structures below passivation layer 160. Also included in integrated circuit 20 is substrate 100, devices 110, 112, 114, first dielectric layer 150, metal layers 140, second dielectric layer 155, metal contact 120, and metal via 130 (such as shown in FIG. 7A, for example), wherein multiple passivation layer openings 165a in passivation layer 160 reveal multiple pads 166a, 166b, and 166c.

Figure 17B:
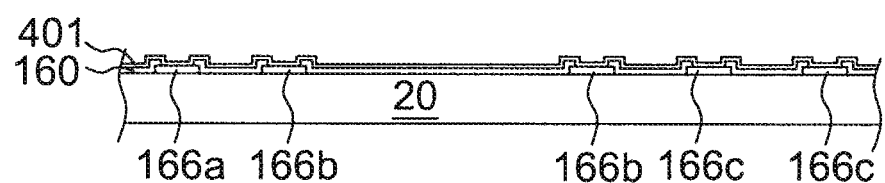

Referring to FIG. 17B, an adhesion/barrier layer 401 is formed by sputtering on passivation layer 160 and contact pads 166a, 166b, and 166c. The thickness of the adhesion/barrier layer 401 can be between about 0.1 micrometers and about 1 micrometer, with a preferred optimal thickness being between 0.3 micrometers and 0.8 micrometers. The material of adhesion/barrier 401 is preferably TiW or Ti or Ti/TiW.

Figure 17C:
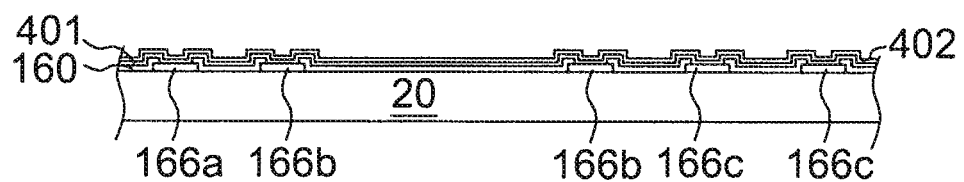

Referring to FIG. 17C, a seed layer 402 is formed with a desired thickness, e.g., between about 0.05 micrometers and about 1 micrometers (with a preferred optimal thickness being between 0.08 micrometers and 0.7 micrometers). The seed layer 402 can be formed on adhesion/barrier layer 401 by sputtering. In this embodiment, the seed layer 402 is preferably made of gold. As described above, however, the material of seed layer 402 can vary according to the material of metal layers formed afterwards.

Figure 17D:
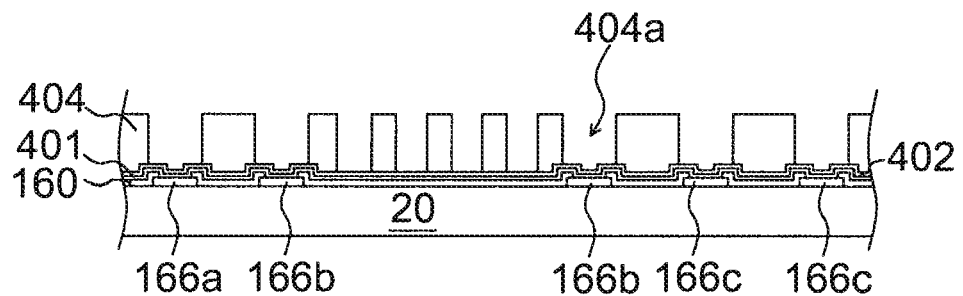

Referring to FIG. 17D, a photoresist layer 404 is formed on seed layer 402, and through spin coating, exposure and development, photoresist layer 404 is patterned, forming multiple photoresist layer openings 404a in photoresist layer 404, which separately reveal portions of seed layer 402 that are over pad 166a, 166b, and 166c.

Figure 17E:
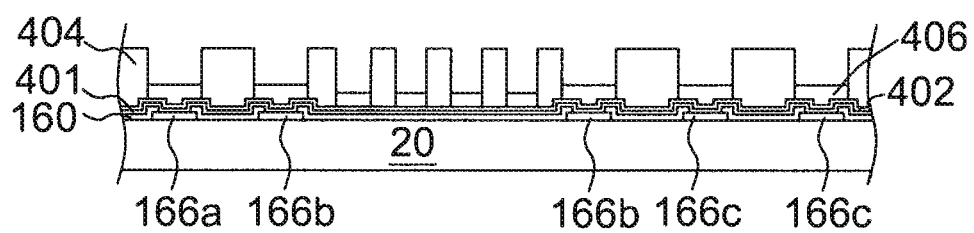

Referring to FIG. 17E, bonding metal layer 406 is formed by an electroplating, electroless plating, sputtering or CVD method on seed layer 402, which is in photoresist layer openings 404a. The bonding metal layer 406 consists of materials such as aluminum, gold, copper, silver, palladium, rhodium, ruthenium, rhenium, or nickel, and may have a single metal layer structure or multiple metal layer structure. The thickness of bonding metal layer 406 is selected as desired, e.g., between about 1 micrometers and about 100 micrometers, with an optimal preferred thickness being between 1.5 micrometers and 15 micrometers. The combinations of the multiple metal layer structure can include Cu/Ni/Au, Cu/Au, Cu/Ni/Pd, and Cu/Ni/Pt. In this embodiment, bonding metal layer 406 is preferably a single layer made of gold.

Figure 17F:
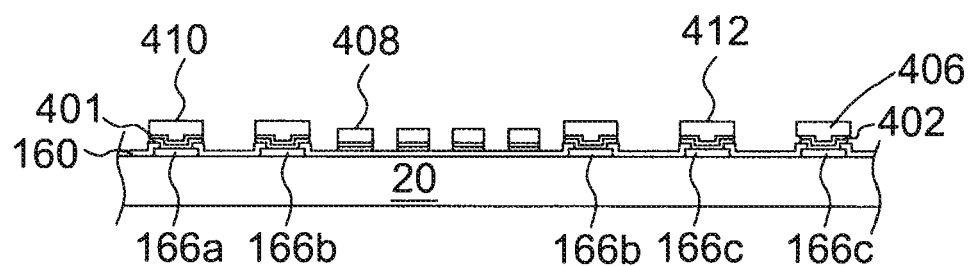

Referring to FIG. 17F, a removal process can be applied to remove the patterned photoresist layer 404 and portions of seed layer 402 and adhesive/barrier layer 401 that are not below metal layer 406. Portions of seed layer 402 that are made of gold can be removed by using solvents containing KI plus $I_2$ solution, while adhesive/barrier layer 401 can be removed by using solvents containing hydrogen peroxide ($H_2O_2$) if the material of layer 401 is TiW.

Figure 17G:
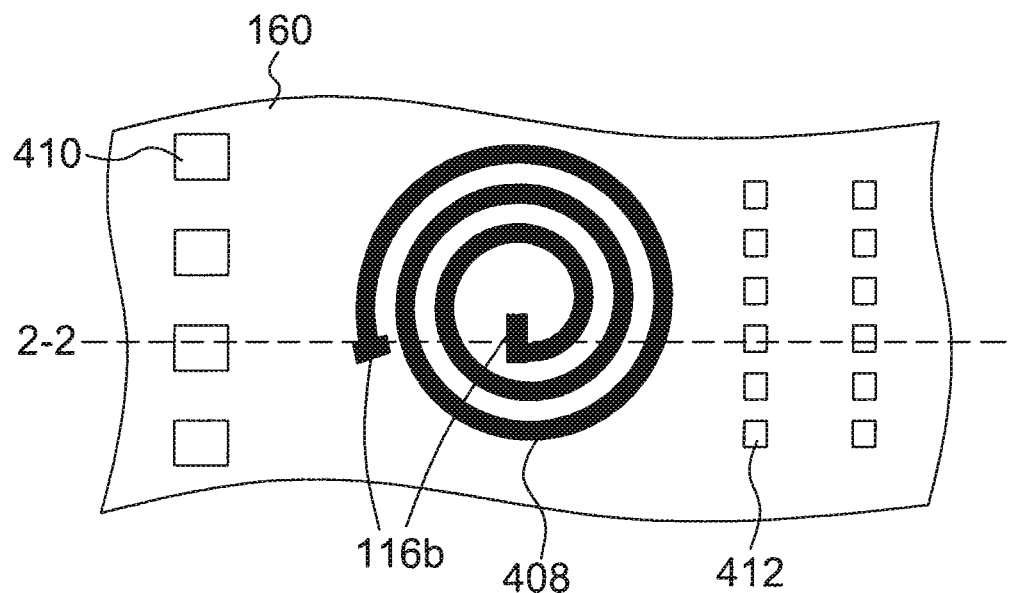
Figure 17H:
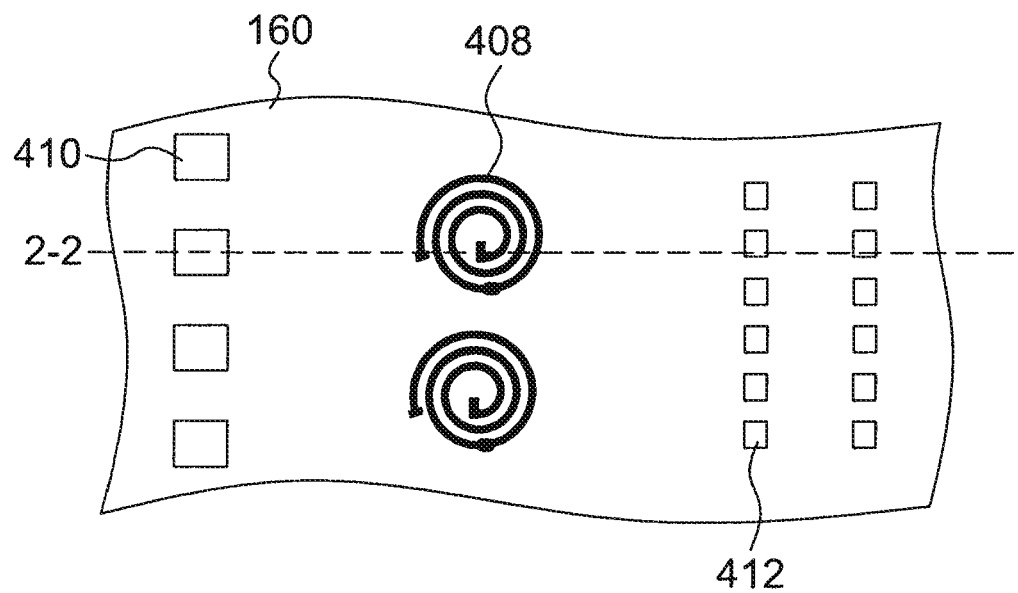

Referring to FIG. 17G, after removing patterned photoresist layer 404 and portions of seed layer 402 and adhesive/barrier layer 401 that are not under metal layer 406, the bonding metal layer 406 at least forms one inductor device 408, multiple wire-bonding pads 410, and multiple contact pads 412 on passivation layer 160. The wire-bonding pads 410 are formed on pad 166a, while the contact pads 412 are formed on pad 166c, and the inductor device 408 is formed on passivation layer 160 and pads 166b. FIG. 17F is a cross section view of FIG. 17G across horizontal line 2-2. Multiple inductor devices 408 can also be formed on or over passivation layer 160, as shown in FIG. 17H, but in the drawing of FIG. 17F, only one inductor device 408 is shown.

Figure 17I:
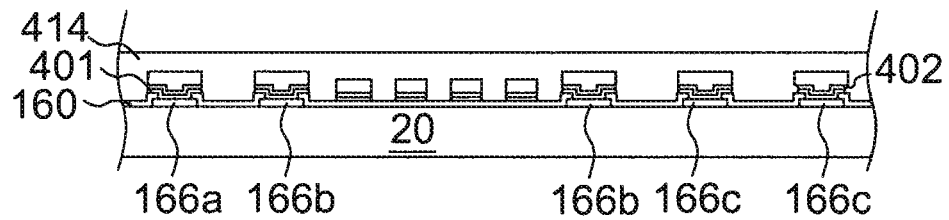
Figure 17J:
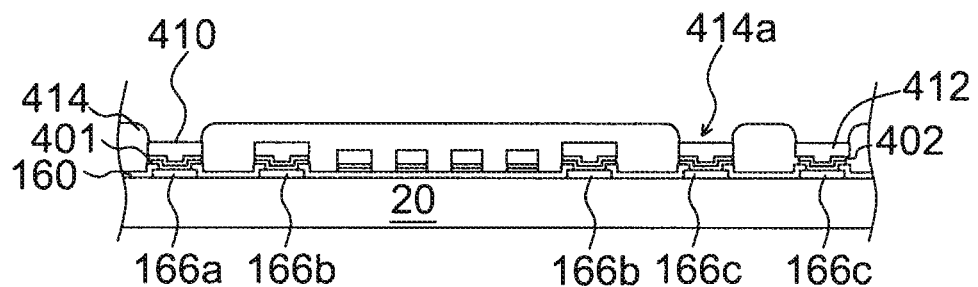

Referring to FIGS. 17I and 17J, a polymer layer 414 can be formed on multiple wire-bonding pads 410, on multiple contact pads 412, on the passivation layer 160 and on the inductor 408 by a process including a spin-on coating process, a lamination process, a screen-printing process or a spraying process, and multiple openings in the polymer layer 414 are over the pads 410 and 412 and expose the pads 410 and 412. The polymer layer 414 can have a thickness as desired, e.g., between about 3 and about 25 micrometers, and preferably between 5 and 15 micrometers, and the material of the polymer layer 414 may include benzocyclobutane (BCB), polyimide (PI), polybenzoxazole (PBO) or epoxy resin.

Referring to FIG. 17J, through spin coating, exposure and development, etching and $O_2$ plasma ash, polymer layer 414 can be formed and patterned with multiple openings 414a that reveal multiple wire-bonding pads 410, multiple contact pads, 412, and cover inductor device 408. Polymer layer 414 is then cured under a temperature between 150 and 380 degrees Celsius. The material of polymer layer 414 can be chosen from polyimide (PI), benzocyclobutene (BCB), polybenzoxazole (PBO), parylene, epoxy-based material, such as epoxy resins or photoepoxy SU-8 provided by Sotec Microsystems of Swiss Renens, or elastomers, such as silicone, or AL-2000 provided by Asahi Glass Co. If polymer layer 414 is made of polyimide, it is preferably an ester-type polyimide. The polymer layer 414 is preferably photosensitive, so that lithography can be used to pattern the polymer layer 414. Polymer layer 414 can have a desired thickness, e.g., between about 5 micrometers and about 50 micrometers, with an optimal preferred thickness between 10 micrometers and 20 micrometers. Alternatively, the polymer layer 414 may be a fluorine-containing polymer with a curing temperature between about 130 and about 200 degrees C. or preferably between 150 and 190 degrees C.

For some applications, the polymer layer 414 can be formed by spin-on coating a negative-type photosensitive polyimide layer having a thickness between 6 and 50 micrometers on the wire-bonding pads 410, on the contact pads 412, on the passivation layer 160 and on the inductor 408. The spin-on coated polyimide layer can then be backed, and then exposed. Exposing the baked polyimide layer can include using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm. The baked layer can then be illuminated. Illuminating the baked polyimide layer can include G-line and H-line, G-line and I-line, H-line and I-line, or G-line, H-line and I-line illumination. The exposed polyimide layer can then be developed to form multiple openings exposing the pads 410 and 412. The polyimide layer can then be cured or heated. Curing or heating the developed polyimide layer can occur at a temperature between about 130 and about 400° C. for a time between about 20 and about 150 minutes in a nitrogen ambient or in an oxygen-free ambient. The cured polyimide layer can have a thickness between about 3 and about 25 micrometers, for exemplary embodiments. Residual polymeric material or other contaminants can be removed from the pads 410 and 412, e.g., with an $O_2$ plasma or a plasma containing fluorine of below 200 PPM and oxygen.

The polymer layer 414 can be formed on the passivation layer 160 and on the inductor 408, and the openings 414a formed in the polymer layer 414 expose the pads 410 and 412. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient. Alternatively, the developed polyimide layer can be cured or heated at a temperature between 130 and 220° C. for a time between 20 and 150 minutes in a nitrogen ambient or in an oxygen-free ambient.

For other applications, the polymer layer 414 can be formed by spin-on coating a positive-type photosensitive polybenzoxazole layer having a thickness of between 3 and 25 micrometers on the wire-bonding pads 410, on the contact pads 412, on the passivation layer 160 and on the inductor 408. The spin-on coated polybenzoxazole layer can then be baked and exposed. Exposing the baked polybenzoxazole layer can include using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm. The baked layer can then be illuminated. Illuminating the baked polybenzoxazole layer can include G-line and H-line, G-line and I-line, H-line and I-line, or G-line, H-line and I-line illumination. The exposed polybenzoxazole layer can then be developed to form multiple openings exposing the pads 410 and 412. The developed polybenzoxazole layer can then be heated or cured. For example, heating or curing at a temperature between about 150 and about 250° C. can take place, and preferably the temperature used is between 180 and 250° C., or between 200 and 400° C., and preferably between 250 and 350° C., for a time between 5 and 180 minutes, and preferably between 30 and 120 minutes, in a nitrogen ambient or in an oxygen-free ambient. The cured polybenzoxazole layer can have a thickness of between 3 and 25 μm, in exemplary embodiments. Residual polymeric material or other contaminants can be removed from the pads 410 and 412, e.g., with an $O_2$ plasma or a plasma containing fluorine of below 200 PPM and oxygen. Consequently, the polymer layer 414 can be formed on the passivation layer 160 and on the inductor 408, and the openings 414a formed in the polymer layer 414 expose the pads 410 and 412.

Figure 17K:
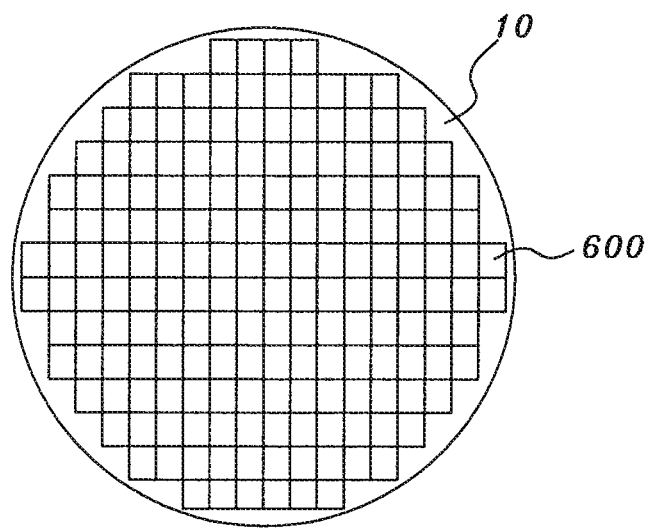
Figure 17L:
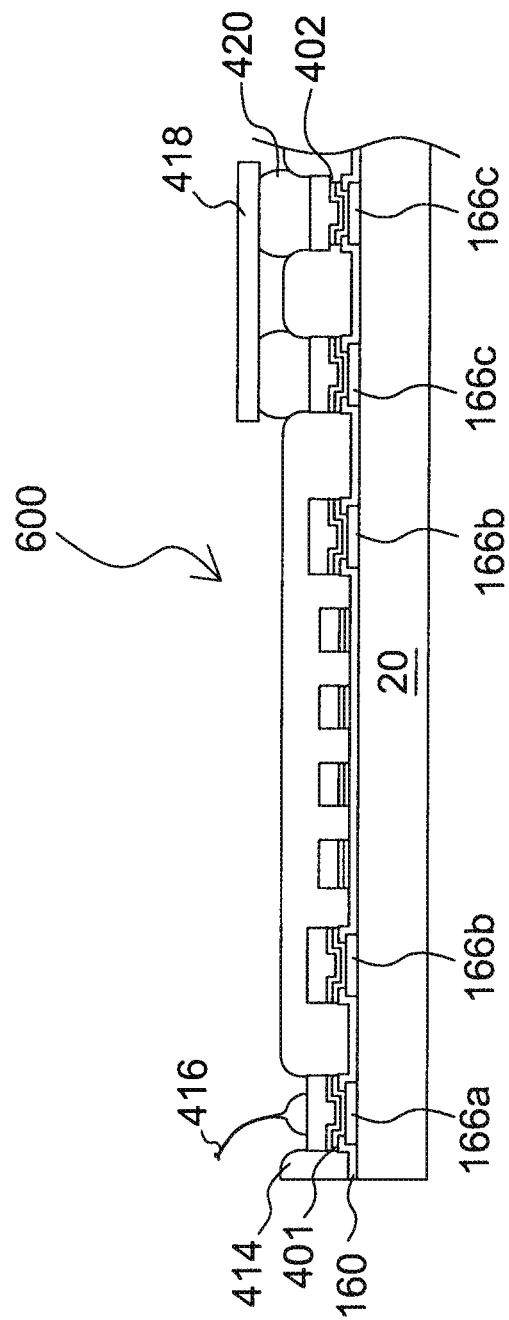

Referring to FIG. 17K and FIG. 17L, dicing procedures can be used to cut substrate 100, passivation layer 160, and polymer layer 414 into multiple semiconductor chips 600. The multiple wire-bonding pads 410 on semiconductor chips 600 can be connected to external circuits or power sources through a wire 416 formed by a wire-bonding process. The wire 416 can be formed of copper or gold. For example, a copper or gold wire can be connected to wire bonding pad 410 through wire-bonding techniques, where the wire bonding pad 410 is a copper pad, aluminum pad, aluminum cap or nickel cap. Contact pad 412 can then be connected to a capacitor device 418 with a solder layer 420, through surface mount technique (SMT), wherein the capacitor device 418 is connected to inductor device 408 through metal layers 140 in integrated circuit 20. Of course the dicing procedures can be performed after capacitor mounting.

Manufacturing Method and Structure 1 of Embodiment 8:

FIG. 18A-18M depict a manufacturing process of another on-chip regulator or converter with inductor and capacitor, in accordance with an eighth embodiment ("Embodiment 8") of the present disclosure. The inductor can be made by using a post-passivation embossing process and the capacitor can be attached by using surface mount technology.

Figure 18A:
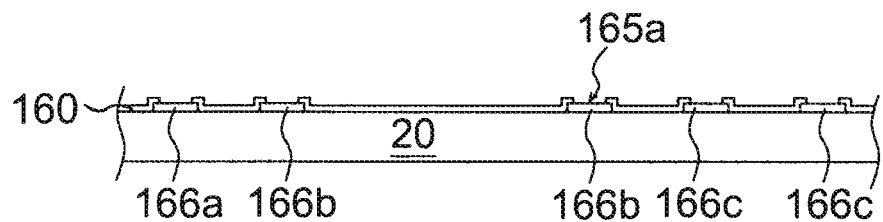
FIGS. 18A-18Q depict fabrication processes in accordance with an eighth embodiment of the present disclosure.

Referring to FIG. 18A, integrated circuit 20 represents all structures below passivation layer 160. Also included in integrated circuit 20 are substrate 100, devices 110, 112, 114, first dielectric layer 150, metal layers 140, second dielectric layer 155, metal contact 120, and via 130 (such as shown in FIG. 7A, for example). Multiple passivation layer openings 165a in passivation layer 160 reveal multiple pads 166a, 166b, and 166c.

Figure 18B:
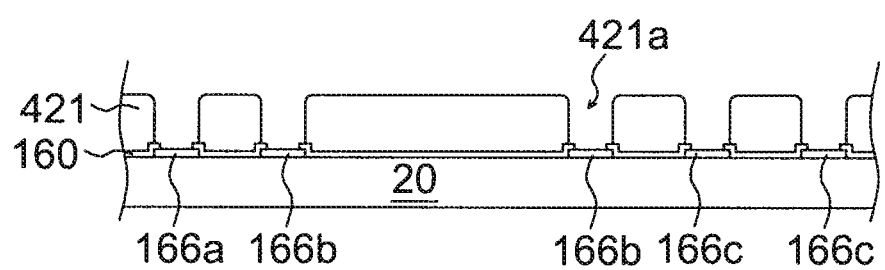

Referring to FIG. 18B, a polymer layer 421 can be formed on the passivation layer 160 and the pads 166a, 166b and 166c. Through spin coating, exposure and development, etching and $O_2$ plasma ash, polymer layer 421 can be formed and patterned with multiple openings 421a that reveal multiple pads 166a, 166b, and 166c. Polymer layer 421 can then be cured under a temperature, e.g., of between about 150 and about 380 degrees Celsius. The material of polymer layer 421 can be chosen from polyimide (PI), benzocyclobutene (BCB), polybenzoxazole (PBO), parylene, epoxy-based material, such as epoxy resins or photoepoxy SU-8 provided by Sotec Microsystems of Swiss Renens, or elastomers, such as silicone, or AL-2000 provided by Asahi Glass Co. If polymer layer 421 is made of polyimide, it is preferably ester-type polyimide. The polymer layer 421 is preferably photosensitive, which allows lithography to be used to pattern the polymer layer 421. Polymer layer 421 can have a desired thickness, e.g., between about 5 micrometers and about 50 micrometers, with an optimal preferred thickness being between 10 micrometers and 25 micrometers. Alternatively, the polymer layer 421 may be a fluorine-containing polymer with a curing temperature between about 130 and about 200 degrees C. and preferably between 150 and 190 degrees C.

For some applications, the polymer layer 421 can be formed by spin-on coating a negative-type photosensitive polyimide layer having a thickness between 6 and 50 micrometers on the passivation layer 160 and on the pads 166a, 166b and 166c. The spin-on coated polyimide layer can be baked and then exposed. Exposing the baked polyimide layer can include using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm. The baked polyimide layer can be illuminated. Illuminating the baked polyimide layer can include using G-line and H-line, G-line and I-line, H-line and I-line, or G-line, H-line and I-line illumination. The exposed polyimide layer can then be developed to form multiple openings exposing the pads 166a, 166b and 166c. Curing or heating can then take place. Curing or heating the developed polyimide layer can include using a temperature between about 130 and about 400° C. for a time between about 20 and about 150 minutes in a nitrogen ambient or in an oxygen-free ambient. In exemplary embodiments, the cured polyimide layer has a thickness between 3 and 25 micrometers. The residual polymeric material or other contaminants can be removed from the pads 166a, 166b and 166c, e.g., with an $O_2$ plasma or a plasma containing fluorine of below 200 PPM and oxygen. Accordingly, the polymer layer 421 can be formed on the passivation layer 160, and the openings 421a formed in the polymer layer 421 expose the pads 166a, 166b and 166c.

For an example of a curing process for Embodiment 8, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient. Alternatively, the developed polyimide layer can be cured or heated at a temperature between 130 and 220° C. for a time between 20 and 150 minutes in a nitrogen ambient or in an oxygen-free ambient.

For other applications, the polymer layer 421 can be formed by spin-on coating a positive-type photosensitive polybenzoxazole layer having a thickness of between about 3 and about 25 micrometers on the passivation layer 160 and on the pads 166a, 166b and 166c. The spin-on coated polybenzoxazole layer can then be baked. Baking the spin-on coated polybenzoxazole layer can then be exposed. Exposing the baked polybenzoxazole layer can include using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm. The baked layer can then be illuminated. Illuminating the baked polybenzoxazole layer can include using G-line and H-line, G-line and I-line, H-line and I-line, or G-line, H-line and I-line illumination, e.g., from a mercury lamp. The exposed polybenzoxazole layer can then be developed to form multiple openings exposing the pads 166a, 166b and 166c. Curing can then take place. Curing or heating the developed polybenzoxazole layer can include heating to a temperature between about 150 and about 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient. The cured polybenzoxazole layer preferably has a thickness between about 3 and about 25 µm. The residual polymeric material or other contaminants can then be removed from the pads 166a, 166b and 166c, e.g., with an $O_2$ plasma or a plasma containing fluorine of below 200 PPM and oxygen. By this process, the polymer layer 421 can be formed on the passivation layer 160, and the openings 421a formed in the polymer layer 421 expose the pads 166a, 166b and 166c.

Figure 18C:
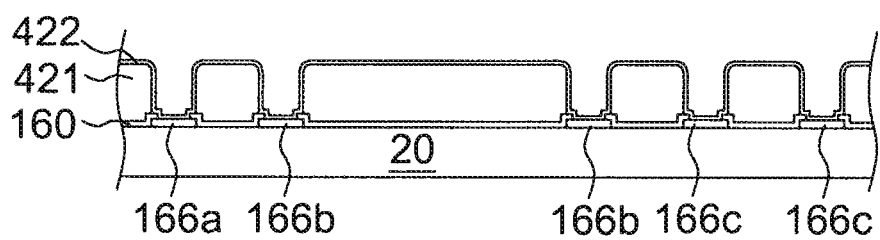

Referring to FIG. 18C, an adhesion/barrier layer 422 can be formed by sputtering on the polymer layer 421 and on the pads 166a, 166b, and 166c. The adhesion/barrier layer 422 can have a thickness between 0.1 micrometers and 1 micrometer, with an optimal, preferred thickness being between 0.3 micrometers and 0.8 micrometers. The material of the adhesion/barrier layer 422 can be titanium, a titanium-tungsten alloy, titanium nitride, chromium, tantalum, tantalum nitride or a composite of the above-mentioned materials. The material of the adhesion/barrier 422 is preferably TiW or Ti or Ti/TiW.

Figure 18D:
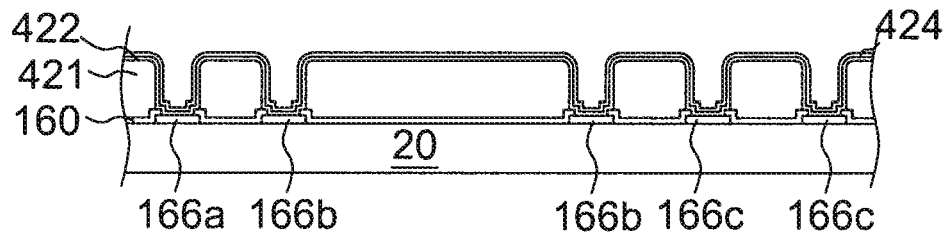

Referring to FIG. 18D, a seed layer 424, e.g., with a thickness between 0.05 micrometers and 1 micrometer (with a preferred thickness being between 0.08 micrometers and 0.7 micrometers), is formed next on the adhesion/barrier layer 422 by sputtering. In this embodiment, the seed layer 424 is preferably made of gold. As has been described above, however, the material of the seed layer 424 can vary (or be selected) according to the material of metal layers formed afterwards.

Figure 18E:
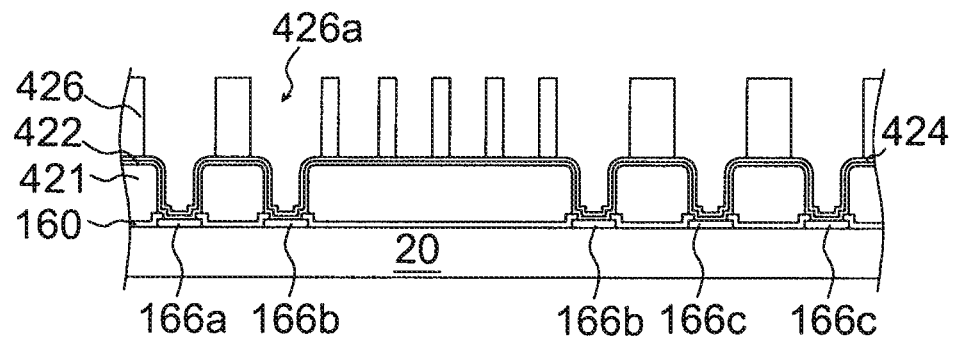

Referring to FIG. 18E, photoresist layer 426 can be formed on seed layer 424, and through spin coating, exposure and development, photoresist layer 426 is patterned, forming multiple photoresist layer openings 426a in photoresist layer 426, which separately reveal portions of seed layer 424 that are over pad 166a, 166b, and 166c.

Figure 18F:
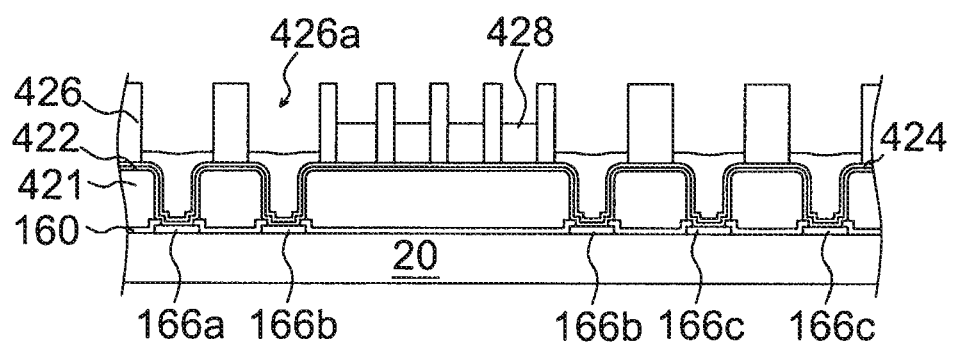

Referring to FIG. 18F, bonding metal layer 428 can be formed by an electroplating, electroless plating, sputtering or CVD method on seed layer 424, which is in photoresist layer openings 426a. The bonding metal layer 428 can consist of materials such as aluminum, gold, copper, silver, palladium, rhodium, ruthenium, rhenium, and/or nickel, and may have a single metal layer structure or multiple metal layer structure. The thickness of bonding metal layer 428 can be, for example, between about 1 micrometer and about 100 micrometers, with optimal, preferred thickness being between about 1.5 micrometers and about 15 micrometers. Layer 428 may be made of combinations of multiple metal layers forming a multi-layered structure of Cu/Ni/Au, Cu/Au, Cu/Ni/Pd, and Cu/Ni/Pt, etc. In this embodiment, bonding metal layer 428 is preferably a single layer of gold.

Figure 18G:
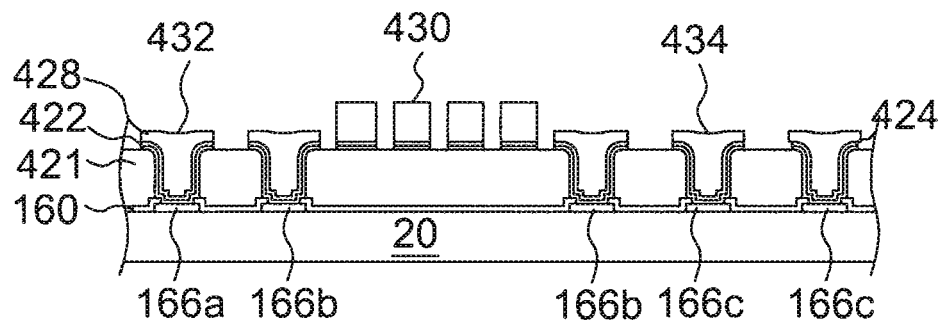

Referring to FIG. 18G, a removal process can be applied to remove patterned photoresist layer 426 and portions of seed layer 424 and adhesive/barrier layer 422 that are not below metal layer 428. Seed layer 424, when made of gold, can be removed by using solvents containing KI plus $I_2$ solution, while adhesive/barrier layer 422 can be removed by using solvents containing hydrogen peroxide ($H_2O_2$) if the material of layer 422 includes TiW.

Figure 18H:
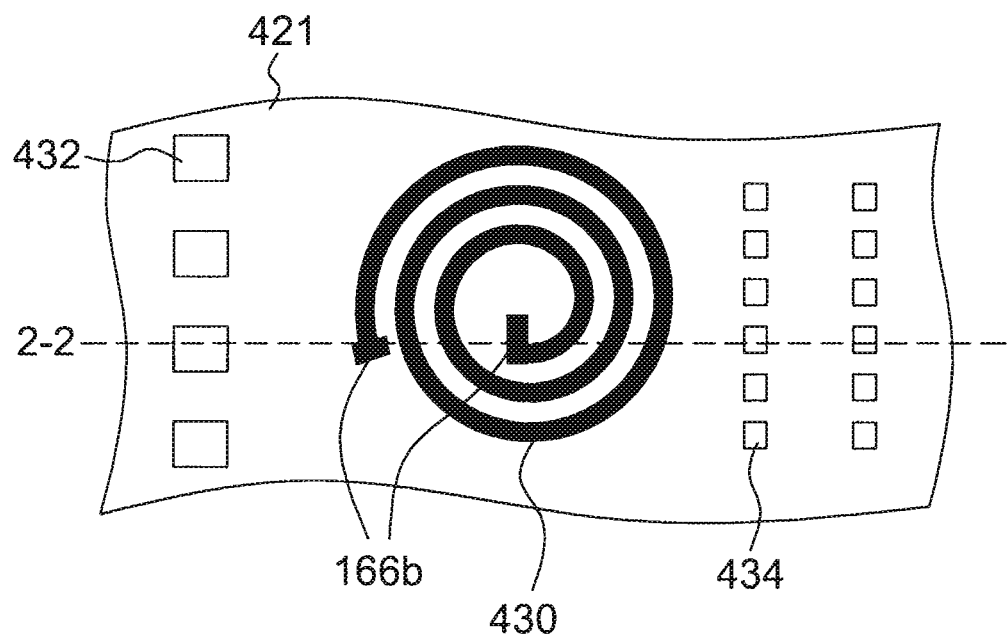
Figure 18I:
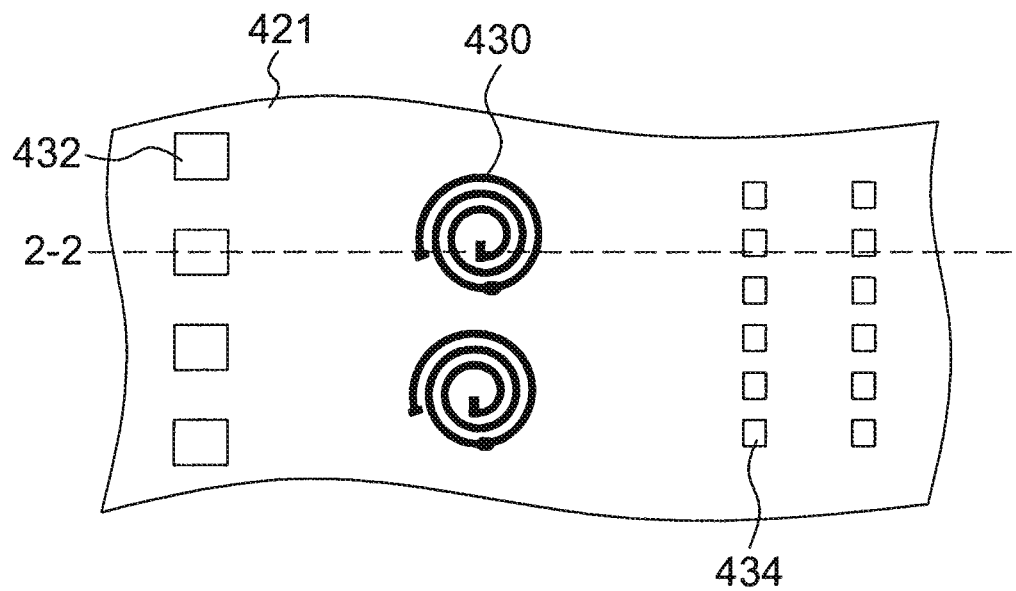

Referring to FIG. 18H, after removing patterned photoresist layer 426 and portions of seed layer 424 and adhesive/barrier layer 422 that are not under metal layer 428, the bonding metal layer 428 can form one or more inductor devices 430 (only one is shown), multiple wire-bonding pads 432, and multiple contact pads 434 on polymer layer 421. The wire-bonding pads 432 are formed on pad 166a, while the contact pads 434 are formed on pad 166c, and the inductor device 430 is formed on or over passivation layer 160 and pads 166b. FIG. 18G is a cross section view of FIG. 18H in the direction of cutting plane indicated by line 2-2. Multiple inductor devices 430 can also be formed on polymer 421, as shown in FIG. 18I.

Figure 18J:
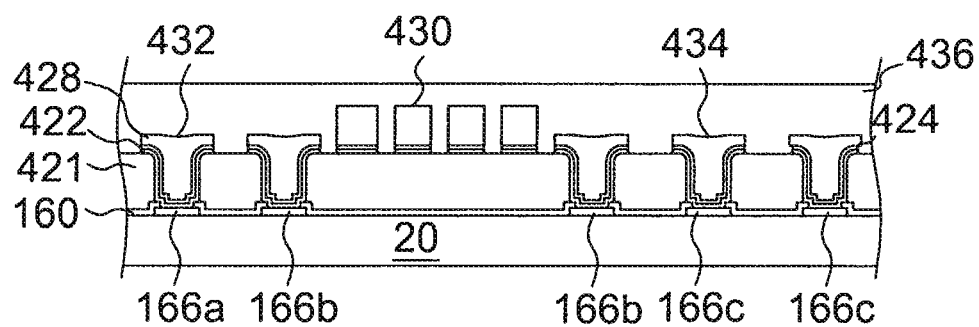

Referring to FIG. 18J, a polymer layer 436 can be formed by using spin coating on the inductor device 430, multiple wire-bonding pads 432, multiple contact pads 434, and the polymer layer 421.

Figure 18K:
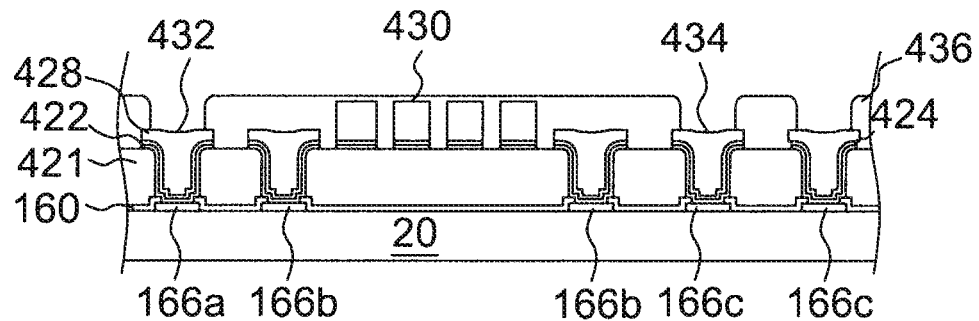

Referring to FIG. 18K, through exposure and development, etching, and $O_2$ plasma ash, polymer layer 436 can form multiple openings 436a that reveal multiple wire-bonding pads 432, multiple contact pads 434, and conceal inductor device 430. Polymer layer 436 can then be cured under a temperature between 150 and 380 degrees Celsius. The material of polymer layer 436 can be chosen, e.g., from polyimide (PI), benzocyclobutene (BCB), polybenzoxazole (PBO), parylene, epoxy-based material, such as epoxy resins or photoepoxy SU-8 provided by Sotec Microsystems of Swiss Renens, or elastomers, such as silicone, or AL-2000 provided by Asahi Glass Co. If polymer layer 436 is made of polyimide, it is preferably ester-type polyimide. The polymer layer 436 is preferably photosensitive, which can allow lithography to be used to pattern the polymer layer 436. Polymer layer 436 can have a thickness between about 5 micrometers and about 50 micrometers, in exemplary embodiments. An optimal thickness is between 10 micrometers and 20 micrometers. The polymer layer 436 may be a fluorine-containing polymer with a curing temperature between about 130 and about 200 degrees C. or preferably between 150 and 190 degrees C.

For some applications, the polymer layer 436 can be formed by spin-on coating a negative-type photosensitive polyimide layer having a thickness between 6 and 50 micrometers on the metal layer 428, on the inductor 430 and on the polymer layer 421. The coated polyimide layer can then be baked. The spin-on coated polyimide layer can then be exposed. Exposing the baked polyimide layer can include using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm. The polyimide layer can then be illuminated. Illuminating the baked polyimide layer can include using G-line and H-line, G-line and I-line, H-line and I-line, or G-line, H-line and I-line illumination, e.g., from a mercury lamp source. The baked polyimide layer can then be developed and then exposed to form multiple openings exposing the pads 432 and 434. Curing can then take place. Curing or heating the developed polyimide layer can be performed at a temperature, e.g., between about 130 and about 400° C. for a time between 20 and 150 minutes in a nitrogen ambient or in an oxygen-free ambient, The cured polyimide layer can have a thickness between about 3 and about 25 micrometers, in exemplary embodiments. The residual polymeric material or other contaminants can be removed from the pads 432 and 434, e.g., with an $O_2$ plasma or a plasma containing fluorine of below about 200 PPM and oxygen. Accordingly, the polymer layer 436 can be formed on the metal layer 428, on the inductor 430 and on the polymer layer 421, and the openings 436a formed in the polymer layer 436 expose the pads 432 and 434.

For an example of a suitable curing process, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient. Alternatively, the developed polyimide layer can be cured or heated at a temperature between 130 and 220° C. for a time between 20 and 150 minutes in a nitrogen ambient or in an oxygen-free ambient.

For other applications, the polymer layer 436 can be formed by spin-on coating a positive-type photosensitive polybenzoxazole layer having a thickness of between 3 and 25 micrometers on the metal layer 428, on the inductor 430 and on the polymer layer 421. Then the spin-on coated polybenzoxazole layer can be baked and exposed. Exposing the baked polybenzoxazole layer can include using a 1x stepper or a 1x contact aligner with at least two of G-line having a wavelength ranging from 434 to 438 nm, H-line having a wavelength ranging from 403 to 407 nm, and I-line having a wavelength ranging from 363 to 367 nm. The baked layer polybenzoxazole layer can be illuminated. Illuminating the baked polybenzoxazole layer can include using G-line and H-line, G-line and I-line, H-line and I-line, or G-line, H-line and I-line illumination. The exposed polybenzoxazole layer can be developed to form multiple openings exposing the pads 432 and 434. A curing step/process can then be applied to the developed polybenzoxazole. Curing or heating the developed polybenzoxazole layer can include using a temperature between about 150 and about 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient. The cured polybenzoxazole layer can have a thickness of between about 3 and about 25 μm, for exemplary embodiments. The residual polymeric material or other contaminants can then be removed from the pads 432 and 434, e.g., with an O$_2$ plasma or a plasma containing fluorine of below 200 PPM and oxygen. By such a process, the polymer layer 436 can be formed on the metal layer 428, on the inductor 430 and on the polymer layer 421, and the openings 436a formed in the polymer layer 436 expose the pads 432 and 434.

Figure 18L:
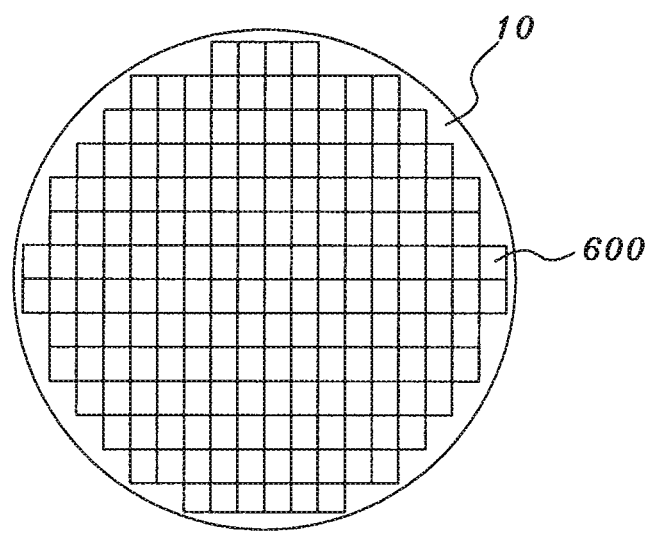
Figure 18M:
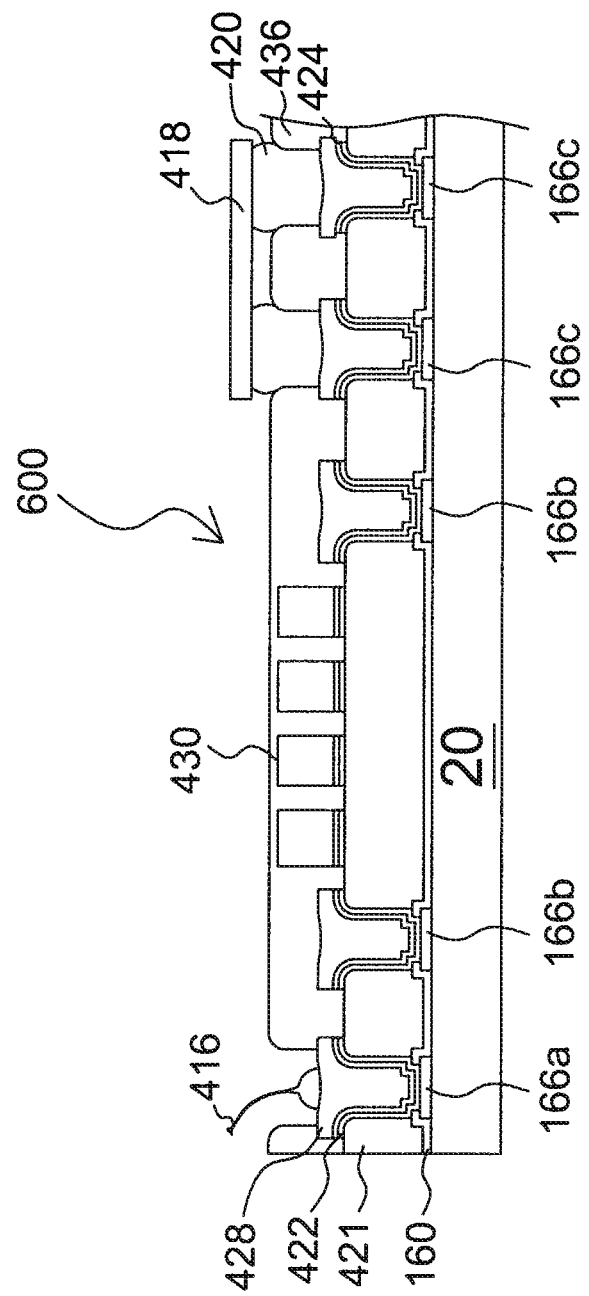

Referring to FIG. 18L-18M, a dicing procedure can be used to cut substrate 100, passivation layer 160, polymer layer 421, and polymer layer 436 into multiple semiconductor chips 600. The multiple wire-bonding pads 432 on semiconductor chips 600 can be connected to external circuits or power sources through a wire 416 formed by a wire-bonding process. The wire 416 can be formed of copper or gold. For example, a copper or gold wire can be connected to wire-bonding pad 432 through wire-bonding techniques, where the wire-bonding pad 432 is a copper pad, aluminum pad, aluminum cap or nickel cap. Contact pad 434 can then be connected to a capacitor device 418 with a solder layer 420, through surface mount technique (SMT), wherein the capacitor device 418 is connected to inductor device 430 through metal layers 140 in integrated circuit 20. Of course the dicing procedures may be performed after capacitor mounting.

Figure 18N:
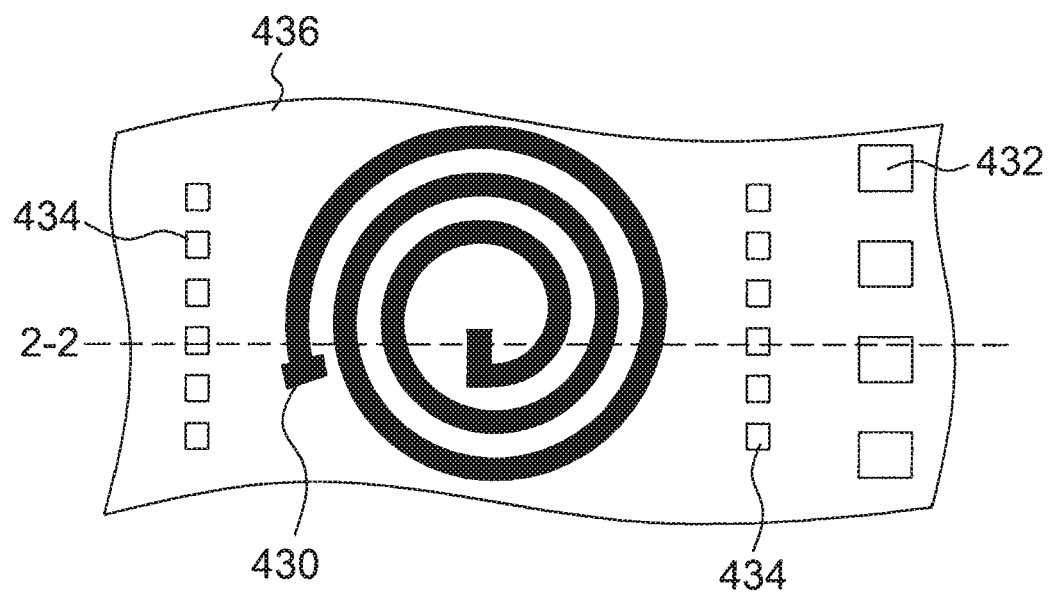
Figure 18O:
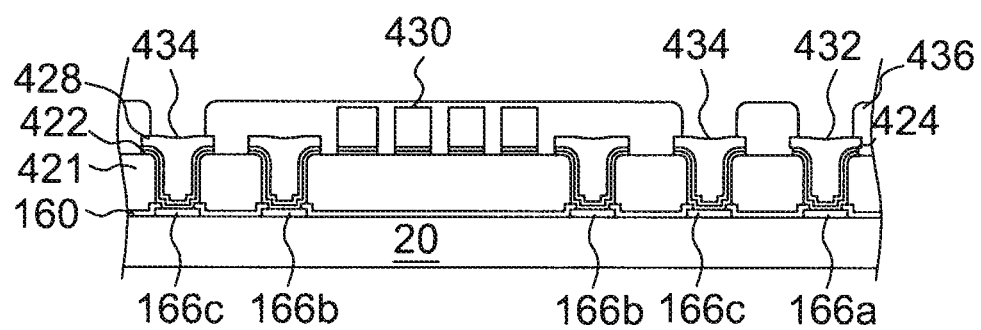

Manufacturing Method and Structure 2 of Embodiment 8:

With continued reference to FIG. 18K, and also referring to FIGS. 18N-18O, the inductor 430 and the pads 166b can be disposed between the contact pads 434 and the pads 166c.

Figure 18P:
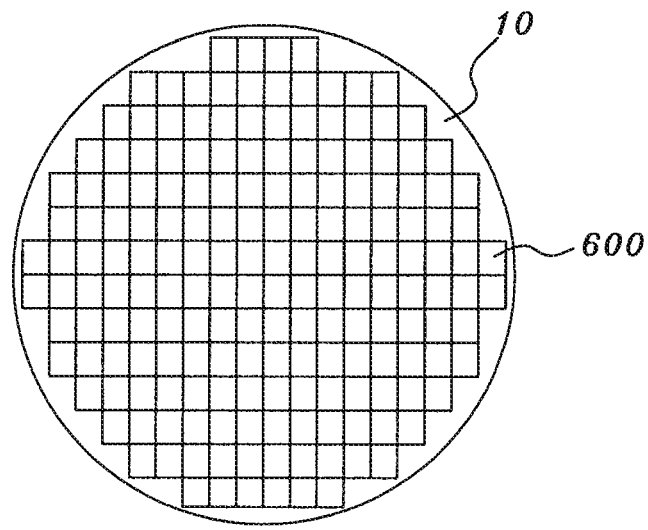
Figure 18Q:
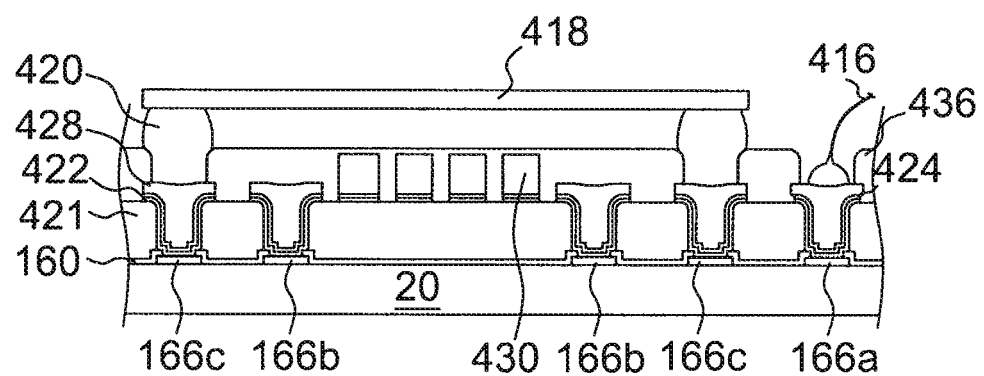

Referring to FIG. 18P and FIG. 18Q, dicing procedures can be used to cut substrate 100, passivation layer 160, polymer layer 421, and polymer layer 436 into multiple semiconductor chips 600. The multiple wire-bonding pads 432 on semiconductor chips 600 can be connected to external circuits or power sources through a wire 416 formed by a wire-bonding process. The wire 416 can be formed of copper or gold. For example, a copper or gold wire can be connected to wire-bonding pad 432 through wire-bonding techniques, where the wire-bonding pad 432 is a copper pad, aluminum pad, aluminum cap or nickel cap. Contact pad 434 can then be connected to a capacitor device 418 with a solder layer 420, through surface mount technique (SMT), wherein the capacitor device 418 is connected to inductor device 430 through metal layer 428 or metal layers 140 in integrated circuit 20. Of course the dicing procedures may be performed after capacitor mounting.

Embodiment 9

Figure 19A:
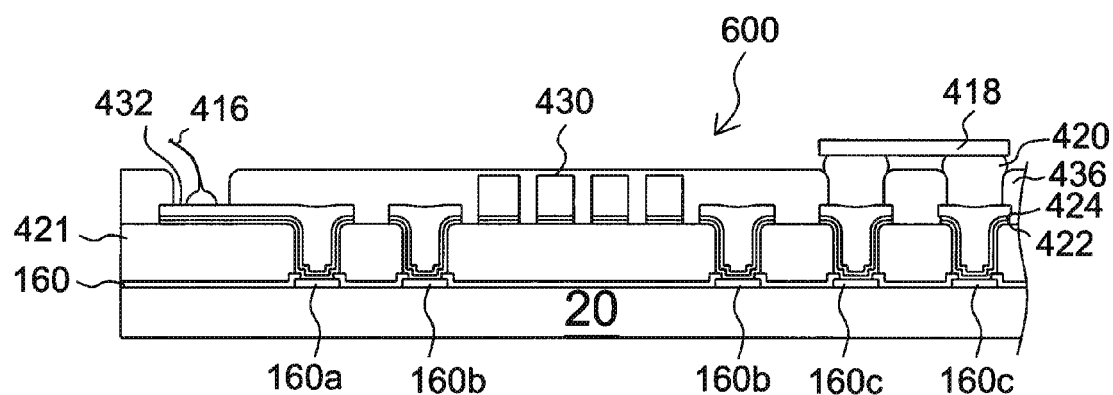
FIGS. 19A-19B depict side and top views of fabrication processes in accordance with a ninth embodiment of the present disclosure.
Figure 19B:
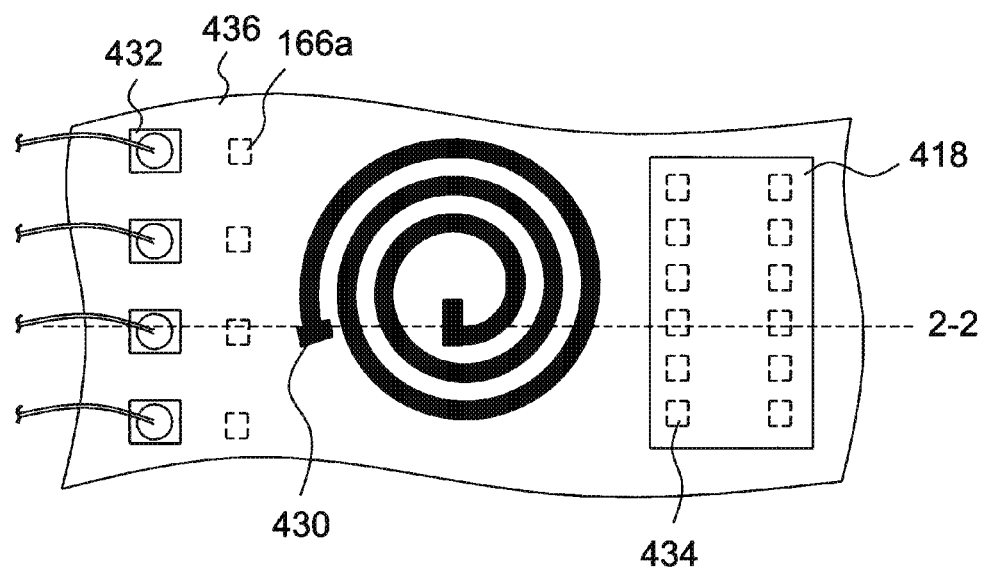

Referring to FIGS. 19A-19B, a ninth embodiment ("Embodiment 9") is shown, which is similar to Embodiment 8, with a chief difference being the location of wire-bonding pad 432 and pad 166a. In Embodiment 8, wire-bonding pad 432 is shown directly above pad 166a, but in this embodiment ("Embodiment 9"), wire-bonding pad 432 is not directly above pad 166a. Therefore, the location of wire-bonding pad 432 can be adjusted according to requirement and not limited to the area directly above pad 166a.

Embodiment 10

Figure 20A:
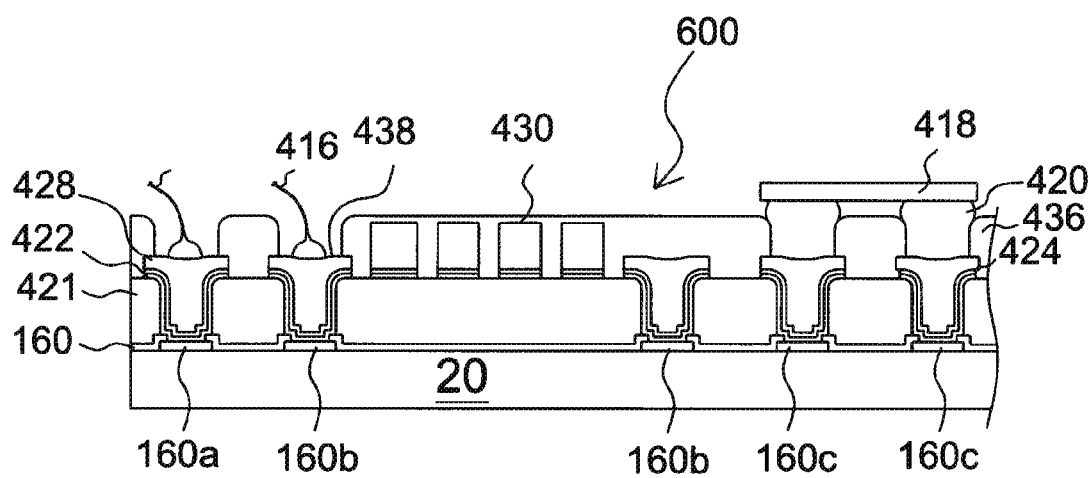
FIGS. 20A-20B depict side and top views, respectively, of a structure in accordance with a tenth embodiment of the present disclosure.
Figure 20B:
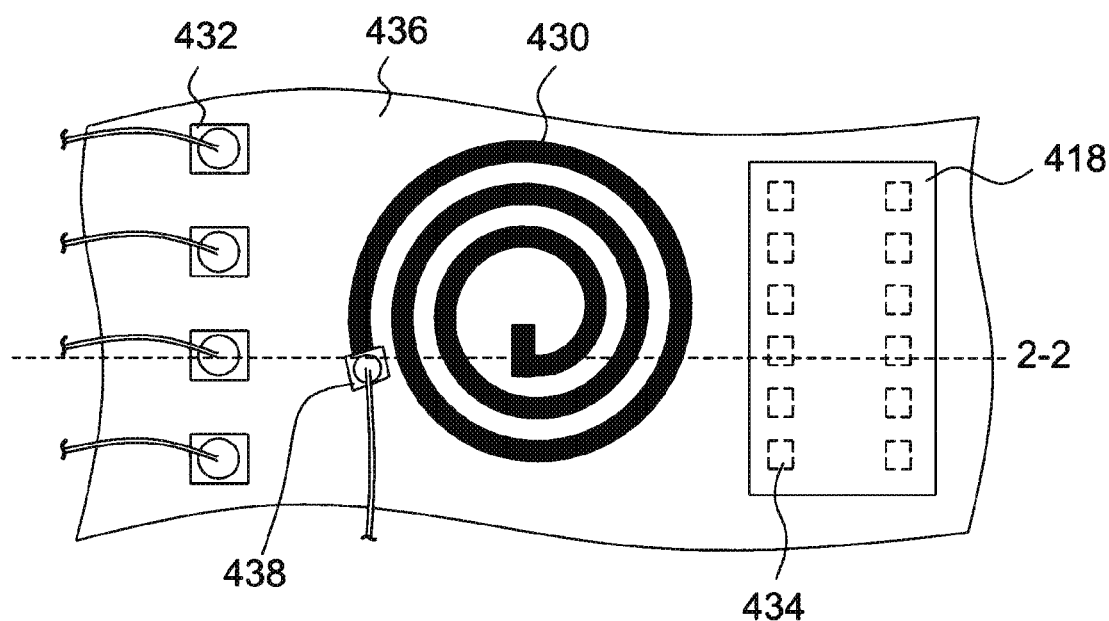

Referring to FIGS. 20A-20B, a tenth embodiment ("Embodiment 10") is shown. This embodiment is similar to Embodiment 8, with the difference being a connecting pad 438 of inductor devices revealed by multiple openings 436a in polymer layer 436. Connecting pad 438 can be connected to external circuits or power sources using a wire 416 made by a wire-bonding process.

Embodiment 11

Referring to FIG. 21A-21K, an eleventh embodiment ("Embodiment 11") is depicted. In the figures, integrated circuit 20 represents all structures below passivation layer 160. Also included in integrated circuit 20 are substrate 100, devices 110, 112, 114, first dielectric layer 150, metal layers 140, second dielectric layer 155, metal contact 120, and metal via 130 (such as shown in FIG. 7A, for example), wherein multiple passivation layer openings 165a in passivation layer 160 reveal multiple pads 166a, 166b, and 166c (pad 166a is not shown).

Figure 21A:
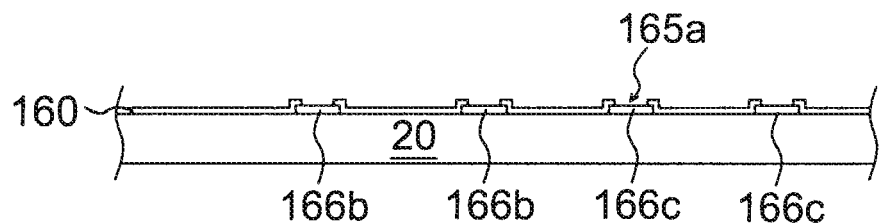
FIGS. 21A-21K depict fabrication processes in accordance with an eleventh embodiment of the present disclosure.
Figure 21B:
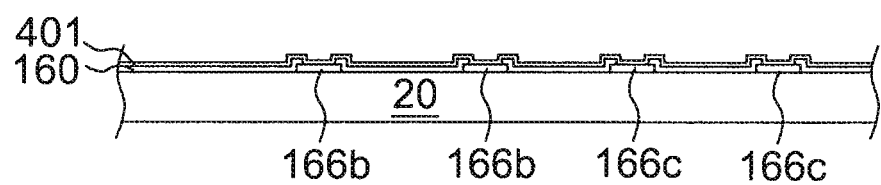

Referring to FIG. 21B, an adhesion/barrier layer 401 is formed by sputtering on passivation layer 160 and contact pads 166a, 166b, and 166c. The thickness of the adhesion/barrier layer 401 is between 0.1 micrometers and 1 micrometer, with an optimal thickness between 0.3 micrometers and 0.8 micrometers. The material of adhesion/barrier 401 is preferred to be a TiW or Ti or Ti/TiW.

Figure 21C:
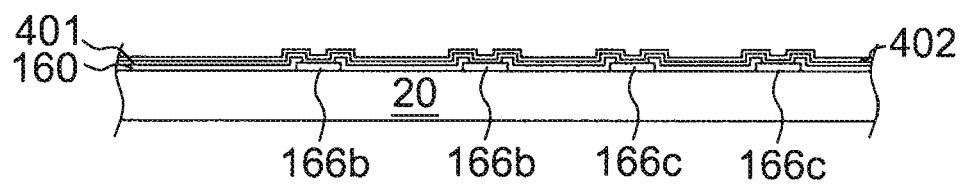

Referring to FIG. 21C, a seed layer 402 with a thickness between about 0.05 micrometers and about 1 micrometers (with an optimal, preferred thickness of between 0.08 micrometers and 0.7 micrometers) can be formed next on adhesion/barrier layer 401 by sputtering. In this embodiment, the seed layer 402 is preferably made of gold, however, the material of seed layer 402 can vary according to the material of metal layers formed afterwards.

Figure 21D:
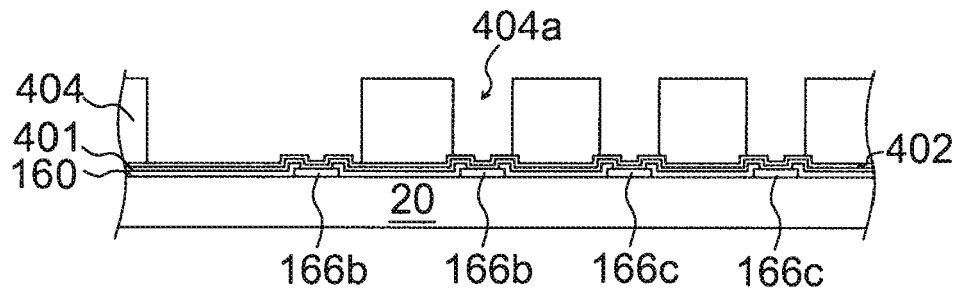

Referring to FIG. 21D, photoresist layer 404 can be formed on seed layer 402, through spin coating, exposure and development, photoresist layer 404 is patterned, forming multiple photoresist layer openings 404a in photoresist layer 404, which separately reveal portions of seed layer 402 that are over pad 166a, 166b, and 166c.

Figure 21E:
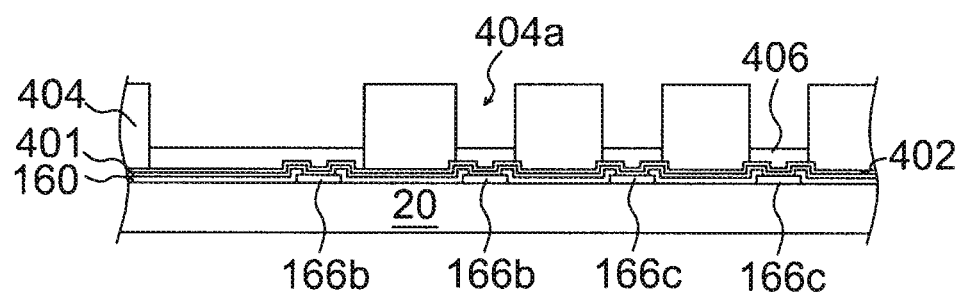

Referring to FIG. 21E, bonding metal layer 406 can be formed, e.g., by an electroplating, electroless plating, sputtering or CVD method, on seed layer 402, which is in photoresist layer openings 404a. The bonding metal layer 406 can consist of materials such as aluminum, gold, copper, silver, palladium, rhodium, ruthenium, rhenium, or nickel, and may have a single metal layer structure or multiple metal layer structure. The thickness of bonding metal layer 406 is preferably between about 1 micrometer and about 100 micrometers, with optimal, preferred thickness of between 1.5 micrometers and 15 micrometers. Layer 406 may be combinations of multiple metal layers forming a multi-layered structure including, for example, Cu/Ni/Au, Cu/Au, Cu/Ni/Pd, and/or Cu/Ni/Pt. In this embodiment, bonding metal layer 406 is preferably a single layer made of gold.

Figure 21F:
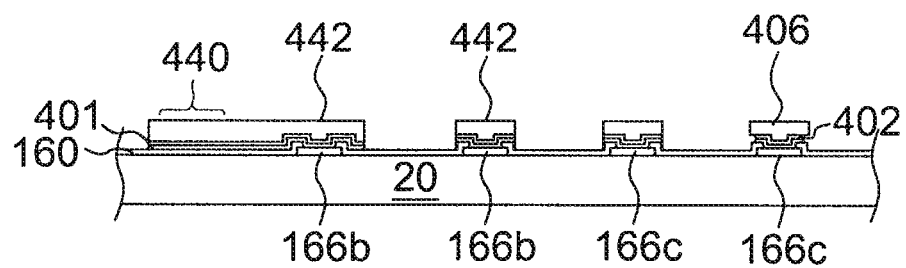

Referring to FIG. 21F, a removal process/step can be applied to remove patterned photoresist layer 404 and portions of seed layer 402 and adhesive/barrier layer 401 that are not below metal layer 406. Seed layer 402 portions that are made of gold can be removed by using solvents containing $I_2$, while adhesive/barrier layer 401 can be removed by using solvents containing hydrogen peroxide ($H_2O_2$) if the material of layer 401 is TiW. After removing patterned photoresist layer 404 and portions of seed layer 402 and adhesion/barrier layer 401 that are not under bonding metal layer 406, the bonding metal layer 406 can form multiple wire-bonding pads 440 and multiple contact pads 442. Wire-bonding pad 440 and a contact pad 442 can be connected through bonding metal layer 406.

Figure 21G:
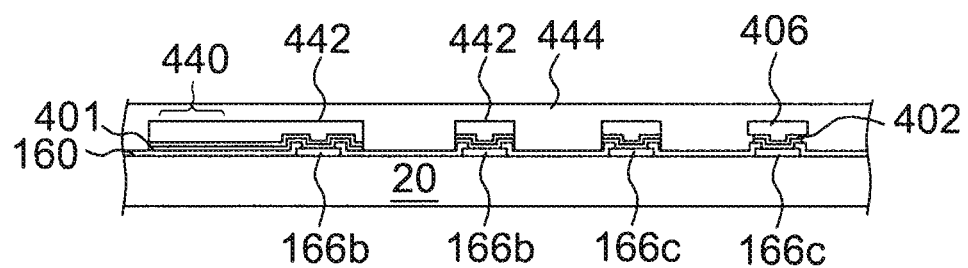

Referring to FIG. 21G, a polymer layer 444 can be formed, e.g., by using spin coating, on multiple wire-bonding pads 440, multiple contact pads 442, and passivation layer 160.

Figure 21H:
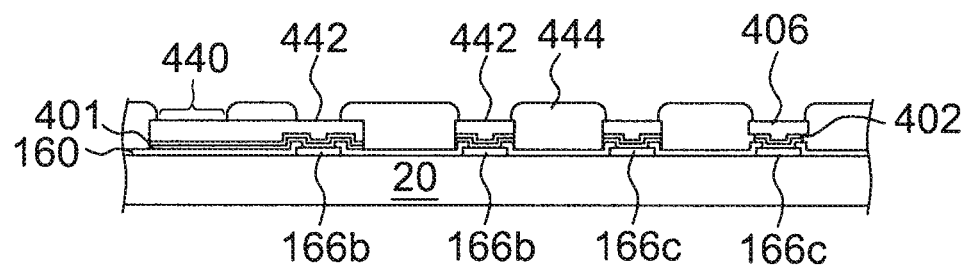

Referring to FIG. 21H, through exposure and development, and $O_2$ plasma ash, polymer layer 444 can be patterned with multiple openings 444a that reveal multiple wire-bonding pads 440 and multiple contact pads 442. The polymer layer 444 can then be cured under a temperature between, for example, about 150 and about 380 degrees Celsius. The material of polymer layer 444 can be chosen from polyimide (PI), benzocyclobutene (BCB), polybenzoxazole (PBO), parylene, epoxy-based material, such as epoxy resins or photoepoxy SU-8 provided by Sotec Microsystems of Swiss Renens, or elastomers, such as silicone, or AL-2000 provided by Asahi Glass Co. If polymer layer 444 is made of polyimide, it preferably an ester-type polyimide. The polymer layer 444 is preferably photosensitive to then allow lithography to be used to pattern the polymer layer 444 (then an etching process will be unnecessary). Polymer layer 444 has a thickness between 5 micrometers and 50 micrometers, in exemplary embodiment, with an optimal, preferred thickness being between 10 micrometers and 25 micrometers. The polymer layer 444 may be a fluorine-containing polymer with a curing temperature between 130 and 200 degrees C. or between 150 and 190 degrees C.

For some applications, the polymer layer 444 can be formed by spin-on coating a negative-type photosensitive polyimide layer having a thickness between 6 and 50 micrometers on the passivation layer 160 and on the metal layer 406. The polyimide layer can then be baked and then exposed. Exposing the baked polyimide layer can include using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm. The layer can then be illuminated. Illuminating the baked polyimide layer can include utilizing, e.g., from a mercury lamp, G-line and H-line, G-line and I-line, H-line and I-line, or G-line, H-line and I-line illumination. The exposed polyimide layer can then be developed to form multiple openings exposing the pads 440 and 442. A curing process can then be performed. Curing or heating the developed polyimide layer can occur at a temperature between about 130 and about 400° C. for a time between about 20 and about 150 minutes in a nitrogen ambient or in an oxygen-free ambient. In exemplary embodiments, the cured polyimide layer can have a thickness between 3 and 25 micrometers. The residual polymeric material or other contaminants can then be removed from the pads 440 and 442, e.g., with an $O_2$ plasma or a plasma containing fluorine of below about 200 PPM and oxygen. By such a process, the polymer layer 444 can be formed on the passivation layer 160 and on the metal layer 406, and the openings 444a formed in the polymer layer 444 expose the pads 440 and 442.

Examples of suitable curing processes can include curing or heating the developed polyimide layer at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient. Alternatively, the developed polyimide layer can be cured or heated at a temperature between 130 and 220° C. for a time between 20 and 150 minutes in a nitrogen ambient or in an oxygen-free ambient.

In other applications, the polymer layer 444 can be formed by spin-on coating a positive-type photosensitive polybenzoxazole layer having a thickness of between about 3 and about 25 micrometers on the passivation layer 160 and on the metal layer 406. The spin-on coated polybenzoxazole layer can then be baked and exposed. Exposing the baked polybenzoxazole layer can include using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm. The baked layer can be illuminated. Illuminating the baked polybenzoxazole layer can include G-line and H-line, G-line and I-line, H-line and I-line, or G-line, H-line and I-line illumination, e.g., using a mercury lamp source. Other radiation sources can of course be used for this and other embodiments of the present disclosure. The exposed polybenzoxazole layer can then be developed to form multiple openings exposing the pads 440 and 442. A curing process can then be applied. Curing or heating the developed polybenzoxazole layer can be performed at a temperature between about 150 and about 250° C., and preferably between 180 and 250° C., or between 200 and 400° C., and preferably between 250 and 350° C., for a time between about 5 and about 180 minutes, and preferably between 30 and 120 minutes, in a nitrogen ambient or in an oxygen-free ambient. In exemplary embodiments, the cured polybenzoxazole layer can have a thickness of between about 3 and about 25 μm. The residual polymeric material or other contaminants can then be removed from the pads 440 and 442, e.g., with an $O_2$ plasma or a plasma containing fluorine of below about 200 PPM and oxygen. By such a process, the polymer layer 444 can be formed on the passivation layer 160 and on the metal layer 406, and the openings 444a formed in the polymer layer 444 expose the pads 440 and 442.

Figure 21I:
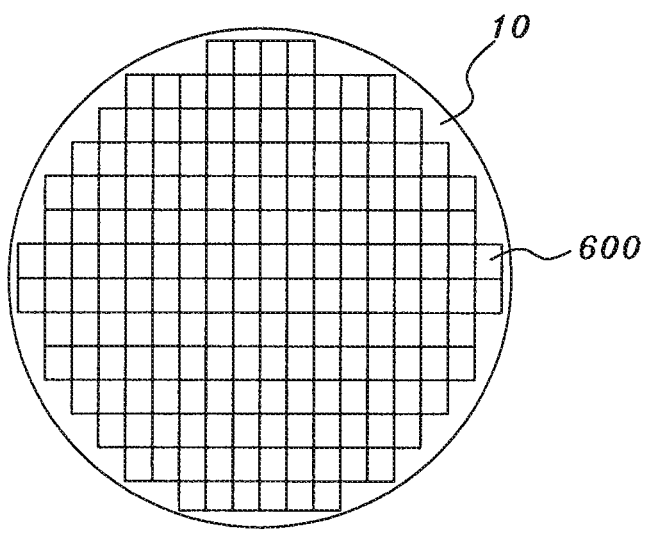
Figure 21J:
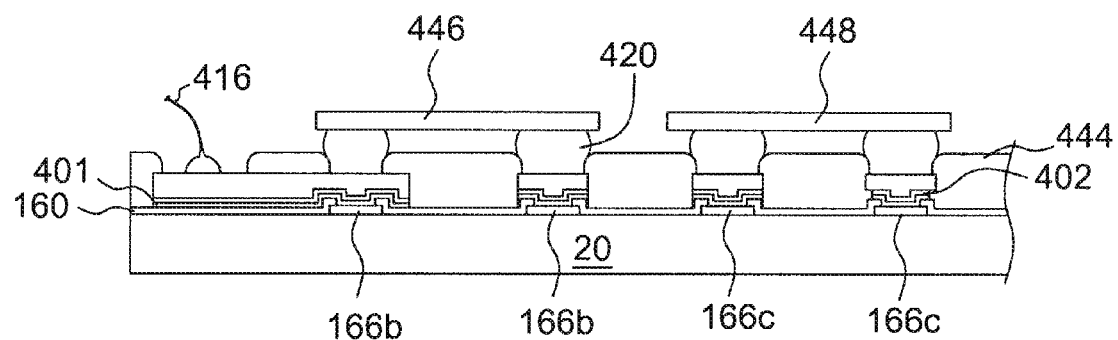
Figure 21K:
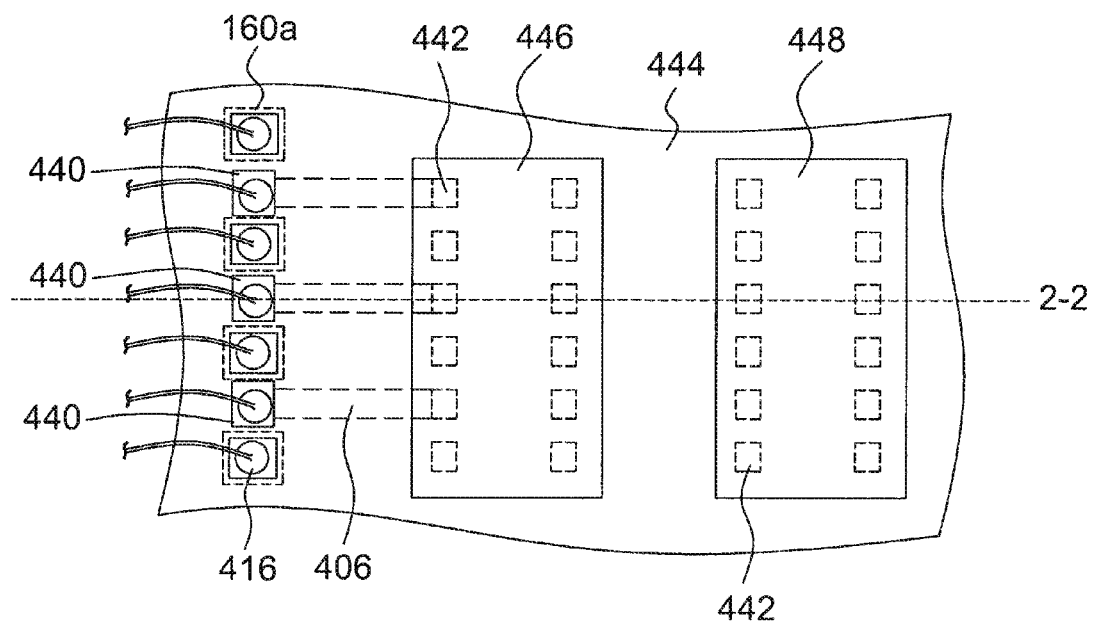

Referring to FIGS. 21I-21J, dicing procedures can be used to cut substrate 100, passivation layer 160, and polymer layer 444 into multiple semiconductor chips 600. The multiple wire-bonding pads 440 on semiconductor chips 600 can be connected to external circuits or power sources through a wire 416 formed by a wire-bonding process. The wire 416 can be formed of copper or gold. For example, a copper or gold wire can be connected to wire-bonding pad 440 through wire-bonding techniques, where the wire-bonding pad 440 is a copper pad, aluminum pad, aluminum cap or nickel cap. Contact pad 440 can then be connected to a capacitor device 446 with a solder layer 420, through surface mount technique (SMT), wherein the capacitor device 446 is connected to inductor device 448 through metal layers 140 in integrated circuit 20. FIG. 21J depicts a cross section view of FIG. 21K along the cutting plane indicated by line 2-2. Of course the dicing procedures may be performed after capacitor mounting.

Figure 22:
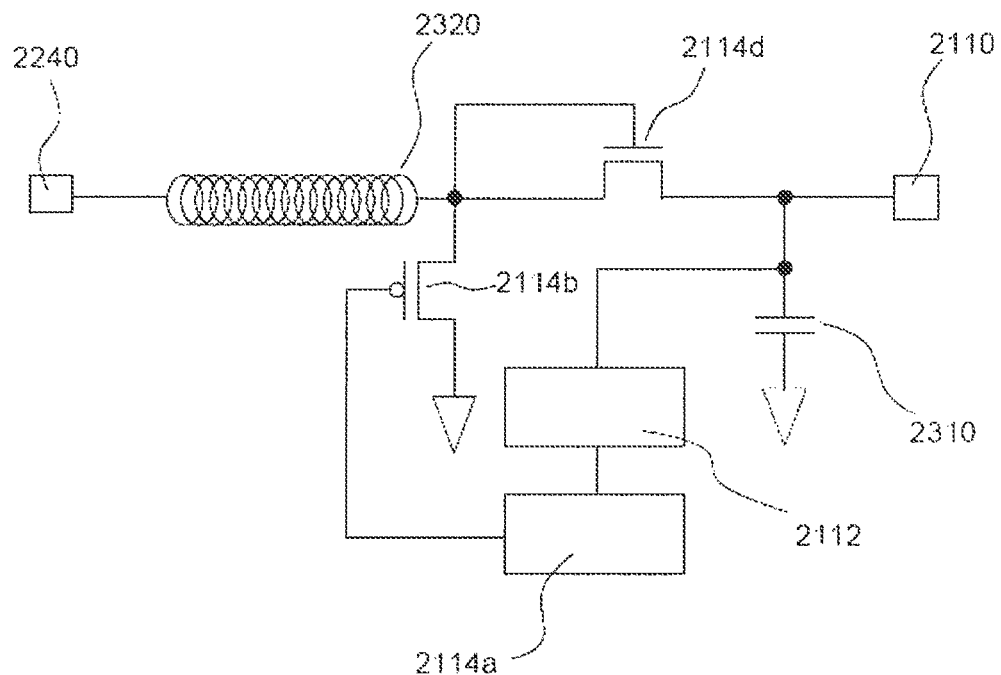
FIGS. 22-23 depict circuit diagrams of a voltage amplifying device, in accordance with an exemplary embodiment of the present disclosure.
Figure 23:
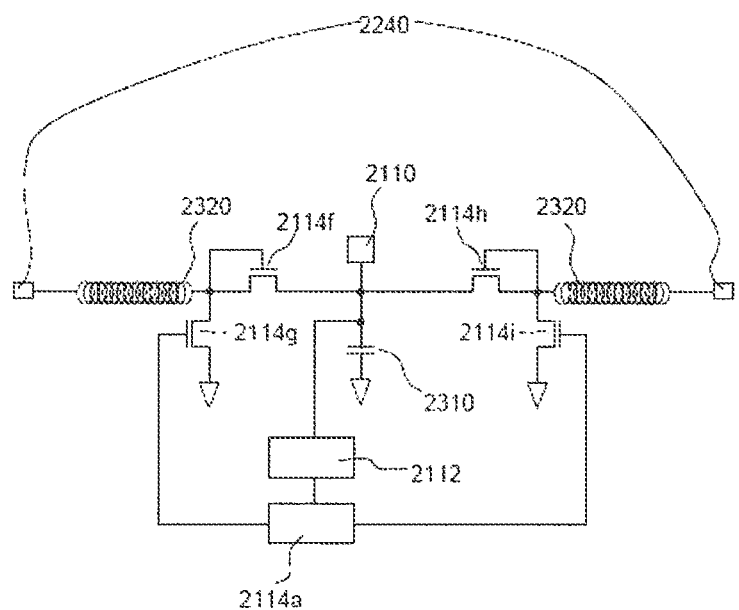

Devices and structures according to Embodiment 10 and Embodiment 11 can be used in devices that step-up voltage as shown in circuit diagrams of FIG. 22 and FIG. 23. In FIG. 22, power source input 2240 is connected to inductor 2320, inductor 2320 is connected to capacitor 2310 through transistor 2114d, voltage feedback device 2112 is connected to power output 2110, and switch controller 2114a is connected to voltage feedback device 2112 and a switch transistor 2114b. In operation, when power enters through power input 2240, switch controller 2114a receives the voltage signal of voltage feedback device 2112 and controls the on and off timing of switch transistor 2114b, pumping up the voltage level of power source output 2110. Inductor 2320 together with capacitor 2310, voltage feedback device 2112, switch transistor 2114b and transistor 2114d form an on-chip voltage regulator or converter with the previous described manufacture processes. MOS device 2114b can be replaced by DMOS, LDMOS or Bipolar transistor. MOS device 2114d can be replaced by DMOS, LDMOS or Bipolar transistor also. The voltage feedback device 2112 can provide a dynamic voltage scaling function.

The difference between FIG. 23 and FIG. 22 is that the circuit diagram of FIG. 23 is made of multiple inductors 2320, capacitor 2310, switch transistor 2114g, switch transistor 2114i, transistor 2114h and transistor 2114f. Switch controller 2114a is used to receive the voltage signal of voltage feedback device 2112 and control the duty cycle and phase of switch transistor 2114g, and switch transistor 2114i and therefore pumping up the voltage level of power output 2110. In comparison to the circuit diagram of FIG. 22, the circuit diagram of FIG. 23 can more accurately and efficiently to regulate the output voltage. Transistor 2114g can be replaced by DMOS, LDMOS or Bipolar transistor. Transistor 2114i can be replaced by DMOS, LDMOS or Bipolar transistor. Transistor 2114f can be replaced by DMOS, LDMOS or Bipolar transistor. Transistor 2114h can be replaced by DMOS, LDMOS or Bipolar transistor.

Figure 24:
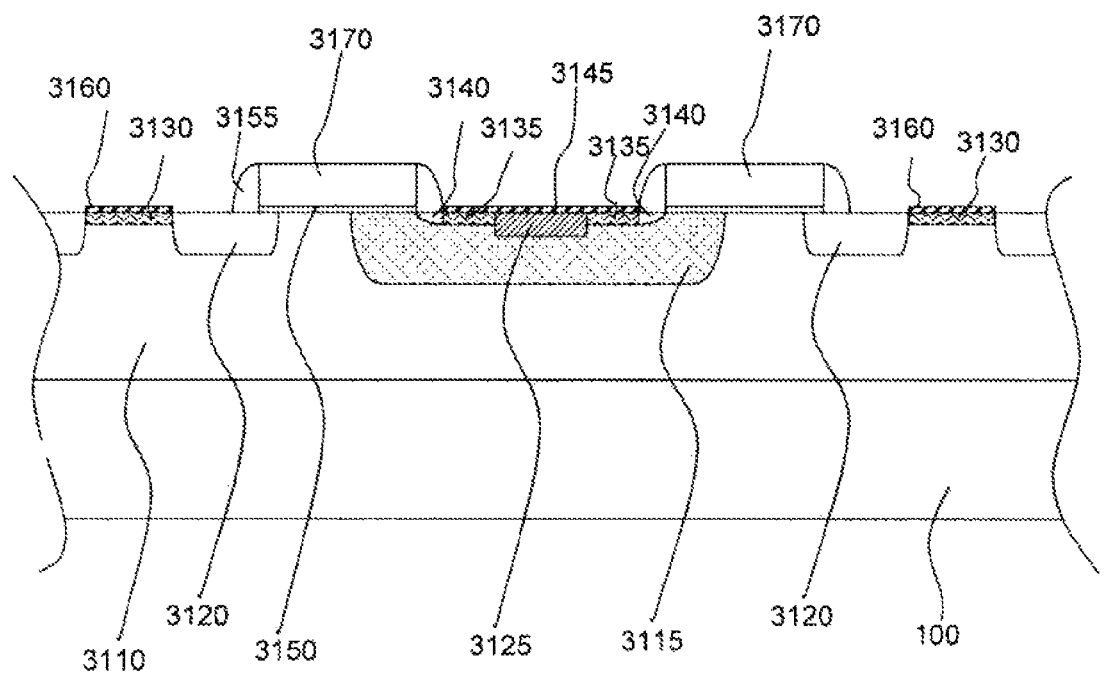
FIG. 24 depicts a cross section view of an N-type double-diffused MOS (DMOS) device, in accordance with an exemplary embodiment of the present disclosure.
Figure 25:
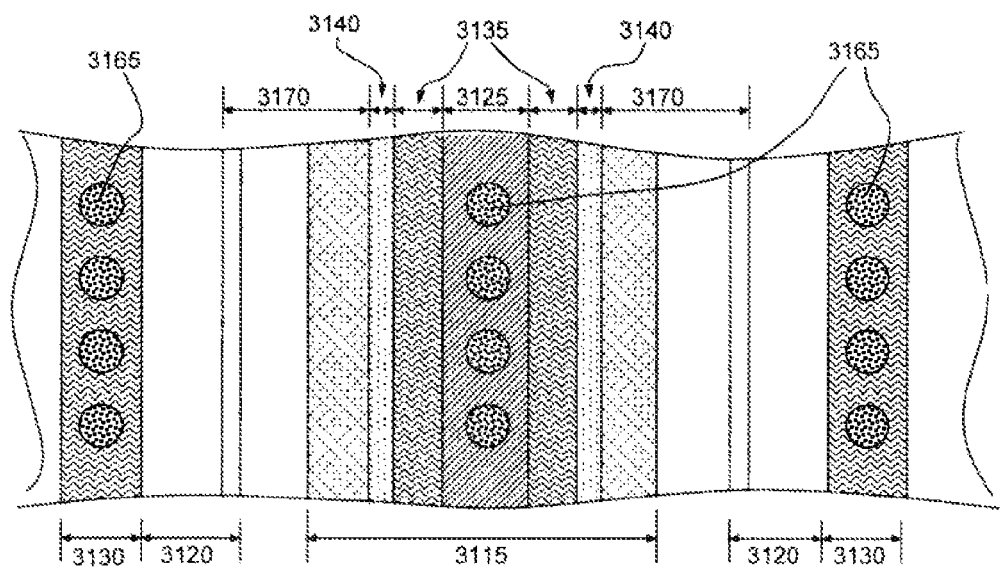
FIG. 25 shows a top view of an N-type DMOS device, in accordance with an exemplary embodiment of the present disclosure.

Referring now to FIGS. 24-25, a N-type DMOS device according to an embodiment of the present disclosure is shown. FIG. 24 shows a cross section view of an N-type DMOS device and FIG. 25 shows a top view of an N-type DMOS device.

The elements shown in FIGS. 24-25 are described as follows:

3110: N-well or lightly doped N-type semiconductor region;

3115: lightly doped P-type semiconductor region;

3120: field isolation region, shallow trench isolation filled with oxide or LOCOS isolation;

3125: source of DMOS, heavily doped P-type semiconductor region;

3130: drain of DMOS, heavily doped N-type semiconductor region;

3135: source of DMOS, heavily doped N-type semiconductor region;

3140: source of DMOS, lightly doped N-type semiconductor region;

3145: metal silicide on source of DMOS, comprise Ni-silicide, Co-silicide or Ti-silicide;

3150: gate oxide of DMOS, comprise;

3155: gate spacer, comprise silicon oxide, nitrogen doped silicon oxide or silicon nitride;

3160: metal silicide on drain of DMOS, comprise Ni-silicide, Co-silicide or Ti-silicide;

3165: metal contact points of DMOS; and

3170: gate of DMOS, comprise silicon, Ni-silicide, Co-silicide, Ti-silicide, W-silicide, Mo-silicide, TiN, Ta, TaN, Al, AN, W, WN or Ti.

Figure 26A:
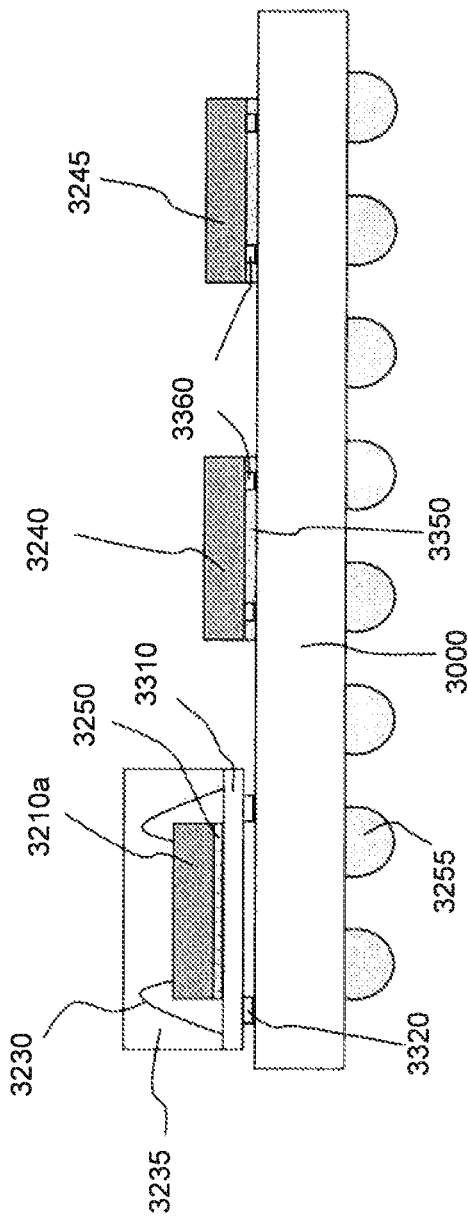
FIGS. 26A-26B depict side views of system-in packages or modules including a power management IC chip with on-chip passive device, in accordance with an exemplary embodiment of the present disclosure.
Figure 26B:
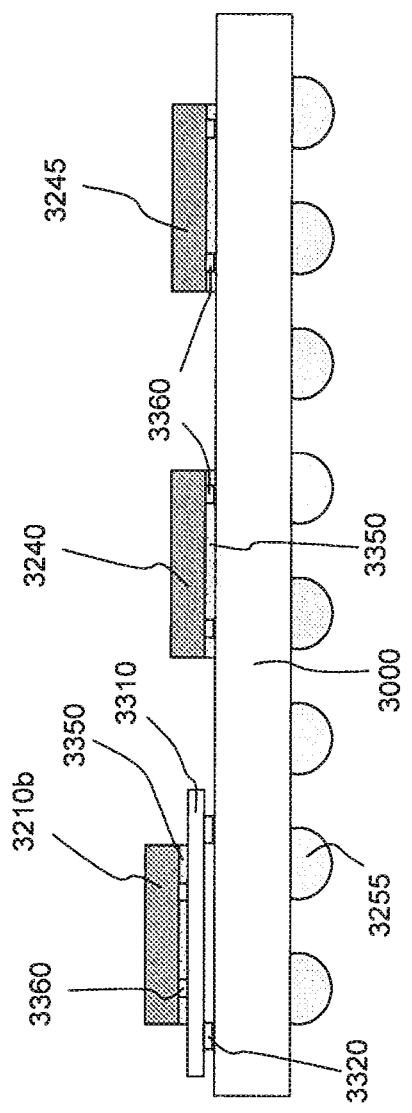

FIGS. 26A-26B depict side views of system-in packages or modules including a power management IC chip 3210a or 3210b with on-chip passive device, in accordance with an exemplary embodiment of the present disclosure.

FIGS. 27A-27B depict system-in packages or modules including a power management IC chip 3210a or 3210b with on-chip passive device, in accordance with an exemplary embodiment of the present disclosure.

FIGS. 28A-28B depict system-in packages or modules including a power management IC chip 3210a or 3210b with on-chip passive device, in accordance with an exemplary embodiment of the present disclosure.

FIGS. 29A-29B depict system-in packages or modules including a power management IC chip 3210a or 3210b with on-chip passive device, in accordance with an exemplary embodiment of the present disclosure.

Figure 30A:
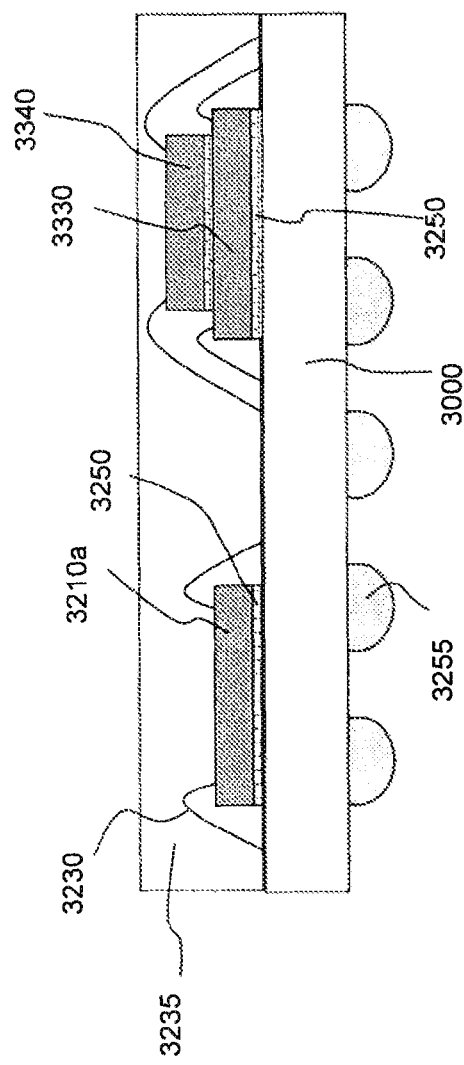
FIGS. 30A-30B depict system-in packages or modules including a power management IC chip with on-chip passive devices, in accordance with an exemplary embodiment of the present disclosure.
Figure 30B:
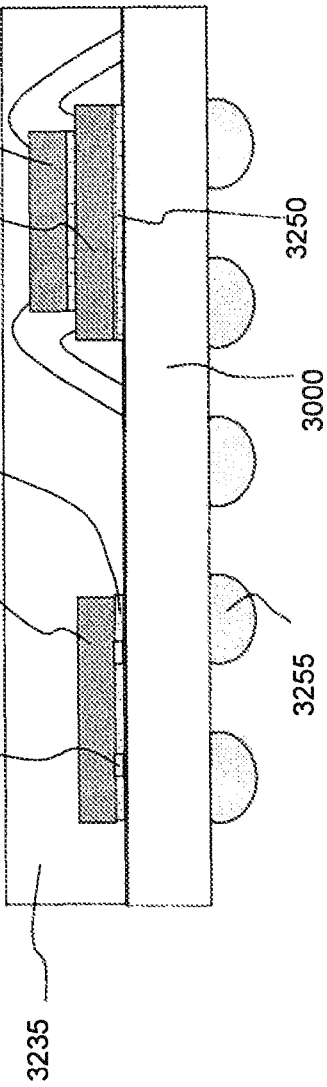

FIGS. 30A-30B depict system-in packages or modules including a power management IC chip 3210a or 3210b with on-chip passive device, in accordance with an exemplary embodiment of the present disclosure.

FIGS. 31A-31B depict system-in packages or modules including a power management IC chip 3210a or 3210b with on-chip passive device, in accordance with an exemplary embodiment of the present disclosure.

FIGS. 32A-32B depict system-in packages or modules including a power management IC chip 3210a or 3210b with on-chip passive device, in accordance with an exemplary embodiment of the present disclosure.

FIGS. 33A-33B depict system-in packages or modules including a power management IC chip 3210a or 3210b with on-chip passive device, in accordance with an exemplary embodiment of the present disclosure. The elements shown in FIGS. 26A to 33B include:

3000: substrate of package or module, can be made of a suitable material such as BT, FR4, glass, silicon, ceramic, Cu wiring, Ni/Au pad or polyimide;

3210a: power management chip combines with on-chip passive device, comprise functions of voltage regulation, voltage convert, dynamic voltage scaling, battery management or charging. The on-chip passive device comprises inductor, capacitor or resistor. The chip 3210*a* can be used for a wire-bonding process;

3210*b*: power management chip combines with on chip passive device, comprise functions of voltage regulation, voltage convert, dynamic voltage scaling, battery management or charging. The on chip passive device comprises inductor, capacitor or resistor. The chip 3210*b* can be used for a flip-chip process;

3230: bonding wire formed by a wire-bonding process, wherein the wire may be Au wire, Cu wire, or Al wire;

3235: encapsulation material, such as molding compound, epoxy or polyimide;

3240: IC chip, such as logic chip, DRAM chip, SRAM chip, FLASH chip, or analog chip;

3245: IC chip, such as logic chip, DRAM chip, SRAM chip, FLASH chip, or analog chip;

3250: adhesive material, such as silver epoxy or polyimide;

3255: BGA solder ball, such as tin-lead alloy, tin-silver alloy, tin-silver-copper alloy, tin-bismuth alloy, or tin-indium alloy;

3310: substrate of power management chip package, comprising a lead frame, BT, FR4, glass, silicon, ceramic, Cu wiring, a Ni/Au pad or polyimide;

3320: metal connect comprising a Cu layer, Ni layer, Au layer or solder layer, such as tin-lead alloy, tin-silver alloy, tin-silver-copper alloy, tin-bismuth alloy, or tin-indium alloy;

3330: IC chip, such as logic chip, DRAM chip, SRAM chip, FLASH chip, or analog chip;

3335: encapsulation material, such as molding compound, epoxy or polyimide;

3340: IC chip, such as logic chip, DRAM chip, SRAM chip, FLASH chip, or analog chip;

3350: under-fill material comprising epoxy or polyimide; and

3360: metal bump comprising an electroplated copper layer with a thickness between 10 and 100 micrometers, a gold layer having an electroplated gold layer with a thickness between 5 and 30 micrometers, or a solder layer, such as tin-lead alloy, tin-silver alloy, tin-silver-copper alloy, tin-bismuth alloy, or tin-indium alloy, having a thickness between 10 and 350 micrometers. The metal bump may comprise an adhesion layer, such as titanium, titanium nitride or a titanium-tungsten alloy, on an overlying chip, a copper seed layer on the adhesion layer, an electroplated copper layer with a thickness between 10 and 100 micrometers on the copper seed layer, an electroplated or electroless plated nickel layer on the electroplated copper layer and a solder layer, such as tin-lead alloy, tin-silver alloy, tin-silver-copper alloy, tin-bismuth alloy, or tin-indium alloy, having a thickness between 10 and 100 micrometers on the electroplated or electroless plated nickel layer, wherein the solder layer is bonded to an underlying substrate.

Figure 34:
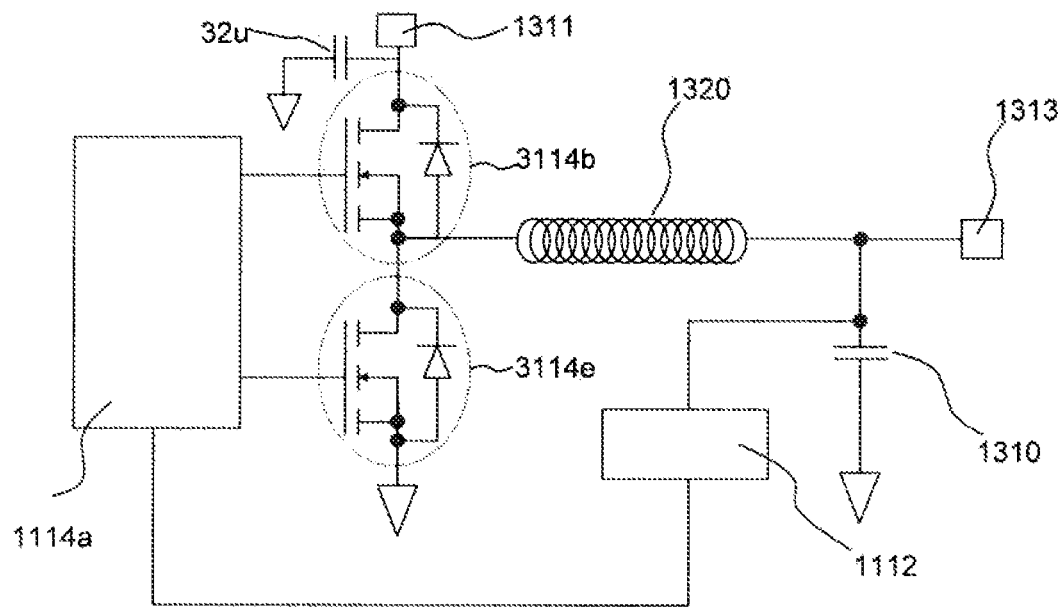
FIG. 34 depicts a step-down DC to DC switching voltage regulator or convertor including on-chip passive devices for input power, and a switch controller with two N-type switching DMOS devices, in accordance with an exemplary embodiment of the present disclosure.

FIG. 34 depicts a step-down DC to DC switching voltage regulator or convertor including on-chip capacitor 1310, on-chip inductor 1320, on-chip input capacitor 32*u* for input power, switch controller or circuit 1114*a* with two N-type switching DMOS devices 3114*b* and 3114*e*, in accordance with an exemplary embodiment of the present disclosure.

As mentioned, FIG. 34 shows a step-down DC to DC switching voltage regulator or convertor including on-chip capacitor 1310, on-chip inductor 1320, on-chip input capacitor 32*u* for input power, switch controller or circuit 1114*a* with two N-type switching DMOS devices 3114*b* and 3114*e*. The elements shown in FIG. 34 having a same reference number as that shown in FIG. 14 can be referred to in the discussion above regarding FIG. 14. The arrangement of the on-chip capacitor 1310 and the on-chip inductor 1320 formed over a passivation layer 160 can be referred to in the discussion above as described in all embodiments, such as the arrangement of surface mounted capacitor 310 and inductor 320 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B, the arrangement of the built-in inductor 418 or 430 and surface-mounted capacitor 418 shown in FIGS. 17F-17L, 18M, 18Q, 19A, 20A, and the arrangement of the surface mounted capacitor 446 and inductor 448 shown in FIG. 21J. The output pad 1313, corresponding to the pad 440 in FIG. 21H, can be connected to the inductor 1320, corresponding to the inductor 448 in FIG. 21J, and capacitor 1310, corresponding to the inductor 446 in FIG. 21J, through a metal trace (provided by the left segment of metal layers 401, 402 and 406 shown in FIGS. 21H and 21J) over a passivation layer 160. Also, the output pad 1313 can be connected to the inductor 1320 and capacitor 1310 through a metal trace made of electroplated copper or sputtered aluminum under a passivation layer 160. The arrangement of on-chip input capacitor 32*u* for input power can be referred to as the arrangement of the on-chip capacitor 1310, such as the arrangement of surface mounted capacitor 310 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B integrating the inductor 1320 and the capacitors 1310 and 32*u*, the arrangement of the surface-mounted capacitor 418 shown in FIGS. 17F-17L, 18M, 18Q, 19A, 20A, and the arrangement of the surface mounted capacitor 446 shown in FIG. 21J.

Figure 35:
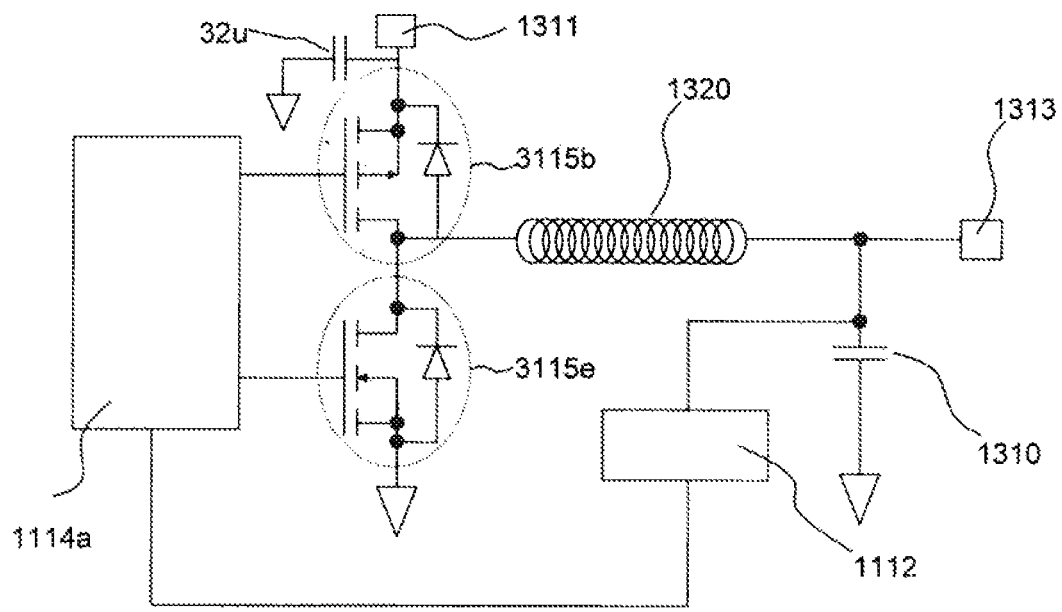
FIG. 35 depicts a step-down DC to DC switching voltage regulator or convertor including on-chip passive devices for input power, and a switch controller with a P-type switching DMOS device and a N-type switching DMOS device, in accordance with an exemplary embodiment of the present disclosure.

FIG. 35 depicts a step-down DC to DC switching voltage regulator or convertor including on-chip capacitor 1310, on-chip inductor 1320, on-chip input capacitor 32*u* for input power, switch controller or circuit 1114*a* with a P-type switching DMOS device 3115*b* and a N-type switching DMOS device 3115*e*, in accordance with an exemplary embodiment of the present disclosure.

As mentioned, the step-down DC to DC switching voltage regulator or convertor in FIG. 35 can include on-chip capacitor 1310, on-chip inductor 1320, on-chip input capacitor 32*u* for input power, switch controller or circuit 1114*a* with a P-type switching DMOS device 3115*b* and a N-type switching DMOS device 3115*e*. The elements shown in FIG. 35 having the same reference characters as shown in FIG. 14 can be referred to in the discussion above regarding FIG. 14. The arrangement of the on-chip capacitor 1310 and the on-chip inductor 1320 formed over a passivation layer 160 can be referred to as described above described for various embodiments, such as the arrangement of surface mounted capacitor 310 and inductor 320 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B, the arrangement of the built-in inductor 418 or 430 and surface-mounted capacitor 418 shown in FIGS. 17F-17L, 18M, 18Q, 19A, 20A, and the arrangement of the surface mounted capacitor 446 and inductor 448 shown in FIG. 21J. The output pad 1313 shown can correspond to pad 440 in FIG. 21H, and can be connected to the inductor 1320, corresponding to inductor 448 in FIG. 21J, and capacitor 1310, corresponding to the inductor 446 in FIG. 21J, through a metal trace (provided by the left segment of metal layers 401, 402 and 406 shown in FIGS. 21H and 21J) over a passivation layer 160. Also the output pad 1313 can be connected to the capacitor 1310 and the inductor 1320 through a metal trace made of electroplated copper or sputtered aluminum under a passivation layer 160. The arrangement of on-chip input capacitor 32*u* for input power is similar to (and can be referenced as) the arrangement of the on-chip capacitor 1310, such as the arrangement of surface mounted capacitor 310 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B, integrating the inductor 1320 and the capacitors 1310 and 32*u*, the arrangement of the surface-mounted capacitor 418 shown in FIGS. 17F-17L, 18M, 18Q, 19A, 20A, and the arrangement of the surface mounted capacitor 446 shown in FIG. 21J.

Figure 36:
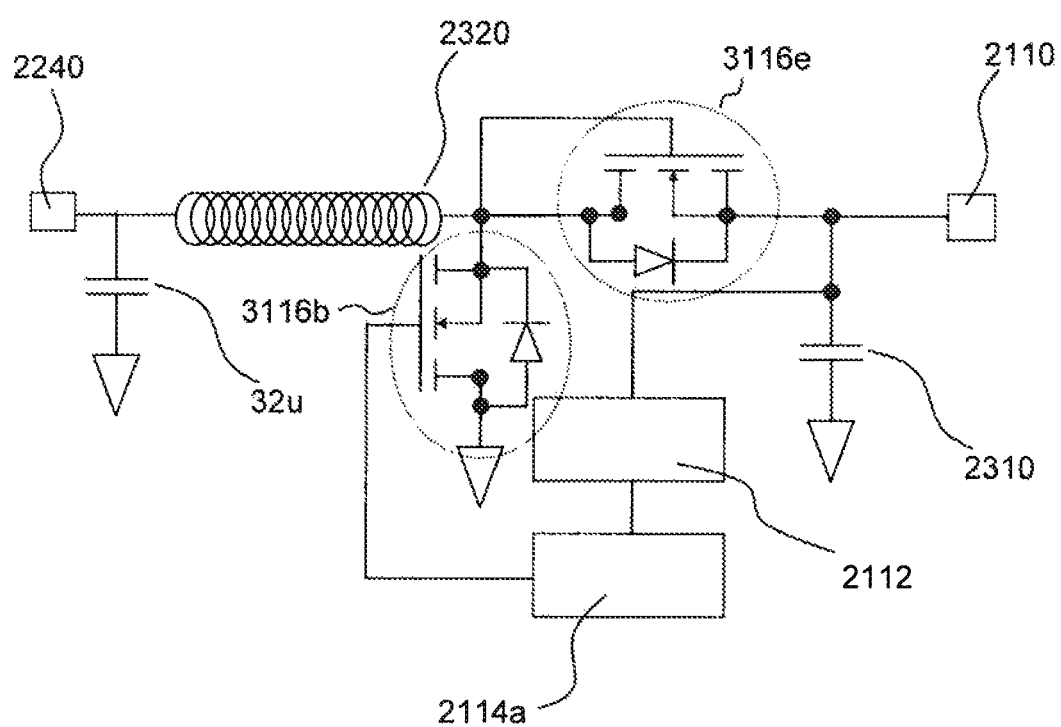
FIG. 36 depicts a step-up DC to DC switching voltage regulator or convertor including on-chip passive devices for input power, and a switch controller with two N-type switching DMOS devices, in accordance with an exemplary embodiment of the present disclosure.

FIG. 36 depicts a step-up DC to DC switching voltage regulator or convertor including on-chip capacitor 2310, on-chip inductor 2320, on-chip input capacitor 32*u* for input power, switch controller or circuit 2114*a* with two N-type switching DMOS devices 3116*b* and 3116*e*, in accordance with an exemplary embodiment of the present disclosure.

As mentioned, the step-up DC to DC switching voltage regulator or convertor shown in FIG. 36 includes on-chip capacitor 2310, on-chip inductor 2320, on-chip input capacitor 32*u* for input power, switch controller or circuit 2114*a* with two N-type switching DMOS devices 3116*b* and 3116*e*. The elements shown in FIG. 36 are similar to and are shown having the same reference characters as those shown in FIG. 22. The arrangement of the on-chip capacitor 2310 and the on-chip inductor 2320 formed over a passivation layer 160 can be referred to as above described for other embodiments, such as the arrangement of surface mounted capacitor 310 and inductor 320 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B, the arrangement of the built-in inductor 418 or 430 and surface-mounted capacitor 418 shown in FIGS. 17F-17L, 18M, 18Q, 19A, 20A, and the arrangement of the surface mounted capacitor 446 and inductor 448 shown in FIG. 21J. The output pad 2110, corresponding to the pad 440 in FIG. 21H, can be connected to the capacitor 2310, corresponding to the inductor 446 in FIG. 21J, through a metal trace (provided by the left segment of metal layers 401, 402 and 406 shown in FIGS. 21H and 21J) over a passivation layer 160. Also the output pad 2110 can be connected to the capacitor 2310 through a metal trace made of electroplated copper or sputtered aluminum under a passivation layer 160. The arrangement of on-chip input capacitor 32*u* for input power can be referred to as the arrangement of the on-chip capacitor 1310, such as the arrangement of surface mounted capacitor 310 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B, integrating the inductor 2320 and the capacitors 2310 and 32*u*, the arrangement of the surface-mounted capacitor 418 shown in FIGS. 17F-17L, 18M, 18Q, 19A, 20A, and the arrangement of the surface mounted capacitor 446 shown in FIG. 21J. The N-type DMOS devices 3114*b*, 3114*e*, 3115*e*, 3116*b* and 3116*e* shown in FIGS. 34-36 are similar to the DMOS device of FIGS. 24-25.

Figure 37:
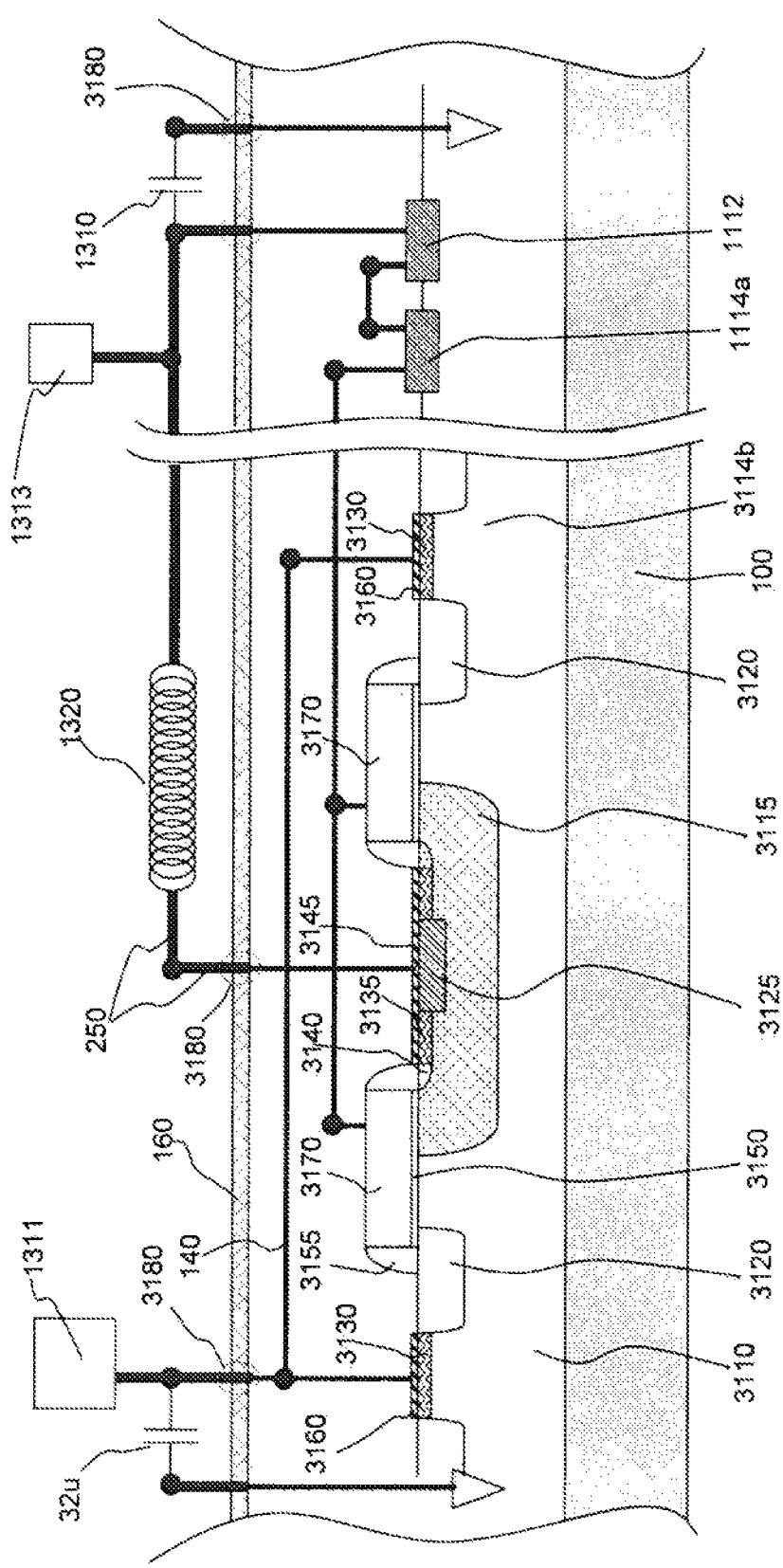
FIG. 37 depicts a cross-sectional view of a portion of the step-down switching voltage regulator or converter of FIG. 34.
Figure 38:
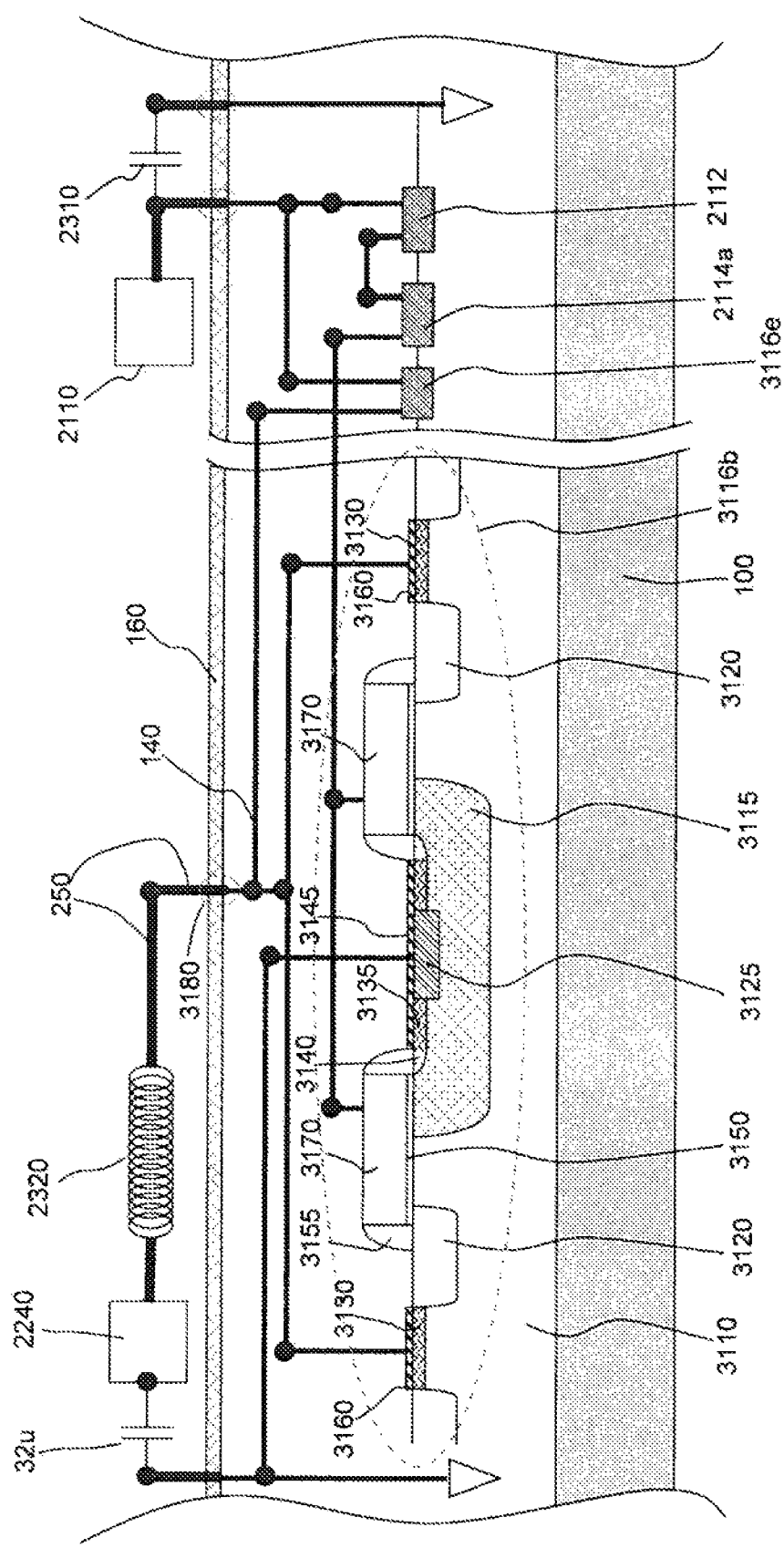
FIG. 38 depicts a cross-sectional view of a portion of the step-up switching voltage regulator or converter of FIG. 36.

FIG. 37 shows a cross-sectional view of a part of a step-down switching voltage regulator or converter shown in FIG. 34. FIG. 38 shows a cross-sectional view of a part of a step-up switching voltage regulator or converter shown in FIG. 36. The elements shown in FIGS. 37 and 38 are shown having the same reference numbers as those shown in FIGS. 24, 25, 34 and 36. Additional elements shown in FIGS. 37 and 38 are described as follows: 3180: opening in passivation layer, wherein the opening may have a width between 0.1 and 20 micrometers, between 0.5 and 30 micrometers or between 0.1 and 200 micrometers.

An operational amplifier 32*g*, 32*j*, 32*k* and 32*o* can be implemented or realized by the circuit of operational amplifier shown in FIG. 40, as discussed below with respect to FIG. 40.

Figure 39:
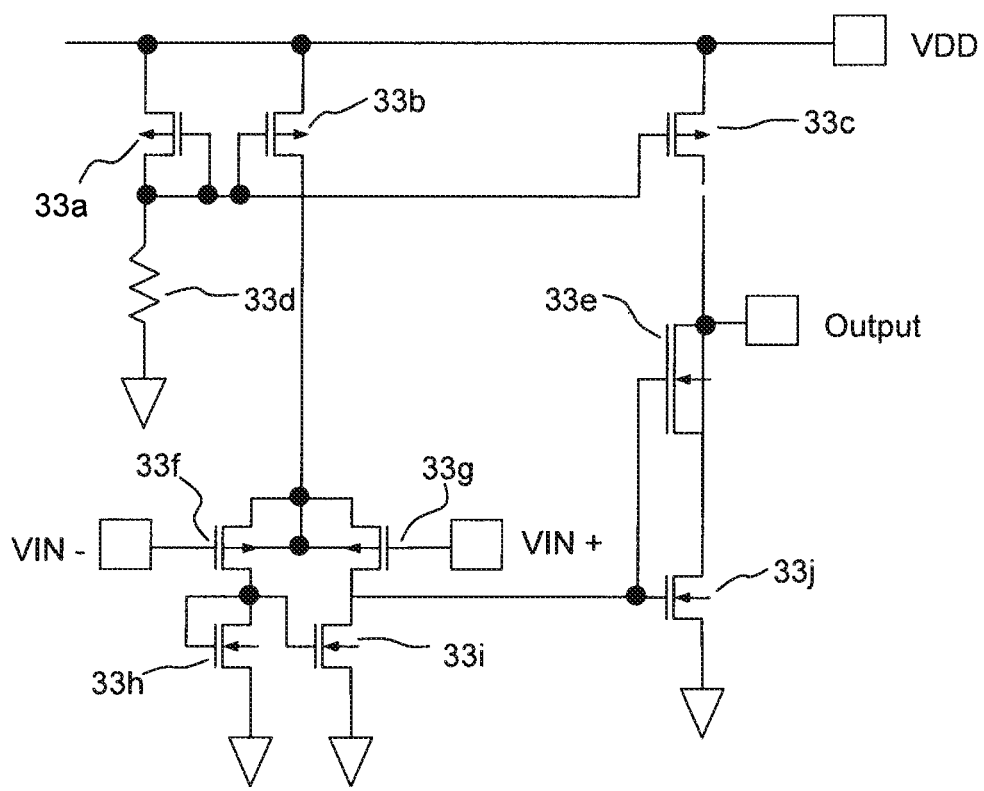
FIG. 39 shows a circuit diagram of an operational amplifier, in accordance with an exemplary embodiment of the present disclosure.

The elements shown in FIG. 39 are described as follows:
33*a*, 33*b*, 33*c*, 33*f* and 33*g*: PMOS devices;
33*h*, 33*i* and 33*j*: NMOS devices;
33*d*: register; and
33*e*: gate to silicon capacitor.

Figure 40:
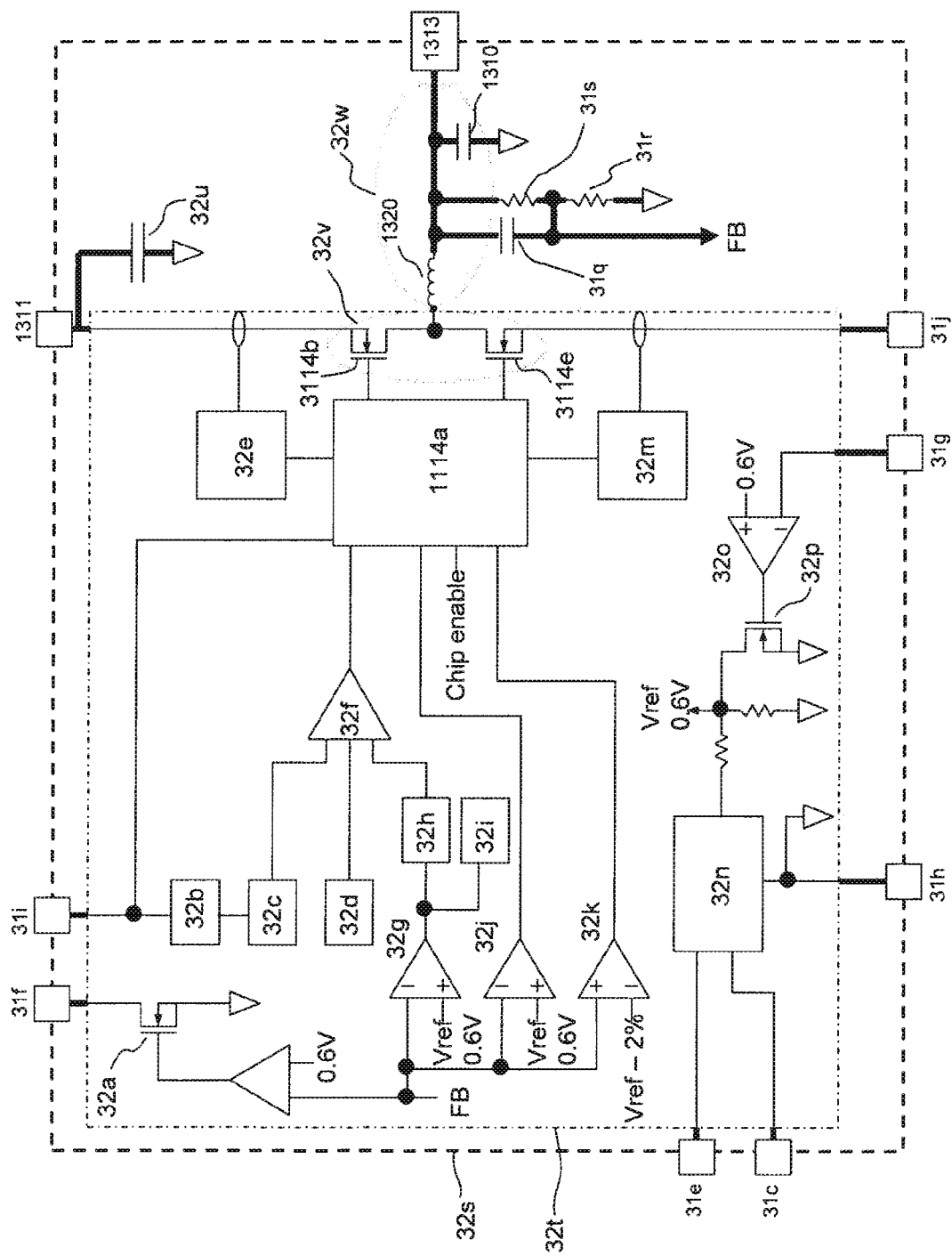
FIG. 40 depicts a circuit layout with functional blocks of a converter implementing the circuit diagram of FIG. 34.
Figure 41:
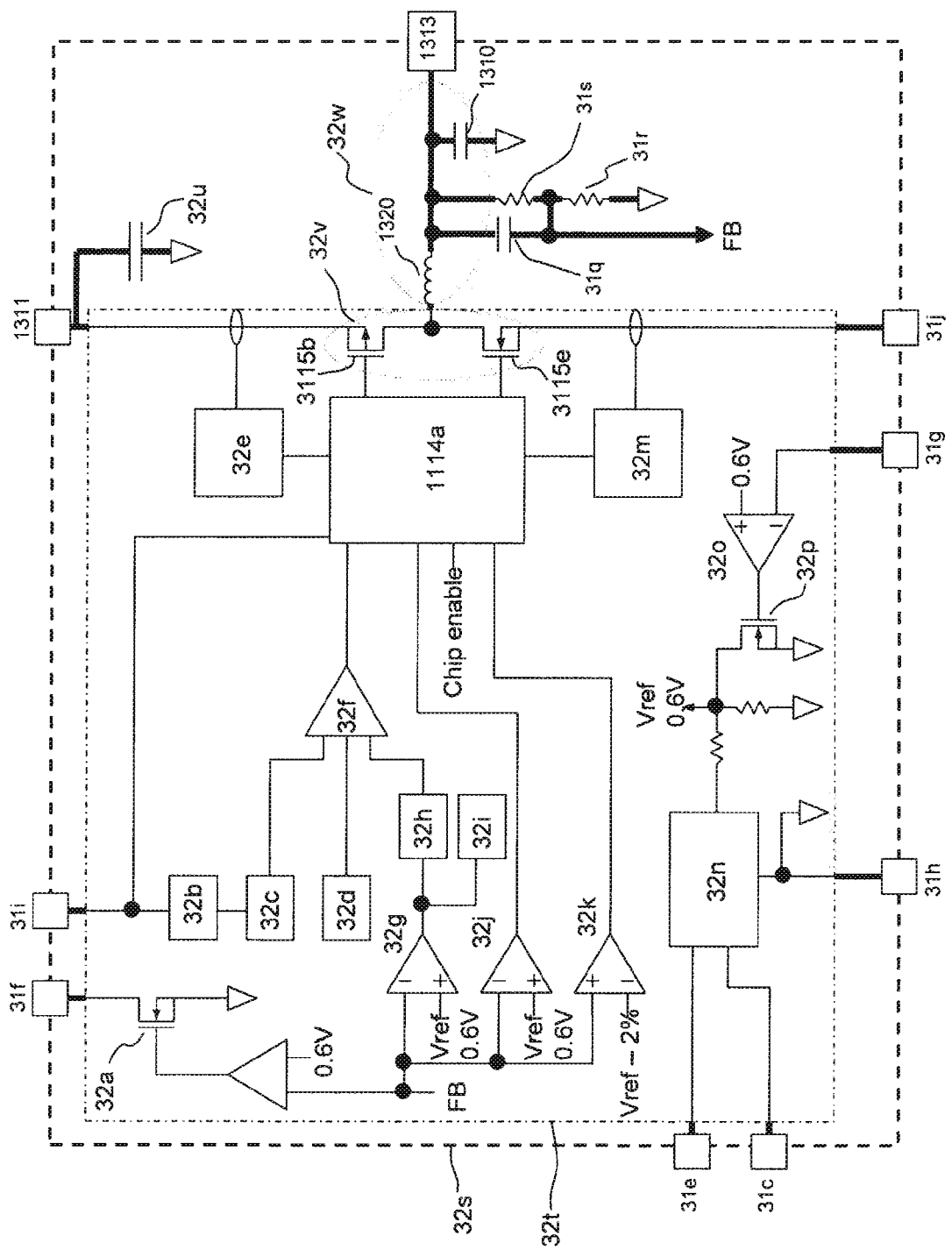
FIG. 41 depicts a circuit layout with functional blocks of a converter implementing the circuit diagram of FIG. 35.

FIG. 40 shows the function blocks of converter realizing the circuit diagram of FIG. 34. FIG. 41 shows the function blocks of converter realizing the circuit diagram of FIG. 35. The element shown in FIGS. 40 and 41 are shown having the same reference numbers as those shown in FIGS. 24, 25, 34, 35, and 37.

The elements shown in FIGS. 40 and 41 are described as follows:

1114*a*: MOSFET driver, Anti shoot through converter control Logic;

1310: Decoupling capacitor for output power. The capacitance of the capacitor may be between 1 μF and 100 μF, between 0.1 pF and 50 mH or between 1 pF and 1mF;

1311: Pad for input voltage for the power stage; 1313: Pad for output voltage node;

1320: Switch inductor. The inductance of the inductor can be between 0.1 nH and 10 mH, between 100 nH and 10 mH or between 1 nH and 100 nH;

3114*b*: N-type DMOS device;
3114*e*: N-type DMOS device;
3115*b*: P-type DMOS device;
3115*e*: N-type DMOS device;
31*c*: Pad for power supply for control circuitry;
FB: Feedback voltage from output;
31*e*: Pad for chip enable;
31*f*: Pad for power good indication;

31*g*: Pad for output voltage tracking input. This signal applied to this pin is used as reference voltage overriding the internal reference voltage when it is below the internal 0.6V reference;

31*h*: Pad for ground for circuits;

31*i*: Pad for fixing frequency pulse-width-modulation (PWM) operation or to synchronize the device to external clock signal. With this pin=high, the device forced into 1.5 MHz fixed frequency PWM operation. With this pin=low, the device;

31*j*: Pad for ground for converter;

31*q*: on-chip capacitor, wherein the arrangement of on-chip input capacitor 31*q* can be referred to as the arrangement of the on-chip capacitor 1310, such as the arrangement of surface mounted capacitor 310 shown in FIGS. 3, 4, 4N, 4U, 4AJ, 4AK, 4AL, 4AM, 5, 5D, 6, 6I, and 7A, the arrangement of surface-mounted integrated passive device 330 shown in FIG. 7B integrating the inductor 1320 and the capacitors 1310, 32*u* and 31*q*, the arrangement of the surface-mounted capacitor 418 shown in FIGS. 17F-17L, 18M, 18Q, 19A, 20A, and the arrangement of the surface mounted capacitor 446 shown in FIG. 21J;

31*r*: resister for feedback voltage;
31*s*: resistor for feedback voltage;
32*a*: NMOS;
32*b*: phase-locked loop circuit;
32*c*: sawtooth wave circuit;
32*d*: Vout generator;
32*e*: High side current sense;
32*f*: Summing comparator;
32*g*: Error amplifier;
32*h*: Loop compensation;

32*i*: Analog softstart;

32*j*: Pulse modulator comprises Pulse-width modulation comparator, Pulse frequency modulation circuits;

32*k*: Pulse-frequency/Pulse-width modulation transition circuit;

32*m*: Low side current sense;

32*n*: Bandgap undervoltage lockout and thermal shutdown;

32*o*: Output voltage tracking;

32*p*: NMOS device;

32*s*: These elements enclosed by the dot lines 32*s* are formed in a chip;

32*t*: These elements enclosed by the dot lines 32*t* are formed under a passivation layer 160 (previously shown) of the chip. These elements outside the dot lines 32*t* are formed over the passivation layer 160 (previously shown) of the chip and includes a part of on-chip switching regulator or converter with on-chip output filter comprising on-chip inductor 1320 and on-chip capacitor 1310;

32*u*: On-chip input capacitor for input power. The capacitance may be between 1 nF and 10011 F;

32*v*: switching circuit; and

32*w*: Output filter.

The inductor 1320 can be connected to the capacitors 1310 and 31*q* and to the resistor 31*s* through a Cu wiring layer formed on or over a passivation layer 160, wherein the Cu wiring layer may contain electroplated copper having a thickness between 3 and 30 micrometers or between 2 and 50 micrometers.

Exemplary Embodiments

Application Circuits and Chips

The above-described circuits, e.g., those shown and described for FIGS. 14, 15, 22, 23, 34-36 and 39-41 and the above-mentioned structures shown in FIGS. 3, 4, 4N, 4U, 4AK, 4AL, 4AM, 5, 6, 6I, 7A, 7B, 17L, 18M, 18Q, 19A, 19B, 20A, 20B, 21J, and 21K can be implemented in or realized by a power management IC chip 3210*a* for a wire-bonding process or by a power management IC chip 3210*b* for a flip-chip bonding process, as shown in FIGS. 26A, 26B, 27A, 27B, 28A, 28B, 29A, 29B, 30A, 30B, 31A, 31B, 32A, 32B, 33A and 33B (which show system-in packages or modules including a power management IC chip 3210*a* or 3210*b* with on-chip passive device).

For example, the whole structure shown in FIG. 3 comprising an on-chip capacitor 310 and an on-chip inductor 320 over a passivation layer 160 can be used for the chip 3210*a* shown in FIGS. 26A, 27A, 28A, 29A, 30A, 31A, 32A and/or 32A, and the wirebonded wire 3230 shown in FIGS. 26A, 27A, 28A, 29A, 30A, 31A, 32A and/or 33A can be bonded to a metal pad exposed by an opening 165 in the passivation layer 160 shown in FIG. 3.

For another example, the whole structure shown in FIG. 4 or 4N comprising an on-chip capacitor 310 and an on-chip inductor 320 over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a bonding metal layer 400*c* over a pad 166*b* exposed by an opening in the passivation layer 160 shown in FIG. 4 or 4N, where the wirebonded wire 3230 can be referred to as the wirebonded wire 37 shown in FIG. 4N.

Another example is that the whole structure shown in FIG. 4U or 4AM comprising an on-chip capacitor 310 and an on-chip inductor 320 over a passivation layer 160 can be used for the chip 3210*a* shown FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a metal layer 46 over a pad 166*b* exposed by an opening in the passivation layer 160 shown in FIG. 4U or 4AM, where the wirebonded wire 3230 can be referred to as the wirebonded wire 47 shown in FIG. 4U or 4AM.

Additionally, the whole structure shown in FIG. 6, 6I, or 7A comprising an on-chip capacitor 310 and an on-chip inductor 320 over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a metal layer 220 exposed by an opening 240 in a polymer layer 230 shown in FIG. 6, 6I, or 7A, where the wirebonded wire 3230 can be referred to as the wirebonded wire 56 shown in FIG. 6I.

Moreover, the whole structure shown in FIG. 7B comprising an integrated passive device 330 of a capacitor and an inductor over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a metal layer 220 exposed by an opening in a polymer layer 230, where the wirebonded wire 3230 can be referred to as the wirebonded wire 56 shown in FIG. 7B.

In addition, the whole structure shown in FIG. 17L comprising an on-chip inductor 408 and an on-chip capacitor 418 over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a metal pad 410 exposed by an opening in a polymer layer 414 shown in FIG. 17L, in which the wirebonded wire 3230 can be referred to as the wirebonded wire 416.

As another example, the whole structure shown in FIG. 18M comprising an on-chip inductor 430 and an on-chip capacitor 418 over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a bonding metal layer 428 exposed by an opening in a polymer layer 436 shown in FIG. 18M, where the wirebonded wire 3230 can be referred to as the wirebonded wire 416 shown in FIG. 18M.

Additionally, the whole structure shown in FIG. 18Q comprising an on-chip inductor 430 and an on-chip capacitor 418 over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a bonding metal layer 428 exposed by an opening in a polymer layer 436 shown in FIG. 18Q, where the wirebonded wire 3230 can be referred to as the wirebonded wire 416 shown in FIG. 18Q.

For another example, the whole structure shown in FIG. 19A comprising an on-chip inductor 430 and an on-chip capacitor 418 over a passivation layer 160 can be used for the chip 3210*a* shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a wirebonding pad 432 exposed by an opening in a polymer layer 436 shown in FIG. 19A, where the wirebonded wire 3230 can be referred to as the wirebonded wire 416 shown in FIG. 19A.

Moreover, the whole structure shown in FIG. 20A comprising an on-chip inductor 430 and an on-chip capacitor 418 over a passivation layer 160 can be used for the chip 3210a shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a bonding metal layer 428 exposed by openings in a polymer layer 436 shown in FIG. 20A, where the wirebonded wires 3230 can be referred to as the wirebonded wires 416 shown in FIG. 20A.

Additionally, the whole structure shown in FIG. 21J comprising an on-chip inductor 448 and an on-chip capacitor 446 over a passivation layer 160 can be used for the chip 3210a shown in FIGS. 26A, 27A, 28A, 29A, 30A, 31A, 32A and/or 33A, and the wirebonded wire 3230 shown in FIGS. 26A, 27A, 28A, 29A, 30A, 31A, 32A and/or 33A can be bonded to a bonding pad 440 exposed by an opening in a polymer layer 444 shown in FIG. 21J, where the wirebonded wires 3230 can be referred to as the wirebonded wires 416 shown in FIG. 21J.

As another example, the whole structure shown in FIG. 3 comprising an on-chip capacitor 310 and an on-chip inductor 320 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a metal pad exposed by an opening 165 in the passivation layer 160 shown in FIG. 3 to bond the chip 3210b to the substrate 3310 or 3000.

Also, the whole structure shown in FIG. 4 or 4N comprising an on-chip capacitor 310 and an on-chip inductor 320 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a bonding metal layer 400c over a pad 166b exposed by an opening in the passivation layer 160 shown in FIG. 4 or 4N to bond the chip 3210b to the substrate 3310 or 3000.

For another example, the whole structure shown in FIG. 4U or 4AM comprising an on-chip capacitor 310 and an on-chip inductor 320 over a passivation layer 160 can be used for the chip 3210b shown FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a metal layer 46 over a pad 166b exposed by an opening in the passivation layer 160 shown in FIG. 4U or 4AM to bond the chip 3210b to the substrate 3310 or 3000.

In addition, the whole structure shown in FIG. 5 or 5D comprising an on-chip capacitor 310 and an on-chip inductor 320 over a passivation layer 160 can be used for the chip 3210b shown FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a metal pad 166b exposed by an opening in a passivation layer 160, where the metal bump 3360 can be referred to as the metal bump including the elements 400 and 260 shown in FIG. 5 or 5D.

For another example, the whole structure shown in FIG. 6, 6I, or 7A comprising an on-chip capacitor 310 and an on-chip inductor 320 over a passivation layer 160 can be used for the chip 3210b shown in FIGS. 26B, 27B, 28B, 29B, 30B, 31B, 32B and/or 32B, and the metal bump 3360 shown in FIGS. 26B, 27B, 28B, 29B, 30B, 31B, 32B and/or 32B can be formed on a metal layer 220 exposed by an opening 240 in a polymer layer 230 shown in FIG. 6, 6I, or 7A to bond the chip 3210b to the substrate 3310 or 3000.

Moreover, the whole structure shown in FIG. 7B comprising an integrated passive device 330 of a capacitor and an inductor over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a metal layer 220 exposed by an opening in a polymer layer 230 to bond the chip 3210b to the substrate 3310 or 3000.

Additionally, the whole structure shown in FIG. 17L comprising an on-chip inductor 408 and an on-chip capacitor 418 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a metal pad 410 exposed by an opening in a polymer layer 414 shown in FIG. 17L to bond the chip 3210b to the substrate 3310 or 3000.

In yet another example, the whole structure shown in FIG. 18M comprising an on-chip inductor 430 and an on-chip capacitor 418 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a bonding metal layer 428 exposed by an opening in a polymer layer 436 shown in FIG. 18M to bond the chip 3210b to the substrate 3310 or 3000.

Another example include that the whole structure shown in FIG. 18Q comprising an on-chip inductor 430 and an on-chip capacitor 418 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a bonding metal layer 428 exposed by an opening in a polymer layer 436 shown in FIG. 18Q to bond the chip 3210b to the substrate 3310 or 3000.

Moreover, the whole structure shown in FIG. 19A comprising an on-chip inductor 430 and an on-chip capacitor 418 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a pad 432 exposed by an opening in a polymer layer 436 shown in FIG. 19A to bond the chip 3210b to the substrate 3310 or 3000.

In yet another example, the whole structure shown in FIG. 20A comprising an on-chip inductor 430 and an on-chip capacitor 418 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a bonding metal layer 428 exposed by openings in a polymer layer 436 shown in FIG. 20A to bond the chip 3210b to the substrate 3310 or 3000.

Finally, the whole structure shown in FIG. 21J comprising an on-chip inductor 448 and an on-chip capacitor 446 over a passivation layer 160 can be used for the chip 3210b shown in FIGS. 26B, 27B, 28B, 29B, 30B, 31B, 32B and/or 33B, and the metal bump 3360 shown in FIGS. 26B, 27B, 28B, 29B, 30B, 31B, 32B and/or 33B can be formed on a bonding pad 440 exposed by an opening in a polymer layer 444 shown in FIG. 21J to bond the chip 3210b to the substrate 3310 or 3000.

Accordingly, from the description above, it can be appreciated that embodiments and aspects of the present disclosure provide for semiconductor chip and application circuits, in which passive and active devices are integrated with the semiconductor chip, so that the signal path between the two types of devices has minimal distance, therefore enabling fast and effective voltage regulation and also decreasing circuit routing area on the PCB. The reaction/response time of each device is decreased, increasing the performance of electronic device without increasing cost.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The phrase "means for" when used in a claim is intended to and should be interpreted to embrace the corresponding structures and materials that have been described and their equivalents. Similarly, the phrase "step for" when used in a claim embraces the corresponding acts that have been described and their equivalents. The absence of these phrases means that the claim is not intended to and should not be interpreted to be limited to any of the corresponding structures, materials, or acts or to their equivalents.

While this disclosure has been described in terms of the above specific embodiment(s), those skilled in the art will recognize that the disclosure can be practiced with modifications within the spirit and scope of the appended claims, i.e., that changes can be made in form and detail, without departing from the spirit and scope of the disclosure. For example, while preferred radiation sources have been described as using certain lines produced by a mercury lamp, other suitable sources for the desired wavelengths of radiation can of course be used within the scope of the present disclosure. Accordingly all such changes come within the purview of the present disclosure and the disclosure encompasses the subject matter of the claims which follow.

What is claimed is:

1. A semiconductor chip comprising:
   a semiconductor substrate;
   a first double-diffused metal oxide semiconductor (DMOS) device on the semiconductor substrate;
   a second DMOS device on the semiconductor substrate;
   a capacitor coupled to the semiconductor substrate; and
   an inductor coupled to the semiconductor substrate, the inductor including a first terminal coupled to the first and second DMOS devices, and a second terminal coupled to the capacitor.

2. The semiconductor chip of claim 1 further comprising a passivation layer coupled to the semiconductor substrate and the capacitor, the passivation layer comprising a nitride layer.

3. The semiconductor chip of claim 2, wherein the nitride layer comprises a silicon-nitride layer having a thickness greater than 0.3 micrometers.

4. The semiconductor chip of claim 1 further comprising a passivation layer coupled to the semiconductor substrate and the inductor, the passivation layer comprising a nitride layer.

5. The semiconductor chip of claim 4, wherein the nitride layer comprises a silicon-nitride layer having a thickness greater than 0.3 micrometers.

6. The semiconductor chip of claim 1 further comprising a polymer layer coupled to the inductor.

7. The semiconductor chip of claim 6 further comprising a tin-containing joint at a bottom of the capacitor.

8. The semiconductor chip of claim 1, wherein the inductor comprises a copper layer having a thickness between 1.5 and 15 micrometers.

9. A semiconductor chip comprising:
   a semiconductor substrate;
   a first double-diffused metal oxide semiconductor (DMOS) device on the semiconductor substrate;
   a second DMOS device on the semiconductor substrate;
   a first capacitor coupled to the semiconductor substrate;
   an inductor coupled to the semiconductor substrate, wherein the inductor includes a first terminal coupled to a first terminal of the first DMOS device and to a first terminal of the second DMOS device, and a second terminal of the inductor is coupled to the first capacitor;
   a switch controller coupled to a gate of the first DMOS device and to a gate of the second DMOS device; and
   a voltage feedback device having a first terminal coupled to the second terminal of the inductor and to the first capacitor and a second terminal coupled to the switch controller.

10. The semiconductor chip of claim 9 further comprising a passivation layer coupled to the semiconductor substrate and the first capacitor, the passivation layer comprising a nitride layer.

11. The semiconductor chip of claim 10, wherein the nitride layer comprises a silicon-nitride layer having a thickness greater than 0.3 micrometers.

12. The semiconductor chip of claim 9 further comprising a passivation layer coupled to the semiconductor substrate and the inductor, the passivation layer comprising a nitride layer.

13. The semiconductor chip of claim 12, wherein the nitride layer comprises a silicon-nitride layer having a thickness greater than 0.3 micrometers.

14. The semiconductor chip of claim 9 further comprising a second capacitor coupled to a second terminal of the first DMOS device.

15. The semiconductor chip of claim 14 further comprising a passivation layer coupled to the semiconductor substrate and the second capacitor, the passivation layer comprising a nitride layer.

16. The semiconductor chip of claim 15, wherein the nitride layer comprises a silicon-nitride layer having a thickness greater than 0.3 micrometers.

17. A semiconductor chip comprising:
   a semiconductor substrate;
   an inductor coupled to the semiconductor substrate;
   a first capacitor coupled to the semiconductor substrate;
   a first double-diffused metal oxide semiconductor (DMOS) device on the semiconductor substrate, the first DMOS device being coupled to a first terminal of the inductor;
   a second DMOS device on the semiconductor substrate, the second DMOS device including:
      a gate coupled to the first terminal of the inductor and to the first DMOS device,
      a first terminal coupled to the first terminal of the inductor, the first DMOS device and to the gate of the second DMOS device, and
      a second terminal coupled to the first capacitor;

a switch controller coupled to a gate of the first DMOS device; and
a voltage feedback device having:
a first terminal coupled to the second terminal of the second DMOS device and to the first capacitor, and
a second terminal coupled to the switch controller.

18. The semiconductor chip of claim 17 further comprising a passivation layer coupled to the semiconductor substrate and the first capacitor, the passivation layer comprising a nitride layer.

19. The semiconductor chip of claim 18, wherein the nitride layer comprises a silicon-nitride layer having a thickness greater than 0.3 micrometers.

20. The semiconductor chip of claim 17 further comprising a passivation layer coupled to the semiconductor substrate and the inductor, the passivation layer comprising a nitride layer.

21. The semiconductor chip of claim 20, wherein the nitride layer comprises a silicon-nitride layer having a thickness greater than 0.3 micrometers.

22. The semiconductor chip of claim 17 further comprising a second capacitor coupled to a second terminal of the inductor.

23. The semiconductor chip of claim 22 further comprising a passivation layer coupled to the semiconductor substrate and the second capacitor, the passivation layer comprising a nitride layer.

24. The semiconductor chip of claim 23, wherein the nitride layer comprises a silicon-nitride layer having a thickness greater than 0.3 micrometers.

* * * * *